(12) United States Patent
Ikeda et al.

(10) Patent No.: US 12,272,800 B2
(45) Date of Patent: Apr. 8, 2025

(54) SEMICONDUCTOR DEVICE, BATTERY PACK, AND ELECTRONIC DEVICE

(71) Applicant: Semiconductor Energy Laboratory Co., Ltd., Atsugi (JP)

(72) Inventors: Takayuki Ikeda, Atsugi (JP); Takeshi Aoki, Ebina (JP); Munehiro Kozuma, Atsugi (JP); Kei Takahashi, Isehara (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 819 days.

(21) Appl. No.: 17/439,436

(22) PCT Filed: Mar. 16, 2020

(86) PCT No.: PCT/IB2020/052356
§ 371 (c)(1),
(2) Date: Sep. 15, 2021

(87) PCT Pub. No.: WO2020/194116
PCT Pub. Date: Oct. 1, 2020

(65) Prior Publication Data
US 2022/0190398 A1    Jun. 16, 2022

(30) Foreign Application Priority Data

Mar. 26, 2019 (JP) .................................. 2019-058624
Apr. 2, 2019 (JP) .................................. 2019-070596

(51) Int. Cl.
| | | |
|---|---|---|
| H01M 10/42 | (2006.01) | |
| H02J 7/00 | (2006.01) | |
| H02J 50/12 | (2016.01) | |

(52) U.S. Cl.
CPC ... *H01M 10/4264* (2013.01); *H01M 10/4235* (2013.01); *H02J 7/0031* (2013.01);
(Continued)

(58) Field of Classification Search
CPC ......... H01M 10/4264; H01M 10/4235; H01M 2220/30; H01M 10/48; H02J 7/0031;
(Continued)

(56) References Cited

U.S. PATENT DOCUMENTS

| | | |
|---|---|---|
| 9,316,695 B2 | 4/2016 | Takahashi et al. |
| 10,228,423 B2 | 3/2019 | Yanagawa |

(Continued)

FOREIGN PATENT DOCUMENTS

| | | |
|---|---|---|
| EP | 2492700 A | 8/2012 |
| JP | 07-104015 A | 4/1995 |

(Continued)

OTHER PUBLICATIONS

International Search Report (Application No. PCT/IB2020/052356) Dated Jul. 7, 2020.

(Continued)

*Primary Examiner* — Paul Dinh
(74) *Attorney, Agent, or Firm* — Eric J. Robinson; Robinson Intellectual Property Law Office, P.C.

(57) ABSTRACT

A semiconductor device with reduced power consumption is provided. With three transistors, potentials of two nodes are switched and a voltage is detected. One of a source and a drain of a first transistor is electrically connected to a first terminal. The other of the source and the drain of the first transistor is electrically connected to a non-inverting input of a comparator through a first node. One of a source and a drain of a second transistor is electrically connected to a second terminal. The other of the source and the drain of the second transistor is electrically connected to one of a source and a drain of a third transistor through a second node. The other of the source and the drain of the third transistor is electrically connected to a third terminal. A first capacitor is provided between the first node and the second node. An (Continued)

inverting input of the comparator is electrically connected to a fourth terminal. An output of the comparator is electrically connected to a fifth terminal.

9 Claims, 31 Drawing Sheets

(52) U.S. Cl.
CPC ....... *H02J 7/0068* (2013.01); *H01M 2220/30* (2013.01); *H02J 50/12* (2016.02)

(58) Field of Classification Search
CPC . H02J 7/0068; H02J 50/12; H02J 7/00; G01R 19/165; G01R 31/3835; G01R 31/2844; G01R 31/2843; G01R 31/2853; G01R 31/2879; G01R 31/382; G01R 31/396
USPC ......................................................... 320/136
See application file for complete search history.

(56) References Cited

U.S. PATENT DOCUMENTS

| | | | | |
|---|---|---|---|---|
| 2007/0264031 A1* | 11/2007 | Dalton | ................... | H04B 10/69 398/208 |
| 2012/0221266 A1 | 8/2012 | Kuroda et al. | | |
| 2014/0021904 A1 | 1/2014 | Takahashi et al. | | |
| 2014/0091301 A1* | 4/2014 | Yamazaki | ........... | H01L 27/1225 257/43 |
| 2014/0184314 A1 | 7/2014 | Takahashi et al. | | |
| 2016/0118821 A1 | 4/2016 | Takeda et al. | | |
| 2016/0195584 A1 | 7/2016 | Takahashi et al. | | |
| 2021/0158489 A1* | 5/2021 | Watanabe | ................ | G09G 3/32 |

FOREIGN PATENT DOCUMENTS

| | | |
|---|---|---|
| JP | 2002-286766 A | 10/2002 |
| JP | 2011-193423 A | 9/2011 |
| JP | 2012-181043 A | 9/2012 |
| JP | 2014-039459 A | 2/2014 |
| JP | 2017-169445 A | 9/2017 |
| JP | 2017-198546 A | 11/2017 |
| WO | WO-2016/020802 | 2/2016 |

OTHER PUBLICATIONS

Written Opinion (Application No. PCT/IB2020/052356) Dated Jul. 7, 2020.

* cited by examiner

SEMICONDUCTOR DEVICE, BATTERY PACK, AND ELECTRONIC DEVICE

TECHNICAL FIELD

One embodiment of the present invention relates to a semiconductor device, a battery pack, and an electronic device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

In this specification and the like, a semiconductor device generally means a device that can function by utilizing semiconductor characteristics. Thus, a semiconductor element such as a transistor or a diode and a circuit including a semiconductor element are semiconductor devices. A display device, a light-emitting device, a lighting device, an electro-optical device, an electronic device, and the like may include a semiconductor element or a semiconductor circuit. Therefore, a display device, a light-emitting device, a lighting device, an electro-optical device, an imaging device, an electronic device, and the like are referred to as a semiconductor device in some cases.

BACKGROUND ART

In recent years, a variety of power storage devices such as lithium-ion secondary batteries, lithium-ion capacitors, and air batteries have been actively developed. In particular, demand for lithium-ion secondary batteries with high output and high energy density has rapidly grown with the development of the semiconductor industry for portable information terminals such as mobile phones, smartphones, tablets, or laptop computers; game machines; portable music players; digital cameras; medical equipment; next-generation clean energy vehicles such as hybrid electric vehicles (HEVs), electric vehicles (EVs), and plug-in hybrid electric vehicles (PHEVs); electric bikes; or the like, and lithium-ion secondary batteries have become essential as rechargeable energy supply sources for the modern information society.

The power storage devices are each usually provided with a battery protection circuit for detecting an abnormality at charging and discharging, such as overdischarge, overcharge, overcurrent, or a short circuit.

The battery protection circuit acquires data of voltage, current, and the like to detect an abnormality at charging or discharging. The battery protection circuit controls opening and closing of a switch provided in a charge path or a discharge path, on the basis of the observed data, thereby protecting a battery cell from being overcharged or overdischarged (e.g., see Patent Document 1).

REFERENCE

Patent Document

[Patent Document 1] Specification of United States Patent Application Publication No. 2016-118821

SUMMARY OF THE INVENTION

Problems to be Solved by the Invention

An object of one embodiment of the present invention is to provide a semiconductor device with reduced power consumption, or the like. Another object is to provide a semiconductor device that has excellent accuracy in sensing voltage, or the like. Another object is to provide a semiconductor device that stably operates, or the like. Another object is to provide a semiconductor device with high reliability, or the like. Another object is to provide a semiconductor device with high productivity, or the like. Another object is to provide a novel semiconductor device or the like.

Note that the description of these objects does not preclude the existence of other objects. In one embodiment of the present invention, there is no need to achieve all the objects. Objects other than these will be apparent from the description of the specification, the drawings, the claims, and the like, and objects other than these can be derived from the description of the specification, the drawings, the claims, and the like.

Means for Solving the Problems

One embodiment of the present invention is a semiconductor device including first to third switches, a first capacitor, and a comparator. One terminal of the first switch is electrically connected to a first terminal. The other terminal of the first switch is electrically connected to a non-inverting input of the comparator. One terminal of the second switch is electrically connected to a second terminal. The other terminal of the second switch is electrically connected to one terminal of the third switch. The other terminal of the third switch is electrically connected to a third terminal. The first capacitor is provided between the other terminal of the first switch and the one terminal of the third switch. An inverting input of the comparator is electrically connected to a fourth terminal. An output of the comparator is electrically connected to a fifth terminal.

Another embodiment of the present invention is a semiconductor device including first to third transistors, a first capacitor, and a comparator. One of a source and a drain of the first transistor is electrically connected to a first terminal. The other of the source and the drain of the first transistor is electrically connected to a non-inverting input of the comparator. One of a source and a drain of the second transistor is electrically connected to a second terminal. The other of the source and the drain of the second transistor is electrically connected to one of a source and a drain of the third transistor. The other of the source and the drain of the third transistor is electrically connected to a third terminal. The first capacitor is provided between the other of the source and the drain of the first transistor and the one of the source and the drain of the third transistor. An inverting input of the comparator is electrically connected to a fourth terminal. An output of the comparator is electrically connected to a fifth terminal.

The first transistor preferably includes an oxide semiconductor in a semiconductor layer. At least one of the second transistor and the third transistor preferably includes an oxide semiconductor in a semiconductor layer.

Another embodiment of the present invention is a semiconductor device including first to sixth switches, a first capacitor, a second capacitor, and a comparator. One terminal of the first switch is electrically connected to a first terminal. The other terminal of the first switch is electrically connected to one terminal of the sixth switch. One terminal of the second switch is electrically connected to a second terminal. The other terminal of the second switch is electrically connected to one terminal of the third switch. The other terminal of the third switch is electrically connected to a third terminal. One terminal of the fourth switch is electrically connected to the first terminal. The other terminal of the fourth switch is electrically connected to a non-inverting input of the comparator. One terminal of the fifth switch is electrically connected to the second terminal. The other terminal of the fifth switch is electrically connected to the other terminal of the sixth switch. The first capacitor is provided between the other terminal of the first switch and the one terminal of the third switch. The second capacitor is provided between the other terminal of the fourth switch and the other terminal of the fifth switch. An inverting input of the comparator is electrically connected to a fourth terminal. An output of the comparator is electrically connected to a fifth terminal.

Another embodiment of the present invention is a battery pack including a secondary battery and any one of the above semiconductor devices provided over a flexible substrate. A negative electrode of the secondary battery is electrically connected to the first terminal. A positive electrode of the secondary battery is electrically connected to the third terminal.

Another embodiment of the present invention is an electronic device including the battery pack and a power receiving device.

Effect of the Invention

According to one embodiment of the present invention, a semiconductor device with reduced power consumption, or the like can be provided. A semiconductor device that has excellent accuracy of sensing voltage, or the like can be provided. A semiconductor device that stably operates, or the like can be provided. A semiconductor device with high reliability, or the like can be provided. A semiconductor device with high productivity, or the like can be provided. Alternatively, a novel semiconductor device or the like can be provided.

Note that the description of these effects does not preclude the existence of other effects. One embodiment of the present invention does not have to have all these effects. Note that effects other than these will be apparent from the description of the specification, the drawings, the claims, and the like, and effects other than these can be derived from the description of the specification, the drawings, the claims, and the like.

MODE FOR CARRYING OUT THE INVENTION

Figure 1A:
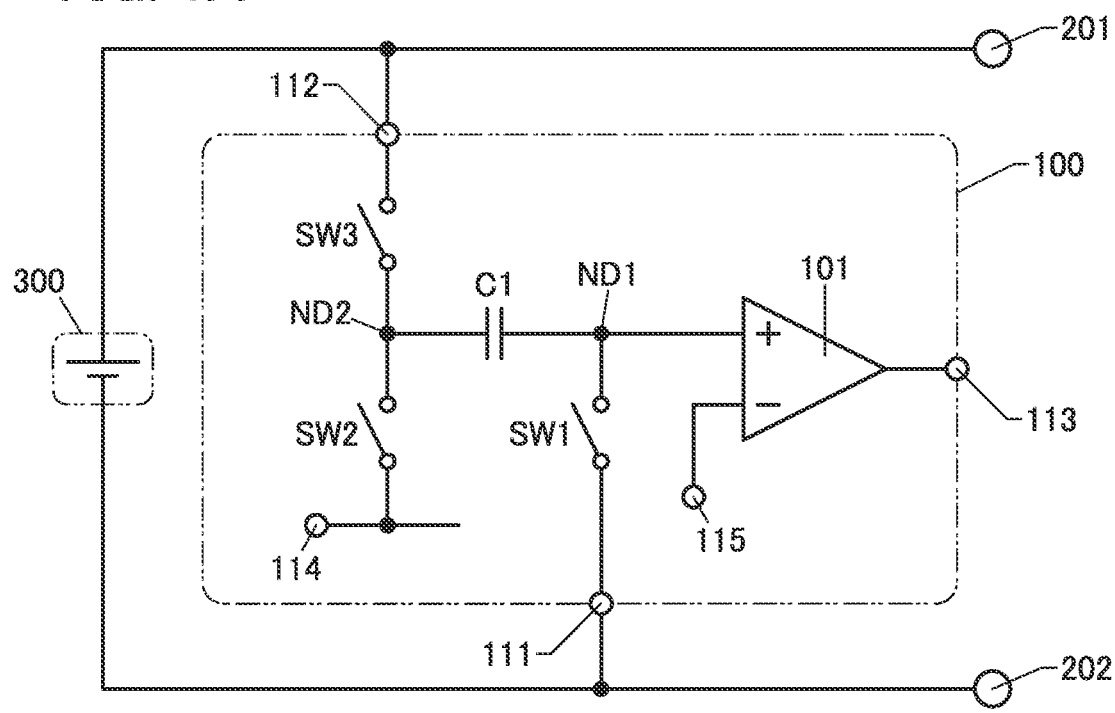
FIG. 1A and FIG. 1B are diagrams each illustrating a structure example of a semiconductor device.

Embodiments are described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the invention described below, the same portions or portions having similar functions are denoted by the same reference numerals in different drawings, and description thereof is not repeated.

The position, size, range, and the like of each component illustrated in the drawings and the like do not represent the actual position, size, range, and the like in some cases to facilitate understanding of the invention. Therefore, the disclosed invention is not necessarily limited to the position, size, range, or the like disclosed in drawings and the like. For example, in the actual manufacturing process, a resist mask or the like might be unintentionally reduced in size by treatment such as etching, which is not illustrated in some cases for easy understanding.

In a top view (also referred to as a "plan view"), a perspective view, or the like, some components might be omitted for easy understanding of the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, a "terminal" in an electric circuit refers to a portion that inputs or outputs current or voltage or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

Furthermore, functions of a source and a drain are interchanged with each other depending on operation conditions, for example, when a transistor of different polarity is employed or when the direction of current flow is changed in circuit operation; therefore, it is difficult to define which is the source or the drain. Thus, the terms "source" and "drain" can be interchanged with each other in this specification.

In this specification and the like, the expression "electrically connected" includes the case where components are directly connected to each other and the case where components are connected through an "object having any electric function". There is no particular limitation on the "object having any electric function" as long as electric signals can be transmitted and received between components that are connected through the object. Thus, even when the expression "electrically connected" is used, there is a case where no physical connection is made and a wiring just extends in an actual circuit.

In this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Furthermore, the terms "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "same", "equal", "uniform", and the like used in describing calculation values and measurement values allow for a margin of error of ±20% unless otherwise specified.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are regarded as being electrically short-circuited (also referred to as a "conducting state"). Furthermore, an "off state" of a transistor refers to a state in which a source and a drain of the transistor are regarded as being electrically disconnected (also referred to as a "non-conducting state").

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification and the like, a high power supply potential VDD (hereinafter also simply referred to as "VDD", "H potential", or "H") is a power supply potential higher than a low power supply potential VSS. The low power supply potential VSS (hereinafter also simply referred to as "VSS", "L potential", or "L") is a power supply potential lower than the high power supply potential VDD. In addition, a ground potential can be used as VDD or VSS. For example, in the case where VDD is a ground potential, VSS is a potential lower than the ground potential, and in the case where VSS is a ground potential, VDD is a potential higher than the ground potential.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

In the drawings and the like, for easy understanding of the potential of a wiring, an electrode, or the like, "H" representing an H potential or "L" representing an L potential is sometimes written near the wiring, the electrode, or the like. In addition, enclosed "H" or "L" is sometimes written near a wiring, an electrode, or the like whose potential changes. Moreover, a symbol "x" is sometimes written on a transistor in an off state.

Embodiment 1

A semiconductor device of one embodiment of the present invention is described with reference to drawings.

<Voltage Sensing Circuit 9900>

Figure 5A:
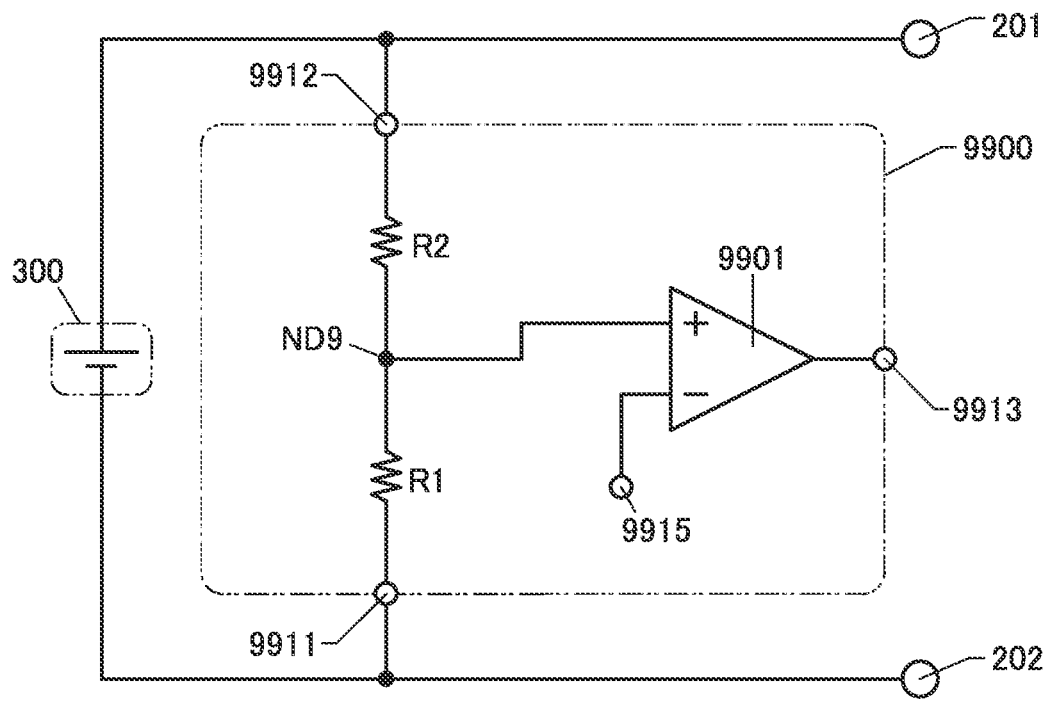
FIG. 5A and FIG. 5B are diagrams illustrating a structure example of a conventional semiconductor device.

First, a conventional example of a semiconductor device is described. As the conventional example of the semiconductor device, a structure example of a voltage sensing circuit 9900 that is illustrated in FIG. 5A and utilizes resistor voltage division is described.

The voltage sensing circuit 9900 includes a resistor R1, a resistor R2, and a comparator 9901 (comparison circuit). The resistor R1 is provided between a terminal 9911 and a node ND9, and the resistor R2 is provided between a terminal 9912 and the node ND9. The node ND9 is electrically connected to a non-inverting input of the comparator 9901. An inverting input of the comparator 9901 is electrically connected to a terminal 9915, and an output of the comparator 9901 is electrically connected to a terminal 9913.

The terminal 9912 is electrically connected to a terminal 201 and a positive electrode of a secondary battery 300. The terminal 9911 is electrically connected to a terminal 202 and a negative electrode of the secondary battery 300. The voltage sensing circuit 9900 has a function of changing the voltage of the terminal 9913 from L to H when a voltage supplied to the secondary battery 300 through the terminal 201 and the terminal 202 becomes higher than or equal to a predetermined value.

Figure 5B:
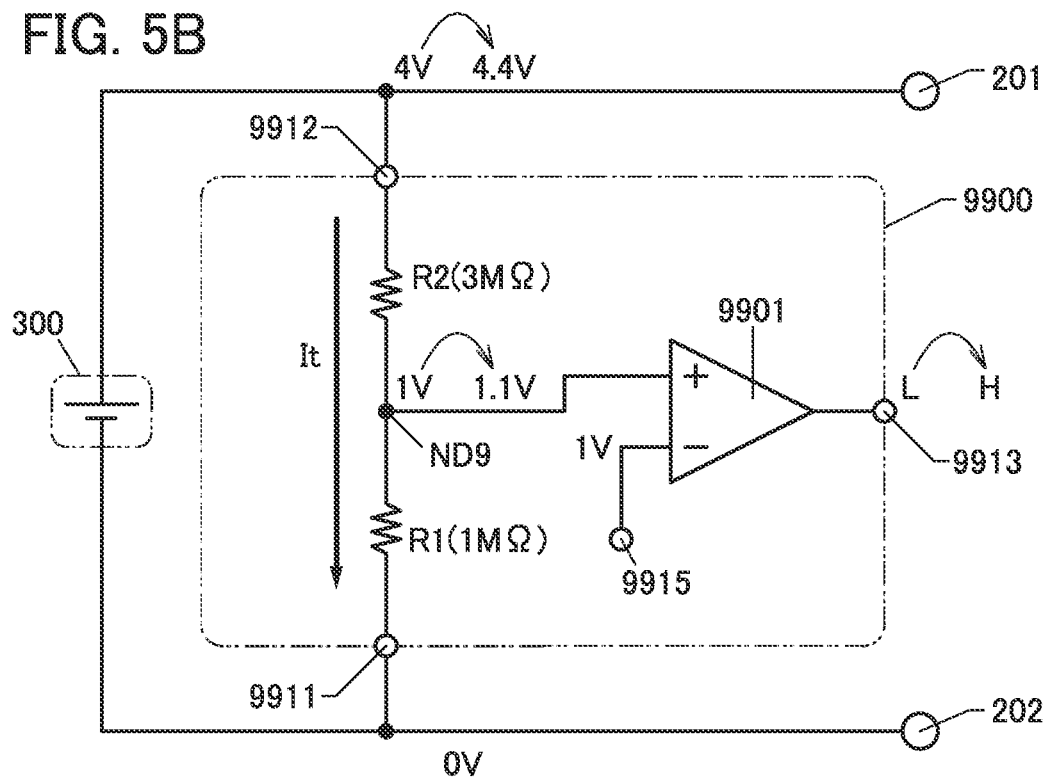

An operation of the voltage sensing circuit 9900 is described with reference to FIG. 5B. Note that a comparator in this specification and the like outputs L when a voltage input to its non-inverting input is lower than or equal to a voltage input to its inverting input, and outputs H when the voltage input to its non-inverting input is higher than the voltage input to its inverting input.

For example, on the assumption that the resistance value of the resistor R1 is 1 MΩ, the resistance value of the resistor R2 is 3 MΩ, and the voltage of the terminal 9915 is 1.0 V, the voltage of the node ND9 becomes 1.0 V owing to resistor voltage division when the voltage of the terminal 9911 is set to 0 V and the voltage of the terminal 9912 becomes 4.0 V. In other words, 1.0 V is supplied to the non-inverting input of the comparator 9901. Furthermore, since 1.0 V is supplied to the inverting input of the comparator 9901 through the terminal 9915, L is output from the comparator 9901. Thus, the voltage of the terminal 9913 becomes L.

When the voltage of the terminal 9912 exceeds 4.0 V, the voltage of the node ND9 also exceeds 1.0 V, so that H is output from the comparator 9901. Thus, the voltage of the terminal 9913 becomes H. For example, when the voltage of the terminal 9912 increases by 0.4 V from 4.0 V to 4.4 V, the voltage of the node ND9 increases by 0.1 V from 1.0 V to 1.1 V.

A current It always flows between the terminal 9911 and the terminal 9912 in the conventional voltage sensing circuit 9900 utilizing resistor voltage division; thus, it is difficult to reduce power consumption. In addition, the amount of voltage change of the node ND9 is smaller than the amount of voltage change of the terminal 9912 in principle, which causes a problem of low sensing sensitivity.

<Voltage Sensing Circuit 100>

As an example of the semiconductor device of one embodiment of the present invention, a structure example of a voltage sensing circuit 100 is described with reference to FIG. 1A.

Structure Example

The voltage sensing circuit 100 includes a switch SW1, a switch SW2, a switch SW3, a capacitor C1, and a comparator 101 (comparison circuit). One terminal of the switch SW1 is electrically connected to a terminal 111, and the other terminal thereof is electrically connected to a node ND1. One terminal of the switch SW2 is electrically connected to a terminal 114, and the other terminal thereof is electrically connected to a node ND2. One terminal of the switch SW3 is electrically connected to the node ND2, and the other terminal thereof is electrically connected to a terminal 112.

The capacitor C1 is provided between the node ND1 and the node ND2. A non-inverting input of the comparator 101 is electrically connected to the node ND1, and an inverting input thereof is electrically connected to a terminal 115. An output of the comparator 101 is electrically connected to a terminal 113.

The terminal 112 is electrically connected to the terminal 201 and the positive electrode of the secondary battery 300. The terminal 111 is electrically connected to the terminal 202 and the negative electrode of the secondary battery 300. The voltage sensing circuit 100 has a function of changing the voltage of the terminal 113 from L to H when a voltage supplied to the secondary battery 300 through the terminal 201 and the terminal 202 becomes higher than or equal to a predetermined value.

In this specification and the like, a switch is in a conduction state (on state) or a non-conduction state (off state) to determine whether a current flows or not. Alternatively, a switch has a function of selecting and changing a current path. For example, an electrical switch or a mechanical switch can be used. That is, a switch can be any element capable of controlling a current, and is not limited to a certain element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case where a transistor operates just as a switch, there is no particular limitation on the polarity (conductivity type) of the transistor.

An example of a mechanical switch is a switch formed using a MEMS (micro electro mechanical system) technology, such as a digital micromirror device (DMD). Such a switch includes an electrode that can be moved mechanically, and operates by controlling conduction and non-conduction with movement of the electrode.

Modification Example

Figure 1B:
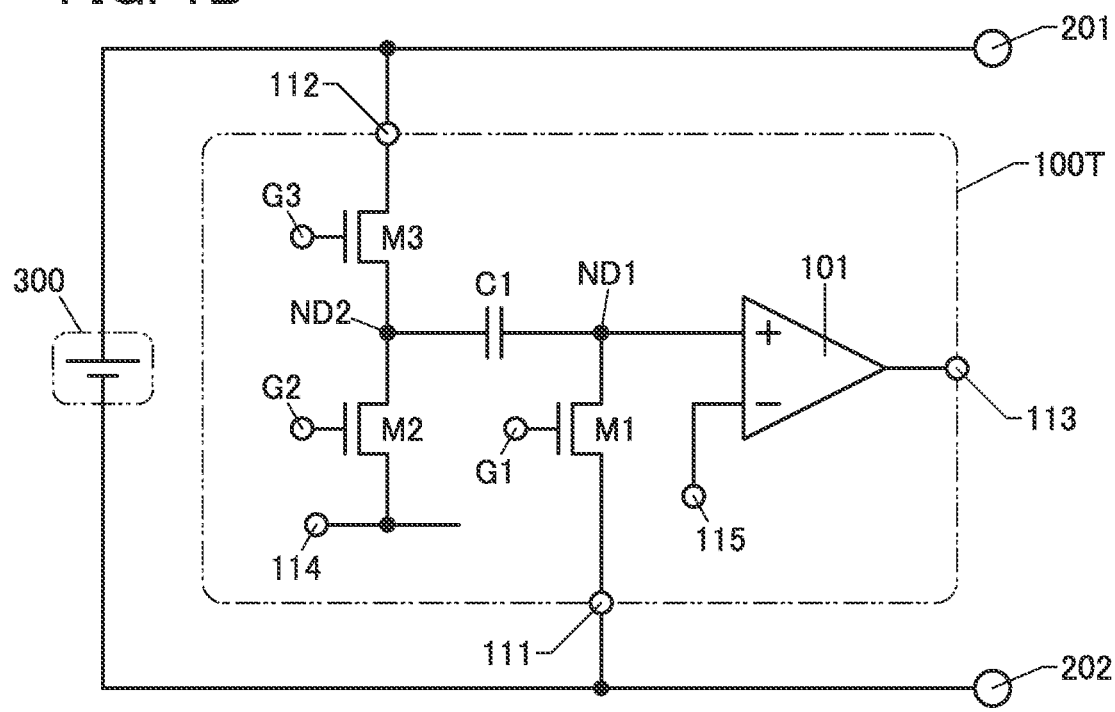

FIG. 1B illustrates a structure example of a voltage sensing circuit 100T in which the switch SW1, the switch SW2, and the switch SW3 included in the voltage sensing circuit 100 are replaced with transistors.

The voltage sensing circuit 100T includes a transistor M1, a transistor M2, a transistor M3, the capacitor C1, and the comparator 101 (comparison circuit). One of a source and a drain of the transistor M1 is electrically connected to the terminal 111, and the other of the source and the drain of the transistor M1 is electrically connected to the node ND1. A gate of the transistor M1 is electrically connected to a terminal G1. One of a source and a drain of the transistor M2 is electrically connected to the terminal 114, and the other of the source and the drain of the transistor M2 is electrically connected to the node ND2. A gate of the transistor M2 is electrically connected to a terminal G2. One of a source and a drain of the transistor M3 is electrically connected to the node ND2, and the other of the source and the drain of the transistor M3 is electrically connected to the terminal 112. A gate of the transistor M3 is electrically connected to a terminal G3.

The capacitor C1 is provided between the node ND1 and the node ND2. The non-inverting input of the comparator 101 is electrically connected to the node ND1, and the inverting input thereof is electrically connected to the terminal 115. The output of the comparator 101 is electrically connected to the terminal 113.

Each of the transistor M1, the transistor M2, and the transistor M3 is preferably a transistor including an oxide semiconductor, which is a kind of metal oxide, in a semiconductor layer where a channel is formed (also referred to as an "OS transistor"). An oxide semiconductor has a band gap of 2 eV or more and thus has an extremely low off-state current. Accordingly, the power consumption of the voltage sensing circuit 100T can be reduced. In addition, the power consumption of a semiconductor device including the voltage sensing circuit 100T can be reduced. The transistor M1 is particularly preferably an OS transistor because charge supplied to the node ND1 can be held for a long period.

Note that in the case where a transistor functions as a switch, one of a source and a drain of the transistor corresponds to one end (one terminal) of the switch, and the other of the source and the drain of the transistor corresponds to the other end (the other terminal) of the switch.

Figure 6A:
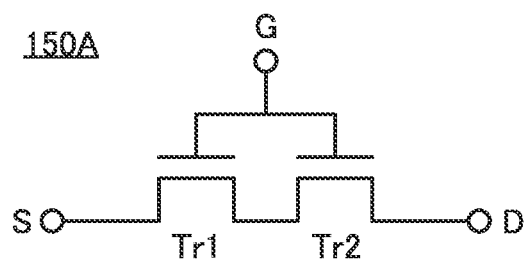
FIG. 6A to FIG. 6D are diagrams illustrating circuit symbols of transistors.

Each of the transistor M1, the transistor M2, and the transistor M3 may be a double-gate transistor. FIG. 6A illustrates a circuit symbol example of a double-gate transistor 150A.

The transistor 150A has a structure in which a transistor Tr1 and a transistor Tr2 are connected in series. FIG. 6A illustrates a state in which one of a source and a drain of the transistor Tr1 is electrically connected to a terminal S, the other of the source and the drain of the transistor Tr1 is electrically connected to one of a source and a drain of the transistor Tr2, and the other of the source and the drain of the transistor Tr2 is electrically connected to a terminal D. FIG. 6A illustrates a state in which gates of the transistor Tr1 and the transistor Tr2 are electrically connected to each other and electrically connected to a terminal G.

The transistor 150A illustrated in FIG. 6A has a function of switching a conduction state and a non-conduction state between the terminal S and the terminal D by changing the potential of the terminal G. Thus, the transistor 150A which is a double-gate transistor functions as one transistor including the transistor Tr1 and the transistor Tr2. In other words, it can be said that in FIG. 6A, one of a source and a drain of the transistor 150A is electrically connected to the terminal S, the other of the source and the drain thereof is electrically connected to the terminal D, and a gate thereof is electrically connected to the terminal G.

Figure 6B:
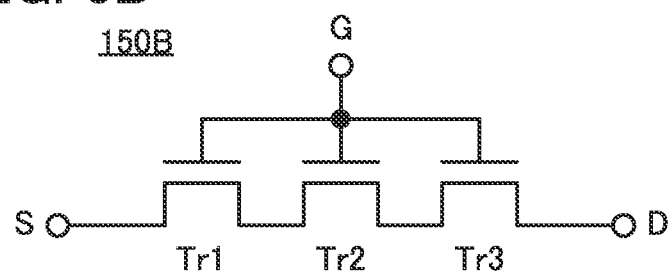

Each of the transistor M1, the transistor M2, and the transistor M3 may be a triple-gate transistor. FIG. 6B illustrates a circuit symbol example of a triple-gate transistor 150B.

The transistor 150B has a structure in which the transistor Tr1, the transistor Tr2, and a transistor Tr3 are connected in series. FIG. 6B illustrates a state in which the one of the source and the drain of the transistor Tr1 is electrically connected to the terminal S, the other of the source and the drain of the transistor Tr1 is electrically connected to the one of the source and the drain of the transistor Tr2, the other of the source and the drain of the transistor Tr2 is electrically connected to one of a source and a drain of the transistor Tr3, and the other of the source and the drain of the transistor Tr3 is electrically connected to the terminal D. FIG. 6B illustrates a state in which gates of the transistor Tr1, the transistor Tr2, and the transistor Tr3 are electrically connected to each other and electrically connected to the terminal G.

The transistor 150B illustrated in FIG. 6B has a function of switching a conduction state and a non-conduction state between the terminal S and the terminal D by changing the potential of the terminal G. Thus, the transistor 150B which is a triple-gate transistor functions as one transistor including the transistor Tr1, the transistor Tr2, and the transistor Tr3. In other words, it can be said that in FIG. 6B, one of a source and a drain of the transistor 150B is electrically connected to the terminal S, the other of the source and the drain thereof is electrically connected to the terminal D, and a gate thereof is electrically connected to the terminal G.

Like the transistor 150A and the transistor 150B, a transistor including a plurality of gates electrically connected to each other is referred to as a "multi-gate type transistor" or a "multi-gate transistor" in some cases.

Figure 6C:
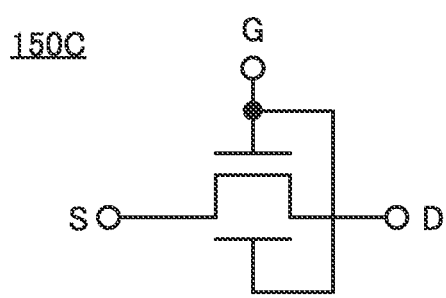
Figure 6D:
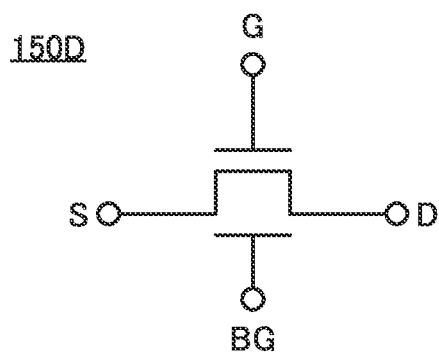

The transistor M1, the transistor M2, and the transistor M3 may each be a transistor including a back gate. FIG. 6C illustrates a circuit symbol example of a transistor 150C including a back gate. FIG. 6D illustrates a circuit symbol example of a transistor 150D including a back gate.

The transistor 150C has a structure in which a gate and the back gate are electrically connected to each other. The transistor 150D has a structure in which the back gate is electrically connected to a terminal BG. The back gate is placed such that a channel formation region of a semiconductor layer is sandwiched between the gate and the back gate. The back gate can function in a manner similar to that of the gate.

When the gate and the back gate are electrically connected to each other, the on-state current of the transistor can be increased. By changing the potential of the back gate independently, the threshold voltage of the transistor can be changed.

Operation Example

Figure 2:
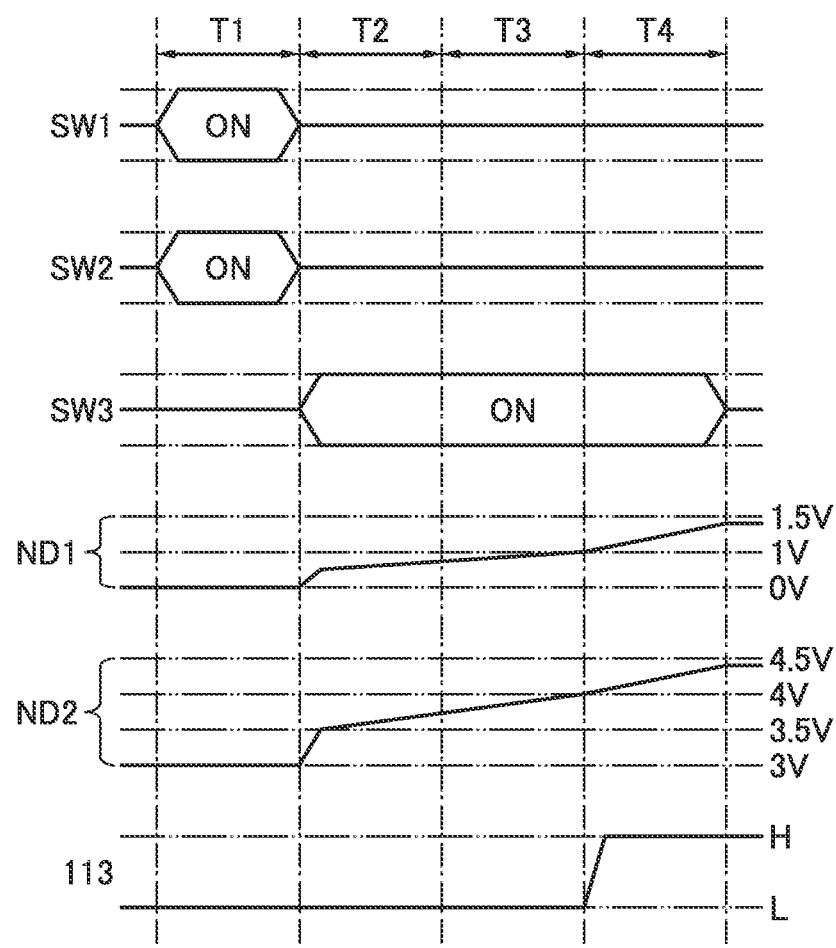
FIG. 2 is a timing chart showing an operation example of a semiconductor device.

An operation example of the voltage sensing circuit 100 is described with reference to FIG. 2 to FIG. 4. FIG. 2 is a timing chart showing the operation of the voltage sensing circuit 100. FIG. 3 and FIG. 4 are diagrams illustrating operation states of the voltage sensing circuit 100.

In this embodiment, the charging operation of the secondary battery 300 is described in which the potential of the terminal 113 becomes L when the charging voltage is lower than or equal to 4 V and the potential of the terminal 113 becomes H when the charging voltage exceeds 4 V. Note that 3 V and 1 V are supplied to the terminal 114 and the terminal 115, respectively. In addition, the voltage of the terminal 201 changes from 3.5 V to 4.4 V during the charging operation.

[Period T1]

Figure 3A:
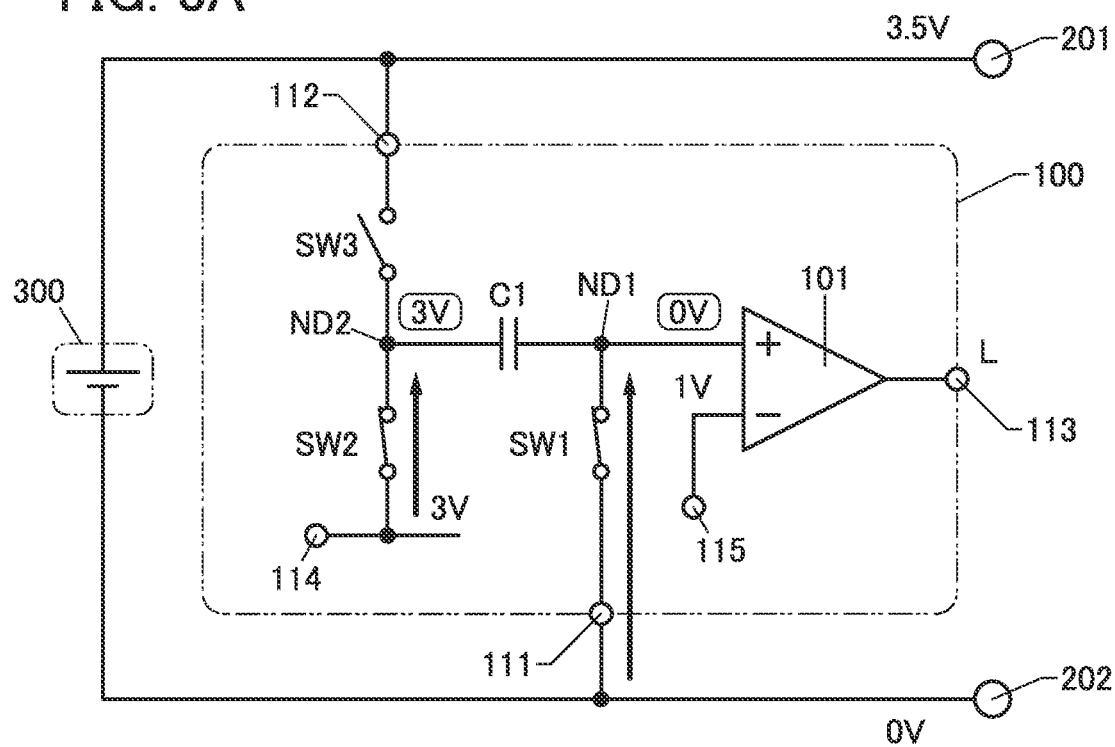
FIG. 3A and FIG. 3B are diagrams illustrating operation examples of a semiconductor device.
Figure 4A:
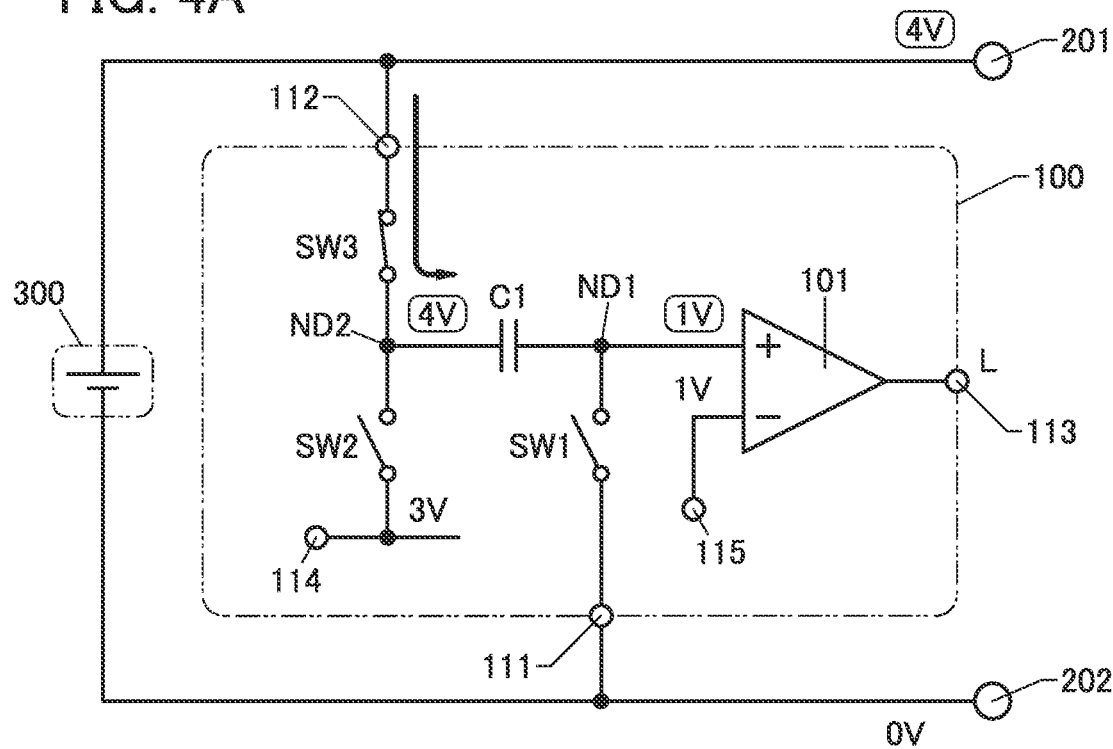
FIG. 4A and FIG. 4B are diagrams illustrating operation examples of a semiconductor device.

In a period T1, the switch SW1 and the switch SW2 are turned on and the switch SW3 is turned off (see FIG. 3A). Then, the voltage of the ND1 becomes 0 V and the voltage of the node ND2 becomes 3 V. The inverting input of the comparator 101 is supplied with 1 V and the non-inverting input thereof is supplied with 0 V. Thus, the output of the comparator 101 is at L and the voltage of the terminal 113 is also L.

[Period T2]

Figure 3B:
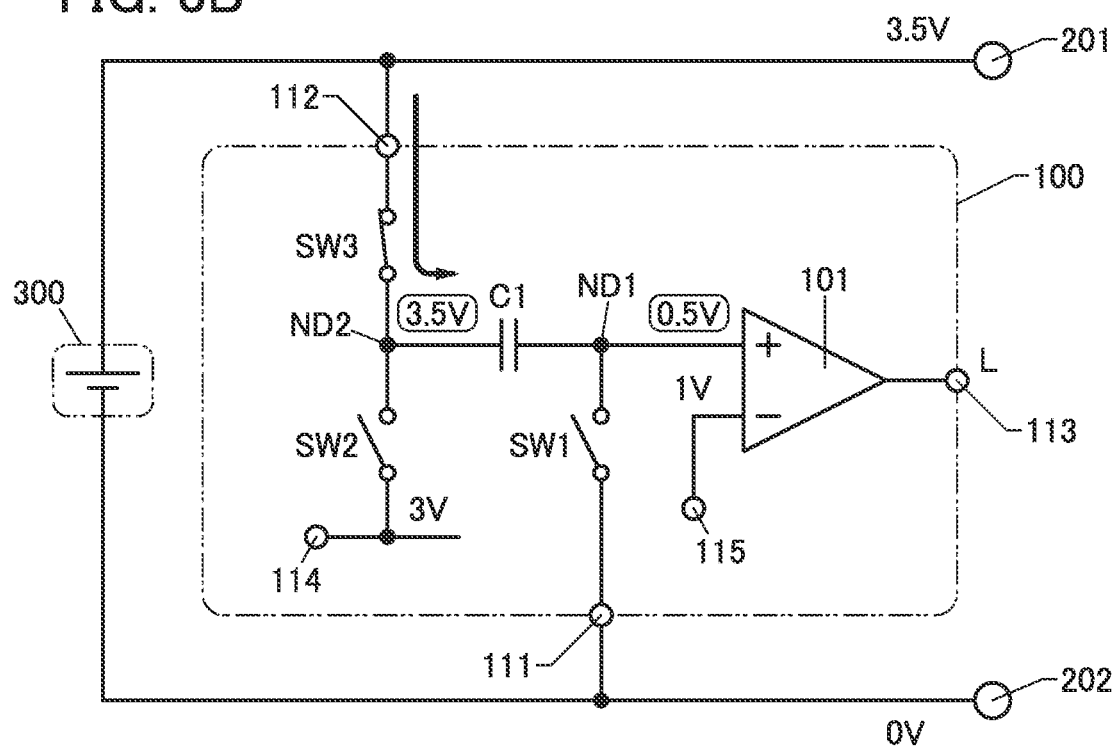

In a period T2, the switch SW1 and the switch SW2 are turned off and the switch SW3 is turned on (see FIG. 3B). Then, the voltage of the node ND2 becomes 3.5 V and the voltage of the node ND1 becomes 0.5 V. The inverting input of the comparator 101 is supplied with 1 V and the non-inverting input thereof is supplied with 0.5 V. Thus, the output of the comparator 101 remains at L and the voltage of the terminal 113 also remains L.

The voltages of the terminal 112 and the node ND2 increase as the voltage of the terminal 201 increases. Accordingly, the voltage of the node ND1 also increases.

[Period T3]

After the period T2, the voltage of the terminal 201 increases also in a period T3. Thus, the potentials of the terminal 112, the node ND2, and the node ND1 increase. The voltage of the terminal 201 increases up to 4 V in the period T3.

When the voltage of the terminal 201 becomes 4 V, the voltages of the terminal 112 and the node ND2 also become 4 V. The voltage of the node ND1 becomes 1 V (see FIG. 4A). The inverting input of the comparator 101 is supplied with 1 V, and the non-inverting input thereof is also supplied with 1 V. Thus, the output of the comparator 101 remains at L and the voltage of the terminal 113 also remains L.

[Period T4]

The voltage of the terminal 201 increases also in a period T4. The voltage of the terminal 201 increases up to 4.4 V in the period T4.

When the voltage of the terminal 201 exceeds 4 V, the voltages of the terminal 112 and the node ND2 also exceed 4 V. In addition, the voltage of the node ND1 exceeds 1 V. The inverting input of the comparator 101 is supplied with 1 V, and the non-inverting input thereof is supplied with a voltage higher than 1 V. Thus, the voltage of the output of the comparator 101 becomes H, and the voltage of the terminal 113 also becomes H.

Figure 4B:
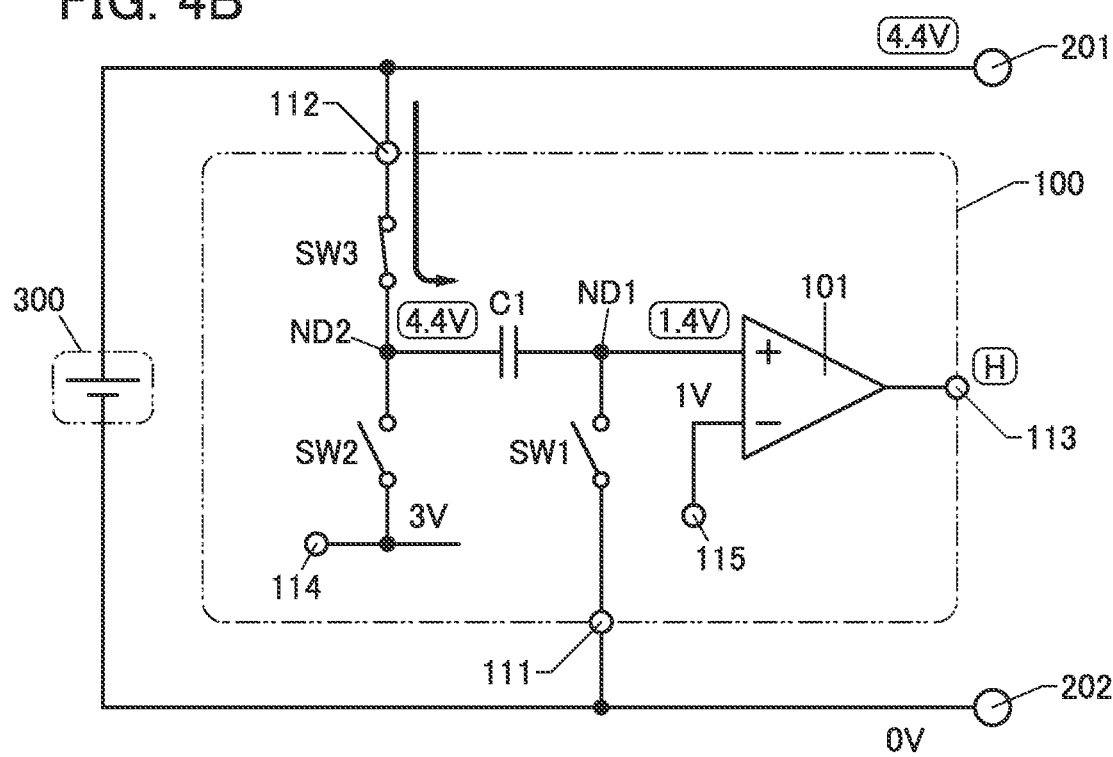

When the voltage of the terminal 201 becomes 4.4 V, the voltage of the node ND2 also becomes 4.4 V and the voltage of the node ND1 becomes 1.4 V (see FIG. 4B).

Unlike in the conventional voltage sensing circuit 9900, the current It is not generated during operation in the voltage sensing circuit 100 of one embodiment of the present invention. Therefore, the power consumption can be reduced. In addition, the amount of voltage change in the terminal 112 and that in the node ND2 are equal, so that the sensing sensitivity is favorable.

This embodiment can be implemented in an appropriate combination with structures described in the other embodiment, example, and the like.

Embodiment 2

In this embodiment, a modification example of the semiconductor device described in the above embodiment is described. The above embodiment is referred to for the matters that are not described in this embodiment.

<Voltage Sensing Circuit 100A>

As a modification example of the semiconductor device of one embodiment of the present invention, a voltage sensing circuit 100A is described. Note that the voltage sensing circuit 100A is a modification example of the voltage sensing circuit 100 described in the above embodiment.

Structure Example

Figure 7:
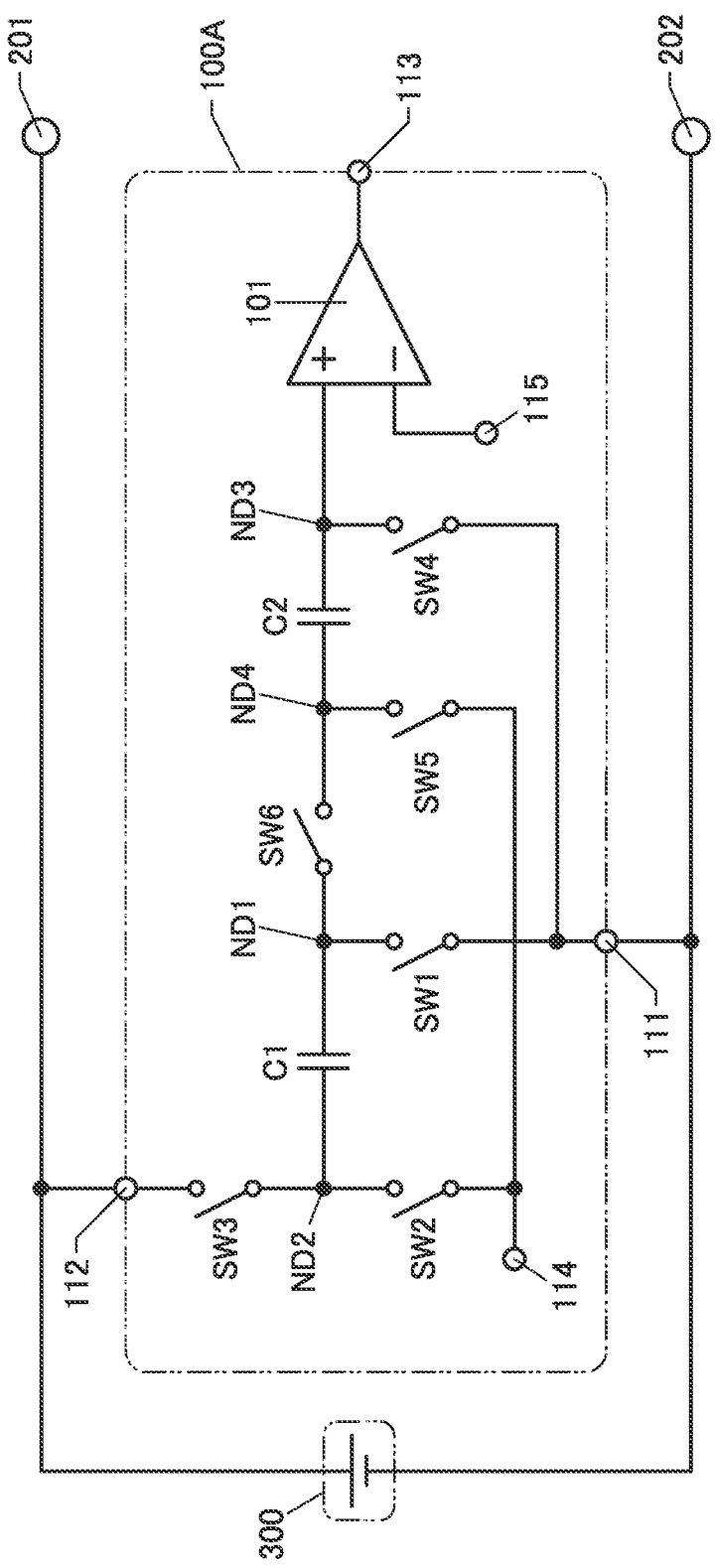
FIG. 7 is a diagram illustrating a structure example of a semiconductor device.

FIG. 7 illustrates a structure example of the voltage sensing circuit 100A. The voltage sensing circuit 100A has a structure in which a switch SW4, a switch SW5, a switch SW6, and a capacitor C2 are added to the structure of the voltage sensing circuit 100.

Specifically, the one terminal of the switch SW1 is electrically connected to the terminal 111, and the other terminal thereof is electrically connected to the node ND1. The one terminal of the switch SW2 is electrically connected to the terminal 114, and the other terminal thereof is electrically connected to the node ND2. The one terminal of the switch SW3 is electrically connected to the node ND2, and the other terminal thereof is electrically connected to the terminal 112. One terminal of the switch SW4 is electrically connected to the terminal 111, and the other terminal thereof is electrically connected to a node ND3. One terminal of the switch SW5 is electrically connected to the terminal 114, and the other terminal thereof is electrically connected to a node ND4. One terminal of the switch SW6 is electrically connected to the node ND1, and the other terminal thereof is electrically connected to the node ND4.

The capacitor C1 is provided between the node ND1 and the node ND2. The capacitor C2 is provided between the node ND3 and the node ND4. The non-inverting input of the comparator 101 is electrically connected to the node ND3, and the inverting input thereof is electrically connected to the terminal 115. The output of the comparator 101 is electrically connected to the terminal 113.

The terminal 112 is electrically connected to the terminal 201 and the positive electrode of the secondary battery 300. The terminal 111 is electrically connected to the terminal 202 and the negative electrode of the secondary battery 300. The voltage sensing circuit 100A has a function of changing the voltage of the terminal 113 from L to H when a voltage supplied to the secondary battery 300 through the terminal 201 and the terminal 202 becomes higher than or equal to a predetermined value.

Modification Example 1

Figure 8:
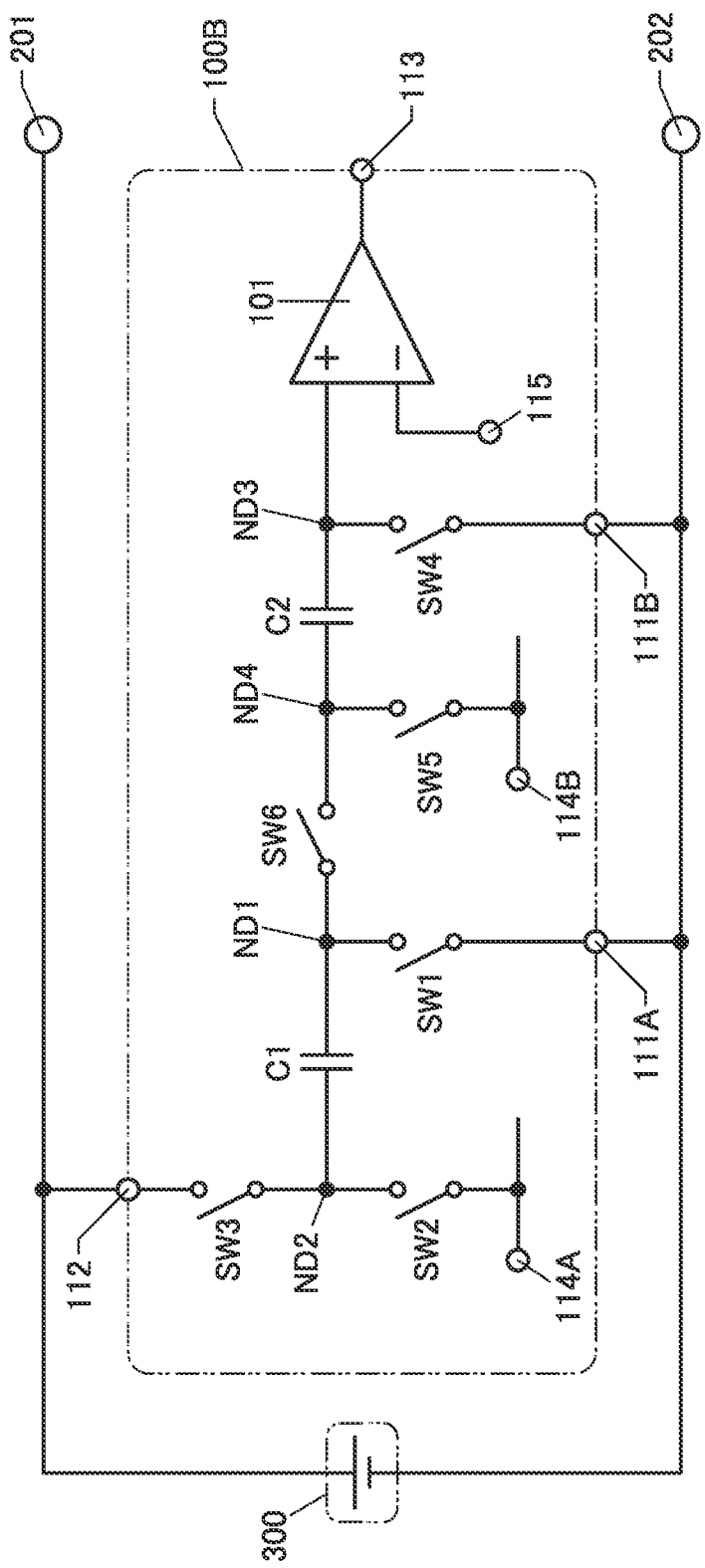
FIG. 8 is a diagram illustrating a structure example of a semiconductor device.

FIG. 8 illustrates a voltage sensing circuit 100B which is a modification example of the voltage sensing circuit 100A. The voltage sensing circuit 100B includes a terminal 111A and a terminal 111B instead of the terminal 111, and includes a terminal 114A and a terminal 114B instead of the terminal 114.

In the voltage sensing circuit 100B, the one terminal of the switch SW1 is electrically connected to the terminal 111A, and the one terminal of the switch SW4 is electrically connected to the terminal 111B. The one terminal of the switch SW2 is electrically connected to the terminal 114A, and the one terminal of the switch SW5 is electrically connected to the terminal 114B.

In the voltage sensing circuit 100B, different voltages can be supplied to the one terminal of the switch SW2 and the one terminal of the switch SW5. Although both the terminal 111A and the terminal 111B are electrically connected to the terminal 202 in FIG. 8, the terminal 111A and the terminal 111B may be electrically connected to different terminals, different wirings, or the like.

Modification Example 2

Figure 9:
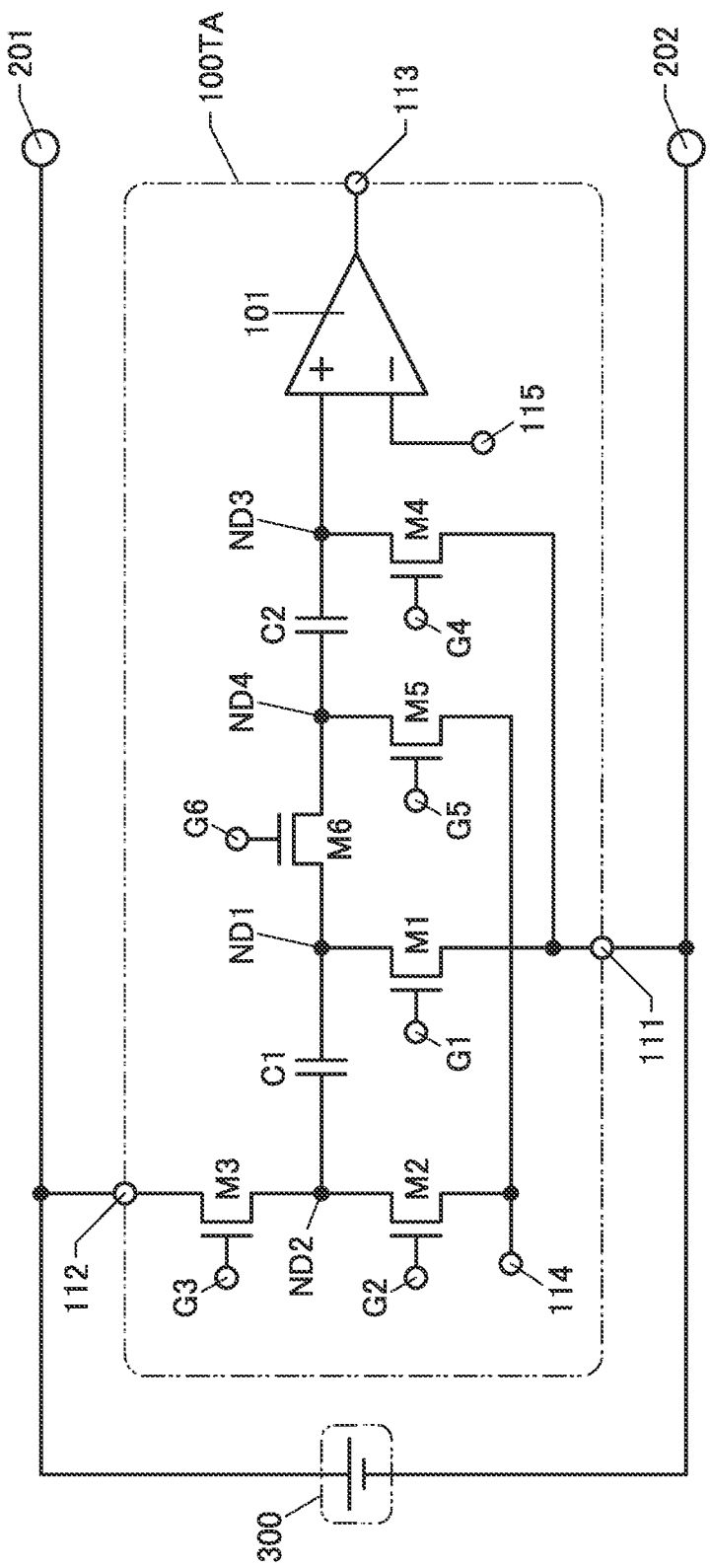
FIG. 9 is a diagram illustrating a structure example of a semiconductor device.

FIG. 9 illustrates a structure example of a voltage sensing circuit 100TA in which the switch SW1 to the switch SW6 included in the voltage sensing circuit 100A are replaced with transistors. The voltage sensing circuit 100TA is a modification example of the voltage sensing circuit 100T. The voltage sensing circuit 100TA has a structure in which a transistor M4, a transistor M5, a transistor M6, and the capacitor C2 are added to the structure of the voltage sensing circuit 100T.

Specifically, the voltage sensing circuit 100TA includes the transistor M1, the transistor M2, the transistor M3, the transistor M4, the transistor M5, the transistor M6, the capacitor C1, the capacitor C2, and the comparator 101. The one of the source and the drain of the transistor M1 is electrically connected to the terminal 111, and the other of the source and the drain of the transistor M1 is electrically connected to the node ND1. The gate of the transistor M1 is electrically connected to the terminal G1. The one of the source and the drain of the transistor M2 is electrically connected to the terminal 114, and the other of the source and the drain of the transistor M2 is electrically connected to the node ND2. The gate of the transistor M2 is electrically connected to the terminal G2. The one of the source and the drain of the transistor M3 is electrically connected to the node ND2, and the other of the source and the drain of the transistor M3 is electrically connected to the terminal 112. The gate of the transistor M3 is electrically connected to the terminal G3.

One of a source and a drain of the transistor M4 is electrically connected to the terminal 111, and the other of the source and the drain of the transistor M4 is electrically connected to the node ND3. A gate of the transistor M4 is electrically connected to a terminal G4. One of a source and a drain of the transistor M5 is electrically connected to the terminal 114, and the other of the source and the drain of the transistor M5 is electrically connected to the node ND4. A gate of the transistor M5 is electrically connected to a terminal G5. One of a source and a drain of the transistor M6 is electrically connected to the node ND1, and the other of the source and the drain of the transistor M6 is electrically connected to the node ND4. A gate of the transistor M6 is electrically connected to a terminal G6.

The capacitor C1 is provided between the node ND1 and the node ND2. The capacitor C2 is provided between the node ND3 and the node ND4. The non-inverting input of the comparator 101 is electrically connected to the node ND3, and the inverting input thereof is electrically connected to the terminal 115. The output of the comparator 101 is electrically connected to the terminal 113.

Like the transistors M1 to M3, the transistors M4 to M6 are preferably OS transistors. The transistor M4 is particularly preferably an OS transistor because charge supplied to the node ND3 can be held for a long period. Moreover, the transistor M5 is preferably an OS transistor because charge supplied to the node ND4 can be held for a long period.

Operation Example

Figure 10:
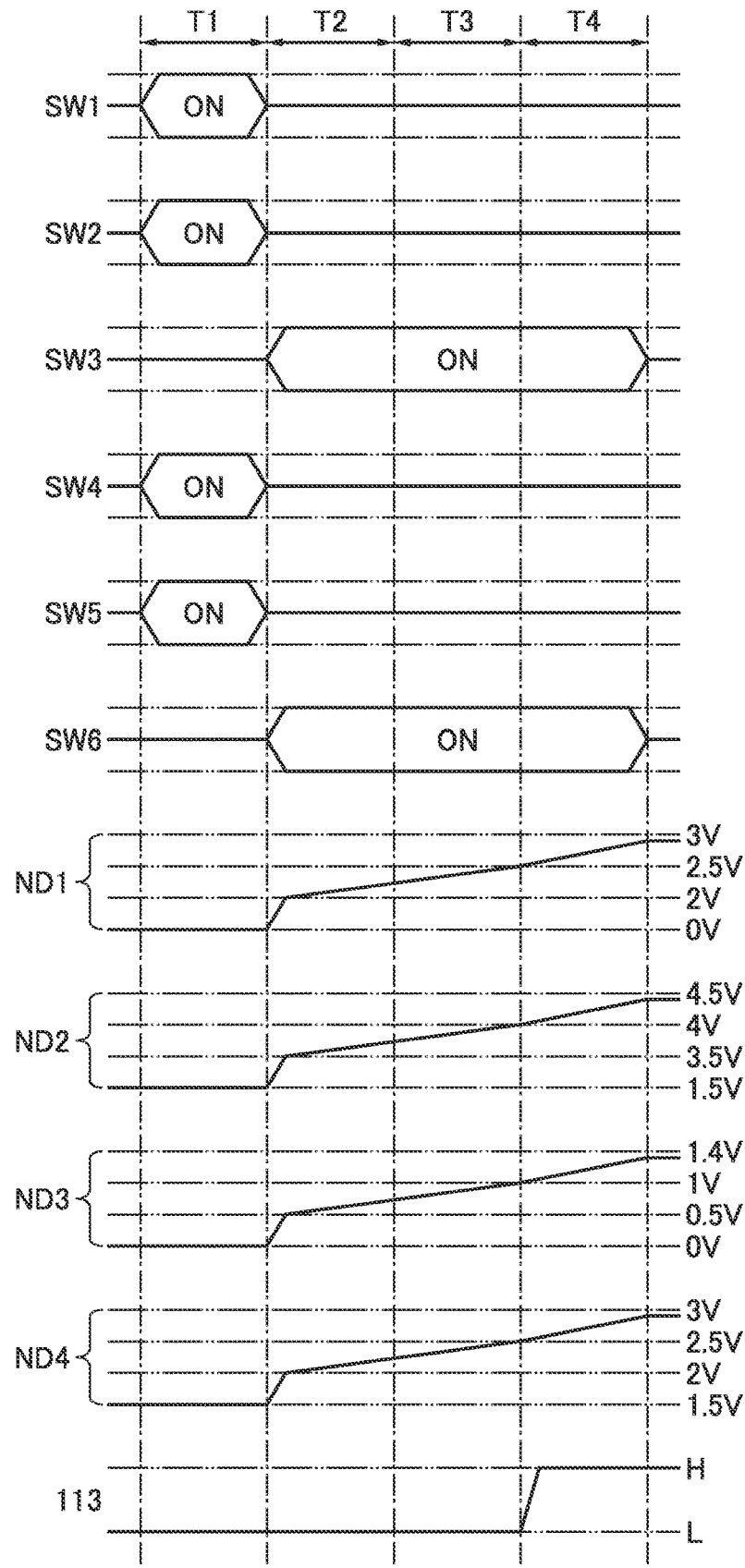
FIG. 10 is a timing chart showing an operation example of a semiconductor device.

An operation example of the voltage sensing circuit 100A is described with reference to FIG. 10 to FIG. 14. FIG. 10 is a timing chart showing the operation of the voltage sensing circuit 100A. FIG. 11 to FIG. 14 are diagrams illustrating operation states of the voltage sensing circuit 100A.

In this embodiment, the charging operation of the secondary battery 300 is described in which the potential of the terminal 113 becomes L when the charging voltage is lower than or equal to 4 V and the voltage of the terminal 113 becomes H when the charging voltage exceeds 4 V. Note that 1.5 V and 1 V are supplied to the terminal 114 and the terminal 115, respectively. In addition, the voltage of the terminal 201 changes from 3.5 V to 4.4 V during the charging operation.

[Period T1]

Figure 11:
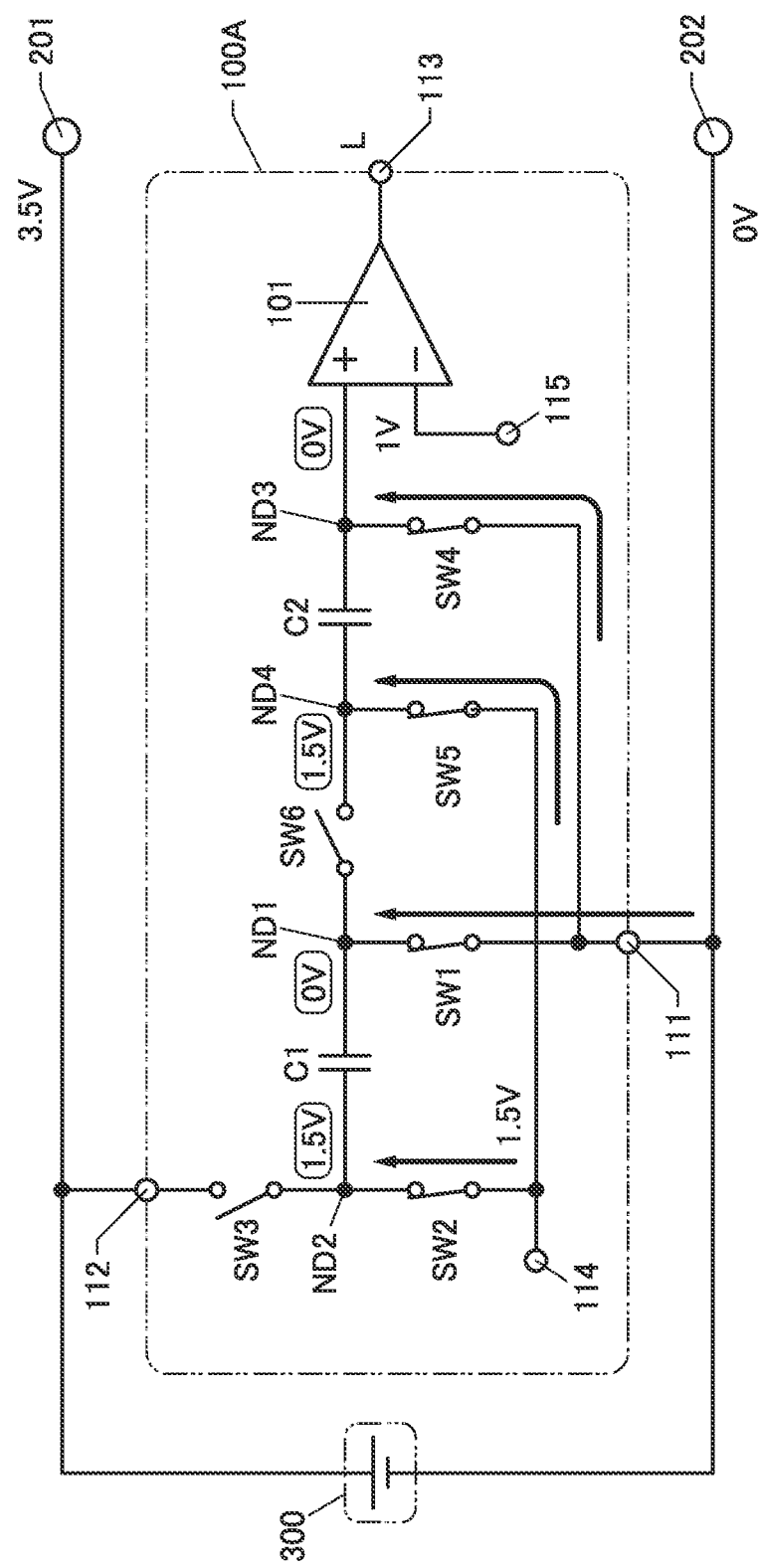
FIG. 11 is a diagram illustrating an operation example of a semiconductor device.

In the period T1, the switch SW1, the switch SW2, the switch SW4, and the switch SW5 are turned on and the switch SW3 and the switch SW6 are turned off (see FIG. 11). Then, the voltages of the ND1 and the node ND3 become 0 V and the voltages of the node ND2 and the node ND4 become 1.5 V. The inverting input of the comparator 101 is supplied with 1 V and the non-inverting input thereof is supplied with 0 V. Thus, the output of the comparator 101 is at L and the voltage of the terminal 113 is also L.

[Period T2]

Figure 12:
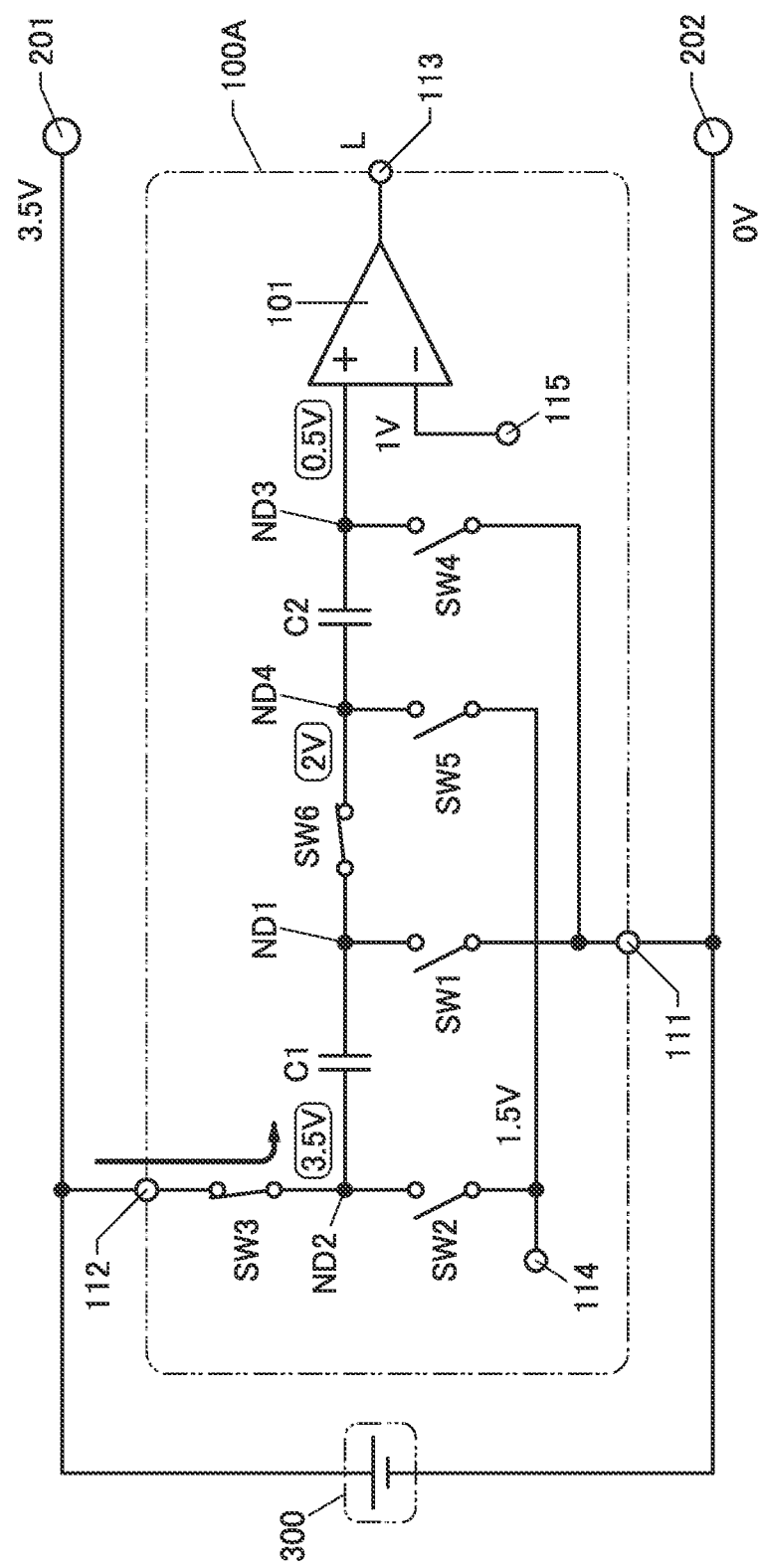
FIG. 12 is a diagram illustrating an operation example of a semiconductor device.
Figure 13:
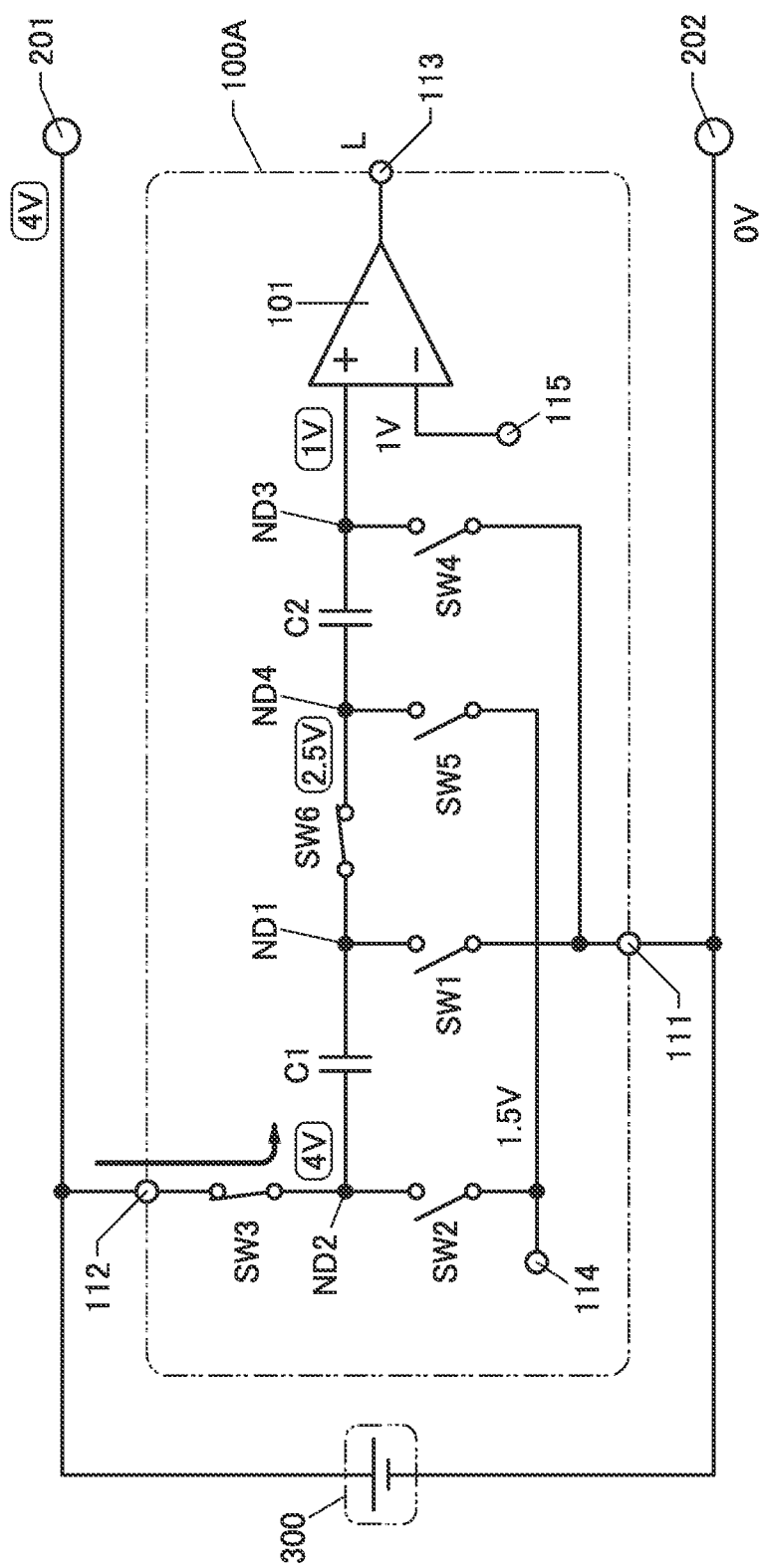
FIG. 13 is a diagram illustrating an operation example of a semiconductor device.
Figure 14:
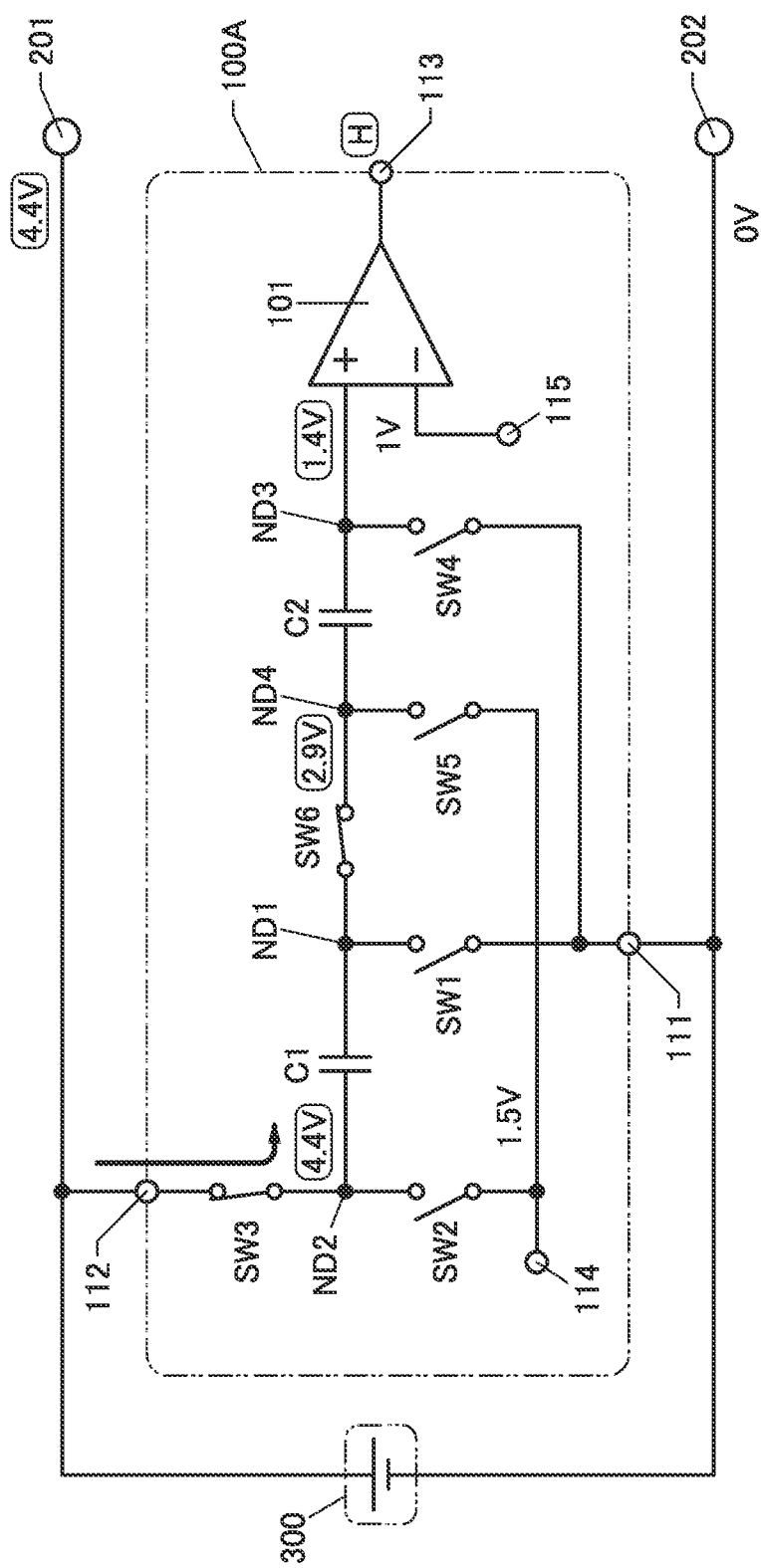
FIG. 14 is a diagram illustrating an operation example of a semiconductor device.

In the period T2, the switch SW1, the switch SW2, the switch SW4, and the switch SW5 are turned off, and the switch SW3 and the switch SW6 are turned on (see FIG. 12). Then, the voltage of the node ND2 increases by 2 V from 1.5 V to 3.5 V, and the voltage of the node ND1 increases by 2 V from 0 V to 2 V. Since the switch SW6 is in an on state, the node ND1 and the node ND4 are electrically connected to each other. Thus, the voltage of the node ND4 also becomes 2 V. At this time, the voltage of the node ND4 increases by 0.5 V from 1.5 V. Thus, the voltage of the node ND3 becomes 0.5 V, and the non-inverting input of the comparator 101 is supplied with 0.5 V. Since the inverting input of the comparator 101 is supplied with 1 V, the output of the comparator 101 remains at L and the voltage of the terminal 113 also remains L.

The voltages of the terminal 112 and the node ND2 increase as the voltage of the terminal 201 increases. Accordingly, the voltages of the node ND1, the node ND3, and the node ND4 also increase.

[Period T3]

After the period T2, the potentials of the terminal 112 and the node ND1 to the node ND4 increase also in the period T3 as the potential of the terminal 201 increases. In the period T3, the voltage of the terminal 201 increases up to 4 V.

When the voltage of the terminal 201 becomes 4 V, the voltages of the terminal 112 and the node ND2 also become 4 V. The voltages of the node ND1 and the node ND4 become 2.5 V, and the voltage of the node ND3 becomes 1 V (see FIG. 13). Accordingly, the inverting input of the comparator 101 is supplied with 1 V. The non-inverting input of the comparator 101 is supplied with 1 V. Thus, the output of the comparator 101 remains at L and the voltage of the terminal 113 also remains L.

[Period T4]

The voltage of the terminal 201 increases also in the terminal T4. The voltage of the terminal 201 increases up to 4.4 V in the period T4.

When the voltage of the terminal 201 exceeds 4 V, the voltages of the terminal 112 and the node ND2 also exceed 4 V. In addition, the voltage of the node ND3 exceeds 1 V. The inverting input of the comparator 101 is supplied with 1 V, and the non-inverting input thereof is supplied with a voltage higher than 1 V. Thus, the voltage of the output of the comparator 101 becomes H, and the voltage of the terminal 113 also becomes H.

When the voltage of the terminal 201 becomes 4.4 V, the voltage of the node ND2 also becomes 4.4 V. In addition, the voltages of the node ND1 and the node ND4 become 2.9 V, and the voltage of the node ND3 becomes 1.4 V (see FIG. 14).

In the voltage sensing circuit 100A described in this embodiment, the voltage applied to the terminal 114 can be smaller than that in the voltage sensing circuit 100. Thus, the power consumption can be reduced as compared with the voltage sensing circuit 100. In addition, since a voltage necessary for operation can be low, load on a voltage generation circuit can be reduced. Accordingly, a semiconductor device using the voltage sensing circuit 100A can operate stably and have higher reliability.

This embodiment can be implemented in an appropriate combination with structures described in the other embodiment, example, and the like.

Embodiment 3

In this embodiment, a structure example of a wireless power feeding system using the semiconductor device of one embodiment of the present invention is described.

As methods for wireless power feeding, a radio wave method, an electric field coupling method, a magnetic resonance method, an electromagnetic induction method, and the like are known. In particular, an electromagnetic induction method is known as a method with easy circuit design and high transmission efficiency of an electric power, and application to a mobile device such as a portable information terminal has been considered. As the international standards for wireless power feeding using an electromagnetic induction method, the Qi standard, the PMA standard, the AirFuel Inductive standard, and the like are known.

Although a magnetic resonance method has more complicated circuit design and lower transmission efficiency of an electric power than an electromagnetic induction method, power can be transmitted at a distance longer than that of an electromagnetic induction method, and thus application to an EV (Electric Vehicle) or the like has been considered. As the international standards for wireless power feeding using a magnetic resonance method, the WPT1 standard, the WPT2 standard, the WPT3 standard, the AirFuel Resonant standard, and the like are known.

The semiconductor device of one embodiment of the present invention can be used for wireless power feeding systems of various methods. The semiconductor device of one embodiment of the present invention can be used for wireless power feeding systems of various standards.

Figure 15A:
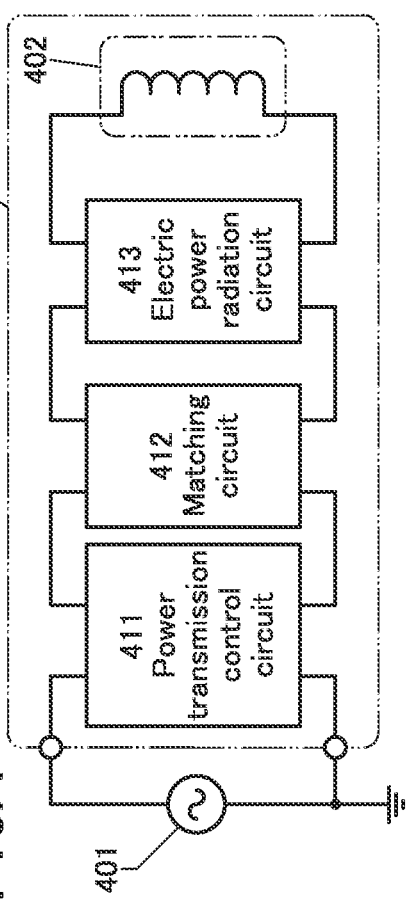
FIG. 15A and FIG. 15B are diagrams each illustrating a structure example of a semiconductor device.
Figure 15B:
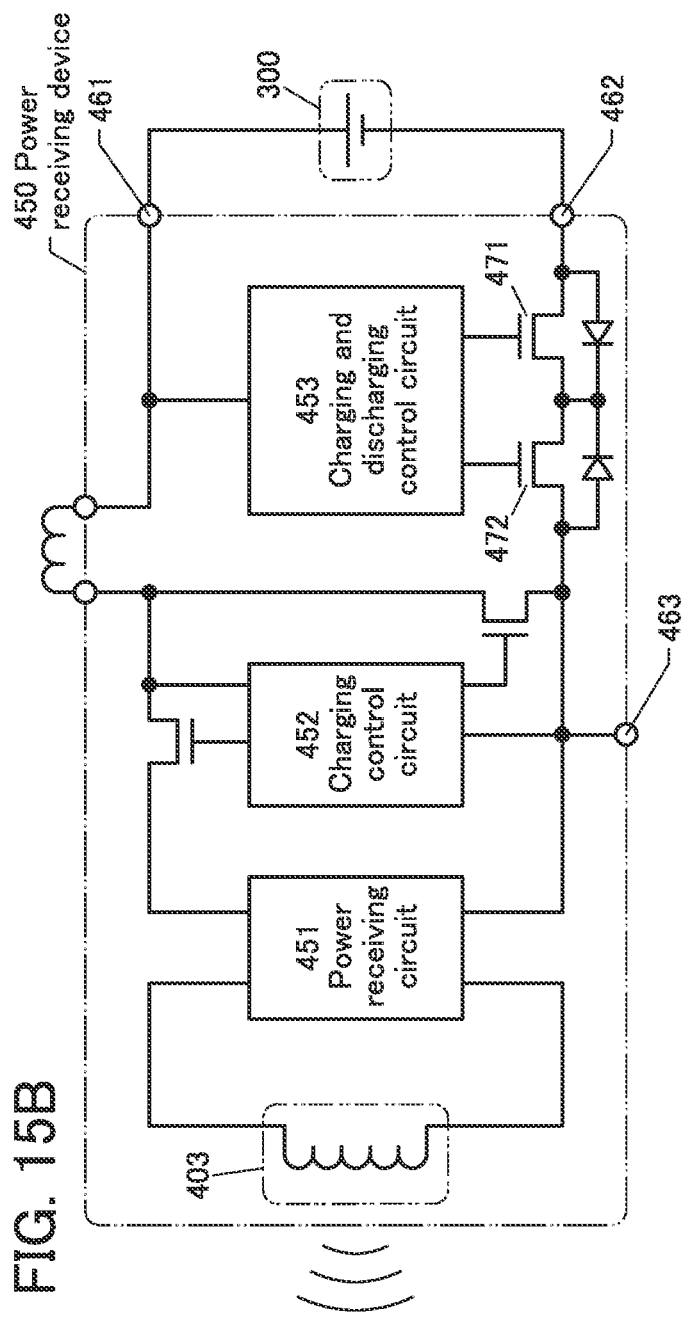

The wireless power feeding system described as an example in this embodiment includes a power transmitting device 400 and a power receiving device 450. FIG. 15A illustrates a structure example of the power transmitting device 400. FIG. 15B illustrates a structure example of the power receiving device 450.

Note that the structures of the power transmitting device 400 illustrated in FIG. 15A and the power receiving device 450 illustrated in FIG. 15B are examples, and all of the components are not necessarily included. The power transmitting device 400 and the power receiving device 450 include at least necessary components of the components illustrated in FIG. 15A and FIG. 15B. A component other than the components illustrated in FIG. 15A and FIG. 15B may be included.

<Power Transmitting Device 400>

The power transmitting device 400 includes a power transmission control circuit 411, a matching circuit 412, and an electric power radiation circuit 413. A power source 401 is connected to the power transmitting device 400. The power source 401 has a function of supplying AC power to the power transmitting device 400. The frequency fG of the AC power supplied by the power source 401 is not limited to a specific frequency, and can be any of the following, for example: 300 GHz to 3 THz as frequencies of sub-millimeter waves; 30 GHz to 300 GHz as frequencies of millimeter waves; 3 GHz to 30 GHz as frequencies of microwaves; 300 MHz to 3 GHz as ultra high frequencies; 30 MHz to 300 MHz as very high frequencies; 3 MHz to 30 MHz as high frequencies; 300 kHz to 3 MHz as medium frequencies; 30 kHz to 300 kHz as low frequencies; and 3 kHz to 30 kHz as very low frequencies.

The power transmission control circuit 411 has a function of supplying an electric power supplied from the power source 401 to the electric power radiation circuit 413 through the matching circuit 412. The electric power radiation circuit 413 is connected to a power transmitting antenna 402. The electric power radiation circuit 413 has a function of emitting the AC power supplied from the power source 401 to the external space through the power transmitting antenna 402.

If there is a difference between the impedance of the power source 401 and the impedance of the electric power radiation circuit 413, the AC power supplied from the power source 401 is partly reflected in response to the difference in impedance, and the AC power is thus not able to be supplied efficiently to the electric power radiation circuit 413. The matching circuit 412 has a function of substantially matching the impedance of the power source 401 with the impedance of the electric power radiation circuit 413, and efficiently transmitting, to the electric power radiation circuit 413, the AC power supplied from the power source 401.

<Power Receiving Device 450>

The power receiving device 450 illustrated in FIG. 15B includes a power receiving antenna 403, a power receiving circuit 451, a charging control circuit 452, and a charging and discharging control circuit 453. The power receiving device 450 includes a terminal 461, a terminal 462, and a terminal 463. In FIG. 15B, the positive electrode of the secondary battery 300 is electrically connected to the terminal 461, and the negative electrode of the secondary battery 300 is electrically connected to the terminal 462.

The power receiving circuit 451 has a resonance frequency fR determined on the basis of the inductance of the power receiving antenna 403. When the frequency fG of the AC power emitted from the power transmitting antenna 402 is matched with the resonance frequency fR of the power receiving circuit 451, an induced electromotive force is produced in the power receiving antenna 403 and thus, an electric power can be supplied from the power transmitting device 400 to the power receiving device 450.

The power receiving circuit 451 includes a rectifier circuit. The rectifier circuit has a function of converting the AC power induced by the power receiving antenna 403 into DC power.

The charging control circuit 452 has a function of adjusting the DC power supplied from the power receiving circuit 451 to an appropriate voltage. For example, a function of a switching regulator or the like is added to the charging control circuit 452.

Furthermore, an Noff-CPU (normally-off CPU) may be used for the charging control circuit 452. Note that the normally-off CPU is an integrated circuit including a normally-off transistor that is in a non-conduction state (also referred to as an off state) even when a gate voltage is 0 V. The normally-off transistor can be achieved by using an OS transistor. The use of the normally-off CPU enables reduction in the power consumption of the charging control circuit 452 in a standby operation.

The secondary battery 300 can be charged with the AC power induced by the power receiving antenna 403 through the power receiving circuit 451 and the charging control circuit 452. The power receiving device 450 can function as a power source for an external device. Specifically, when the power receiving device 450 is electrically connected to an external device through the terminal 461 and the terminal 463, an electric power of the secondary battery can be supplied to the external device. In addition, an electric power received from the power transmitting device 400 can be supplied to the external device.

The charging and discharging control circuit 453 has a function of monitoring the charging and discharging state of the secondary battery 300. The charging and discharging control circuit 453 includes an overcurrent sensing circuit, a voltage sensing circuit, and the like. For example, when a current larger than or equal to a specified value (also referred to as "overcurrent") flows in supplying an electric power from the secondary battery 300 to an external device, the charging and discharging control circuit 453 can stop supply of the electric power by bringing a transistor 471 into an off state. When a current larger than or equal to a specified value flows in charging the secondary battery 300, the charging and discharging control circuit 453 can stop charging by bringing a transistor 472 into an off state. When a voltage higher than or equal to a specified value (also referred to as "overvoltage") is applied to the secondary battery 300 in charging the secondary battery 300, the charging and discharging control circuit 453 can stop charging by bringing the transistor 472 into an off state.

In this embodiment, the power transmitting antenna 402 illustrated in FIG. 15A and the power receiving antenna 403 illustrated in FIG. 15B are each illustrated as a circuit symbol denoting a coil. Note that the power transmitting antenna 402 and the power receiving antenna 403 are not limited to a coiled antenna and may be changed as appropriate depending on the power transmitting method or the like. For example, the antennas may have a linear shape or plate-like shape. An antenna such as a planar antenna, an aperture antenna, a traveling-wave antenna, an EH antenna, a magnetic-field antenna, or a dielectric antenna may be used.

The voltage sensing circuit 100 of one embodiment of the present invention can be used for the charging and discharging control circuit 453. Moreover, OS transistors can be used as some or all of the transistors included in the wireless power feeding system.

For example, when OS transistors are used as the transistors included in the power receiving device 450, the power receiving device 450 can be provided over a flexible substrate. Thus, the volume and weight of the power receiving device 450 can be reduced. Furthermore, when the power receiving device 450 is provided over a flexible substrate, for example, the power receiving device 450 can be provided along the side surface of the secondary battery 300.

Note that a charging and discharging control circuit, an overcurrent sensing circuit, a voltage sensing circuit, an anomaly sensing circuit, a secondary battery control system, or the like including an OS transistor may be referred to as BTOS (Battery operating system or Battery oxide semiconductor).

An OS transistor has an extremely low off-state current. Thus, the power consumption of the wireless power feeding system can be reduced. The off-state current of the OS transistor hardly increases even in a high temperature environment. Specifically, the off-state current hardly increases even at an environment temperature higher than or equal to room temperature and lower than or equal to 200° C. The OS transistor has high withstand voltage between its source and drain. When OS transistors are used as transistors included in the wireless power feeding system, the wireless power feeding system can operate stably and have high reliability even in a high temperature environment.

This embodiment can be implemented in an appropriate combination with structures described in the other embodiment, example, and the like.

Embodiment 4

In this embodiment, structures of a transistor that can be used in the semiconductor device described in the above embodiments are described. Specifically, a structure in which transistors having different electrical characteristics are stacked is described. With the structure, the degree of freedom in design of the semiconductor device can be increased. Stacking transistors having different electrical characteristics can increase the integration degree of the semiconductor device.

Figure 16:
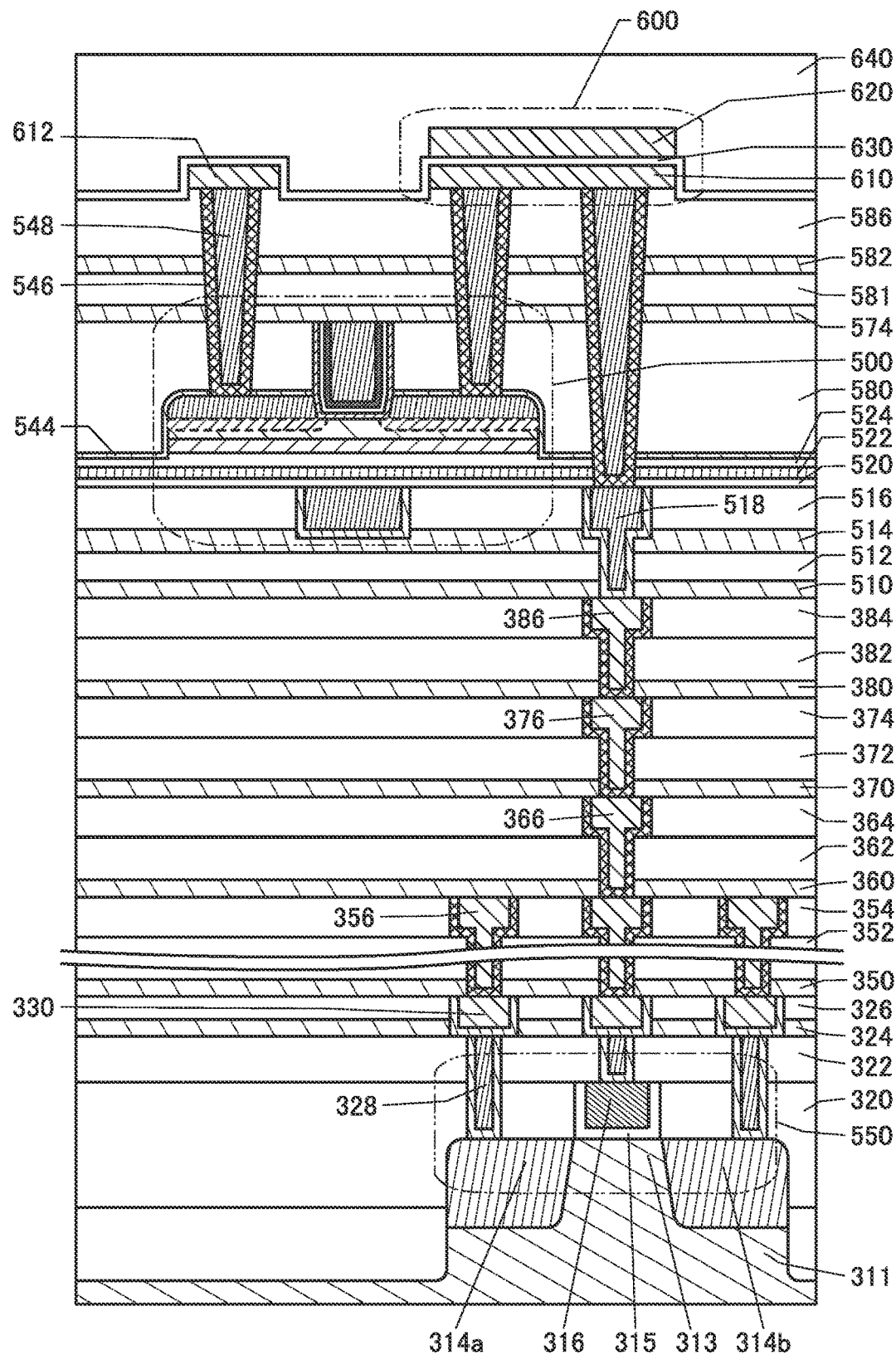
FIG. 16 is a diagram illustrating a structure example of a semiconductor device.
Figure 18A:
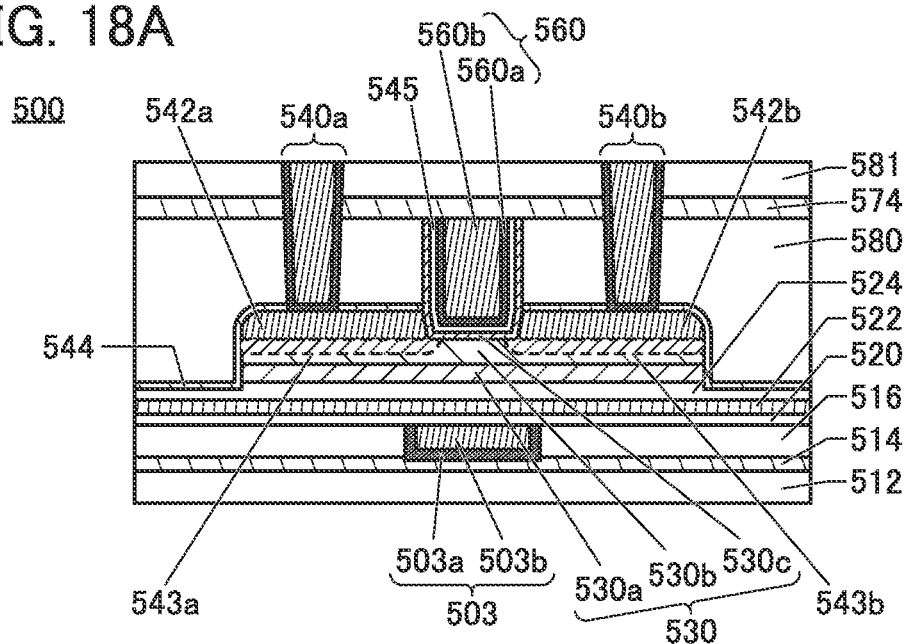
FIG. 18A to FIG. 18C are diagrams illustrating structure examples of transistors.
Figure 18B:
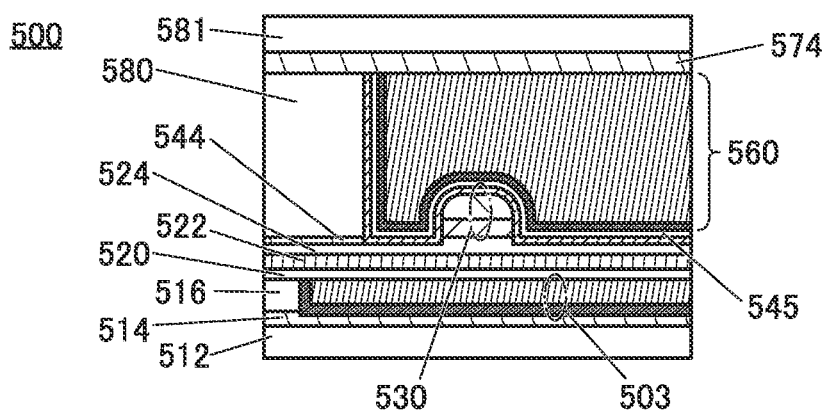
Figure 18C:
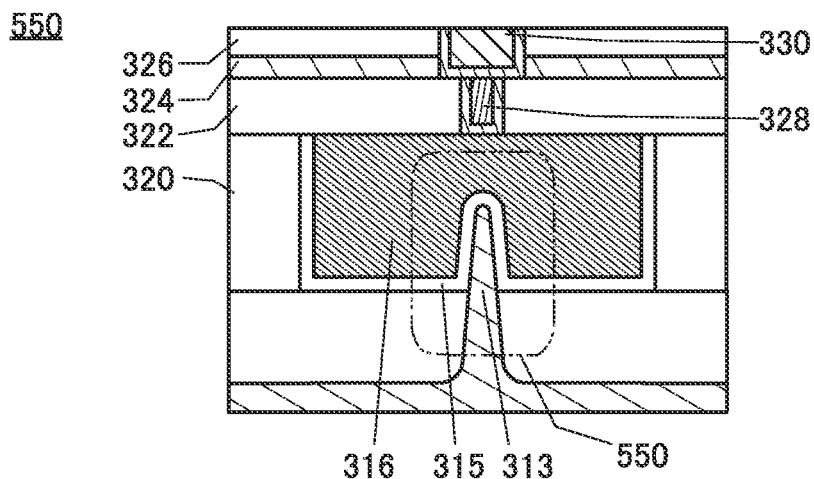

A semiconductor device illustrated in FIG. 16 includes a transistor 550, a transistor 500, and a capacitor 600. FIG. 18A is a cross-sectional view of the transistor 500 in the channel length direction, FIG. 18B is a cross-sectional view of the transistor 500 in the channel width direction, and FIG. 18C is a cross-sectional view of the transistor 550 in the channel width direction.

The transistor 500 is an OS transistor. Since the off-state current of the transistor 500 is extremely low, the use of the transistor 500 as a transistor included in a semiconductor device enables long-term retention of written data voltage or charges. In other words, power consumption of the semiconductor device can be reduced because the semiconductor device has a low frequency of refresh operation or requires no refresh operation.

The semiconductor device described in this embodiment includes the transistor 550, the transistor 500, and the capacitor 600, as illustrated in FIG. 16. The transistor 500 is provided above the transistor 550, and the capacitor 600 is provided above the transistor 550 and the transistor 500.

The transistor 550 is provided over a substrate 311 and includes a conductor 316, an insulator 315, a semiconductor region 313 that is part of the substrate 311, and a low-resistance region 314a and a low-resistance region 314b each functioning as a source region or a drain region. Note that the transistor 550 can be used as the transistor included in the comparator 101 in the above embodiments, for example.

As illustrated in FIG. 18C, in the transistor 550, a top surface and a side surface in the channel width direction of the semiconductor region 313 are covered with the conductor 316 with the insulator 315 therebetween. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 17:
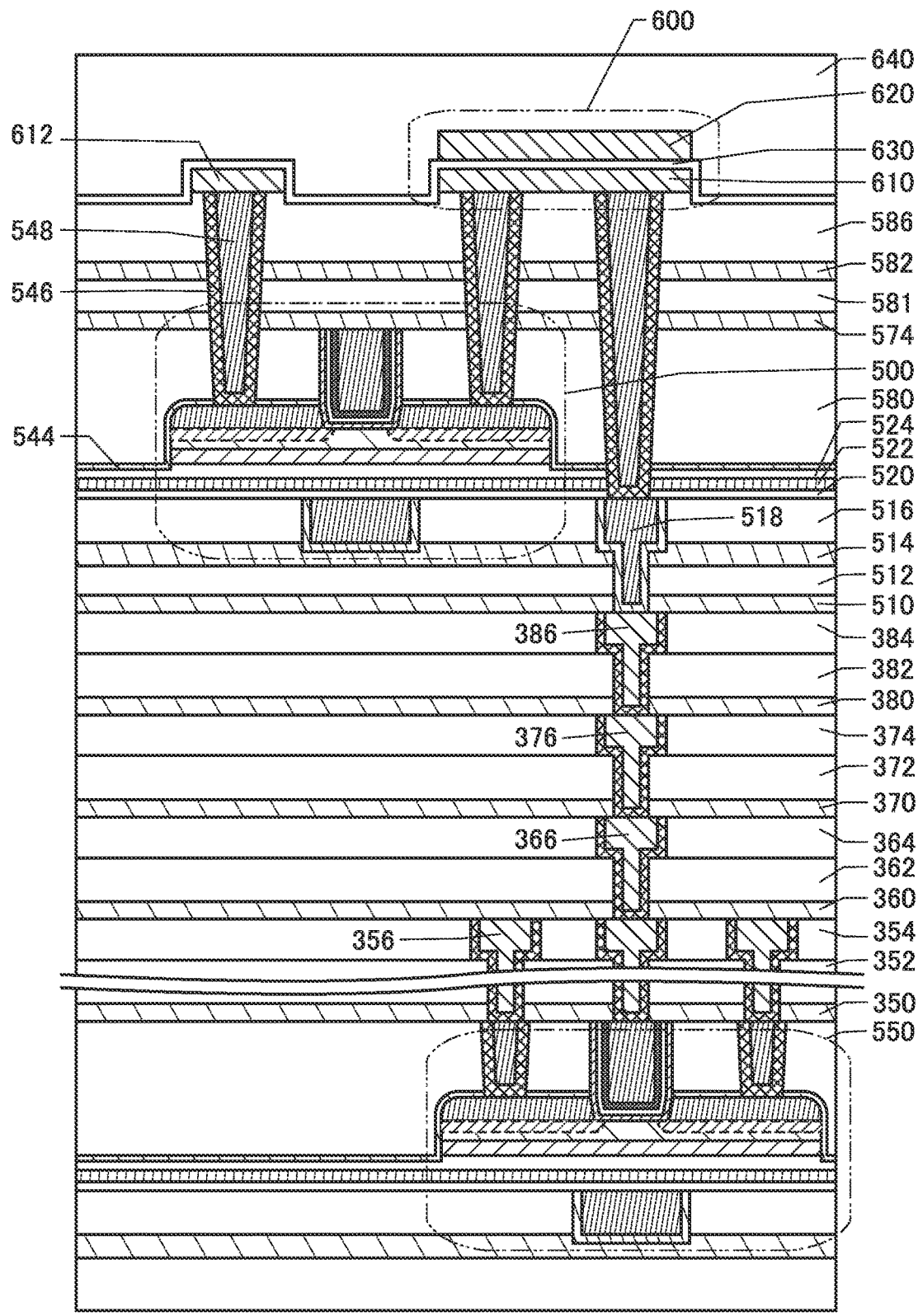
FIG. 17 is a diagram illustrating a structure example of a semiconductor device.

Note that the transistor 550 illustrated in FIG. 16 is an example and the structure is not limited thereto; an appropriate transistor is used in accordance with a circuit structure or a driving method. For example, when the semiconductor device is a single-polarity circuit using only OS transistors (which represent transistors having the same polarity, e.g., only n-channel transistors), the transistor 550 has a structure similar to that of the transistor 500 using an oxide semiconductor, as illustrated in FIG. 17. Note that the details of the transistor 500 are described later.

An insulator 320, an insulator 322, an insulator 324, and an insulator 326 are stacked sequentially to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for planarizing a level difference caused by the transistor 550 or the like provided below the insulator 322. For example, a top surface of the insulator 322 may be planarized by planarization treatment using a chemical mechanical polishing (CMP) method or the like to increase planarity.

In addition, as the insulator 324, it is preferable to use a film having a barrier property that prevents diffusion of hydrogen or impurities from the substrate 311, the transistor 550, or the like into a region where the transistor 500 is provided.

For the film having a barrier property against hydrogen, silicon nitride formed by a CVD method can be used, for example. The diffusion of hydrogen into a semiconductor element including an oxide semiconductor, such as the transistor 500, might result in degradation of the characteristics of the semiconductor element. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and another part of the conductor functions as a plug.

As a material for each of the plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 16, an insulator 350, an insulator 352, and an insulator 354 are stacked sequentially. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that the diffusion of hydrogen from the transistor 550 into the transistor 500 can be inhibited.

Note that for the conductor having a barrier property against hydrogen, tantalum nitride is preferably used, for example. Stacking tantalum nitride and tungsten having high conductivity can inhibit the diffusion of hydrogen from the transistor 550 while the conductivity of a wiring is ensured. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 16, an insulator 360, an insulator 362, and an insulator 364 are stacked sequentially. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that the diffusion of hydrogen from the transistor 550 into the transistor 500 can be inhibited.

A wiring layer may be provided over the insulator 364 and the conductor 366. For example, in FIG. 16, an insulator 370, an insulator 372, and an insulator 374 are stacked sequentially. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that the diffusion of hydrogen from the transistor 550 into the transistor 500 can be inhibited.

A wiring layer may be provided over the insulator 374 and the conductor 376. For example, in FIG. 16, an insulator 380, an insulator 382, and an insulator 384 are stacked sequentially. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that the diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially over the insulator 384. A substance having a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of hydrogen or impurities from the substrate 311, a region where the transistor 550 is provided, or the like into the region where the transistor 500 is provided. Therefore, a material similar to that for the insulator 324 can be used.

For the film having a barrier property against hydrogen, silicon nitride formed by a CVD method can be used, for example. The diffusion of hydrogen into a semiconductor element including an oxide semiconductor, such as the transistor 500, might result in degradation of the characteristics of the semiconductor element. Therefore, a film that inhibits hydrogen diffusion is preferably provided between the transistor 500 and the transistor 550. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used as the insulator 512 and the insulator 516, for example.

Furthermore, a conductor 518, a conductor included in the transistor 500 (a conductor 503, for example), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, the diffusion of hydrogen from the transistor 550 into the transistor 500 can be inhibited.

The transistor 500 is provided above the insulator 516.

As illustrated in FIG. 18A and FIG. 18B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an oxide 530c positioned on a bottom and a side surface of the opening; an insulator 545 positioned on a formation surface of the oxide 530c; and a conductor 560 positioned on a formation surface of the insulator 545.

In addition, as illustrated in FIG. 18A and FIG. 18B, an insulator 544 is preferably positioned between the insulator 580 and the oxide 530a, the oxide 530b, the conductor 542a, and the conductor 542b. Furthermore, as illustrated in FIG. 18A and FIG. 18B, the conductor 560 preferably includes a conductor 560a provided inside the insulator 545 and a conductor 560b provided to be embedded inside the conductor 560a. Moreover, as illustrated in FIG. 18A and FIG. 18B, an insulator 574 is preferably positioned over the insulator 580, the conductor 560, and the insulator 545.

Note that in this specification and the like, the oxide 530a, the oxide 530b, and the oxide 530c are sometimes collectively referred to as an oxide 530.

The transistor 500 has a structure in which three layers of the oxide 530a, the oxide 530b, and the oxide 530c are stacked in the region where the channel is formed and its vicinity; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Although the conductor 560 is shown to have a stacked-layer structure of two layers in the transistor 500, the present invention is not limited thereto. For example, the conductor 560 may have a single-layer structure or a stacked-layer structure of three or more layers. The transistor 500 illustrated in FIG. 16 and FIG. 18A is an example and the structure is not limited thereto; an appropriate transistor is used in accordance with a circuit configuration or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. Furthermore, in this specification and the like, the surrounded channel (S-channel) structure has a feature in that the side surface and the vicinity of the oxide 530 that is in contact with the conductor 542a and the conductor 542b functioning as a source electrode and a drain electrode are of I-type like the channel formation region. Since the side surface and the vicinity of the oxide 530 that is in contact with the conductor 542a and the conductor 542b are in contact with the insulator 544, they can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 has stacked layers of the conductor 503a and the conductor 503b in this embodiment, the conductor 503 may have a single-layer structure.

The insulator 520, the insulator 522, and the insulator 524 have a function of a second gate insulating film.

Here, for the insulator 524 that is in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies ($V_O$) in the oxide 530 can be reduced and the reliability of the transistor 500 can be improved. When hydrogen enters the oxygen vacancies in the oxide 530, such defects (hereinafter, referred to as $V_O H$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor. In one embodiment of the present invention, $V_O H$ in the oxide 530 is preferably reduced as much as possible so that the oxide 530 becomes a highly purified intrinsic or substantially highly purified intrinsic oxide. It is effective to remove impurities such as moisture and hydrogen in an oxide semiconductor (sometimes described as dehydration or dehydrogenation treatment) and to compensate for oxygen vacancies by supplying oxygen to the oxide semiconductor (sometimes described as oxygen adding treatment) in order to obtain an oxide semiconductor whose $V_O H$ is sufficiently reduced. When an oxide semiconductor with sufficiently reduced impurities such as $V_O H$ is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_O H$ is cut occurs, i.e., a reaction of $V_O H \rightarrow ^* V_O + H$ occurs. Part of hydrogen generated at this time is bonded to oxygen to be $H_2 O$, and removed from the oxide 530 or an insulator near the oxide 530 in some cases. In other cases, part of hydrogen is gettered by the conductor 542.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of $V_O+O\rightarrow$null. Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

In addition, in the case where the insulator 524 includes an excess-oxygen region, it is preferable that the insulator 522 have a function of inhibiting diffusion of oxygen (e.g., an oxygen atom, an oxygen molecule, or the like) (or that the above oxygen be less likely to pass through the insulator 522).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material that has a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and a high relative permittivity.

Note that in the transistor 500 in FIG. 18A and FIG. 18B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In that case, without limitation to a stacked-layer structure formed of the same material, a stacked-layer structure formed of different materials may be employed.

In the transistor 500, a metal oxide functioning as an oxide semiconductor is preferably used for the oxide 530 including a channel formation region. For example, for the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. The In-M-Zn oxide that can be used for the oxide 530 is particularly preferably a CAAC-OS (c-axis aligned crystalline oxide semiconductor). Alternatively, a CAC-OS (Cloud-Aligned Composite oxide semiconductor) is preferable. Note that CAAC refers to an example of a crystal structure, and CAC refers to an example of a function or a material composition. Furthermore, for the oxide 530, an In—Ga oxide or an In—Zn oxide may be used.

The CAC-OS is referred to as a CAC-metal oxide in some cases. A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in a channel formation region of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in an on state can achieve high current driving capability, that is, high on-state current and high field-effect mobility.

In other words, the CAC-OS or the CAC-metal oxide can also be referred to as a matrix composite or a metal matrix composite.

Note that metal oxides functioning as oxide semiconductors are classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is unlikely to occur. Furthermore, entry of impurities, formation of defects, or the like might decrease the crystallinity of a metal oxide, which means that the CAAC-OS is a metal oxide including few impurities and defects (e.g., oxygen vacancies). Thus, a metal oxide including a CAAC-OS is physically stable. Therefore, the metal oxide including a CAAC-OS is resistant to heat and highly reliable.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that In—Ga—Zn oxide (also referred to as "IGZO") that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS contains a void or a low-density region. That is, the a-like OS has low crystallinity compared with the nc-OS and the CAAC-OS.

An oxide semiconductor (metal oxide) can have various structures which show different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

Furthermore, a metal oxide with a low carrier concentration is preferably used in the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics.

A defect in which hydrogen has entered an oxygen vacancy can function as a donor of the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1\times10^{18}$ atoms/cm$^3$. When a metal oxide with a sufficiently reduced concentration of impurities such as hydrogen is used for a channel formation region of a transistor, the transistor can have stable electrical characteristics.

When a metal oxide is used for the oxide 530, the carrier density of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, still further preferably lower than $1\times10^{13}$ cm$^{-3}$, still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b, and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure having a MIS structure as its main part.

Note that the above-described layer is not necessarily formed between the conductor 542 and the oxide 530b, but the layer may be formed between the conductor 542 and the oxide 530c, or formed both between the conductor 542 and the oxide 530b and between the conductor 542 and the oxide 530c.

Furthermore, the metal oxide functioning as the channel formation region in the oxide 530 has a band gap of more than or equal to 2 eV, preferably more than or equal to 2.5 eV. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic ratio of the element M to the constituent elements in the metal oxide used for the oxide 530a is preferably higher than the atomic ratio of the element M to the constituent elements in the metal oxide used for the oxide 530b. In addition, the atomic ratio of the element M to In in the metal oxide used for the oxide 530a is preferably higher than the atomic ratio of the element M to In in the metal oxide used for the oxide 530b. Furthermore, the atomic ratio of In to the element M in the metal oxide used for the oxide 530b is preferably higher than the atomic ratio of In to the element M in the metal oxide used for the oxide 530a. Moreover, a metal oxide that can be used for the oxide 530a or the oxide 530b can be used for the oxide 530c.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the densities of defect states in mixed layers formed at an interface between the oxide 530a and the oxide 530b and an interface between the oxide 530b and the oxide 530c are preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal element; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 18, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as illustrated in FIG. 18A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), for the insulator 544. In particular, hafnium aluminate has higher heat resistance than a hafnium oxide film. Therefore, hafnium aluminate is preferable because it is unlikely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the oxide 530c and the insulator 545 can be inhibited. Furthermore, oxidation of the conductor 560 due to excess oxygen contained in the insulator 580 can be inhibited.

The insulator 545 functions as a first gate insulating film. The insulator 545 is preferably positioned in contact with an inner side (a top surface and a side surface) of the oxide 530c. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator that releases oxygen by heating is provided for the insulator 545 in contact with the top surface of the oxide 530c, oxygen can be effectively supplied from the insulator 545 to the channel formation region of the oxide 530b through the oxide 530c. Furthermore, as in the insulator 524, the concentration of impurities such as water or hydrogen in the insulator 545 is preferably reduced. The thickness of the insulator 545 is preferably greater than or equal to 1 nm and less than or equal to 20 nm.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 to the conductor 560. Providing the metal oxide that inhibits diffusion of oxygen inhibits diffusion of excess oxygen from the insulator 545 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative permittivity.

Although the conductor 560 that functions as the first gate electrode and has a two-layer structure is illustrated in FIG. 18A and FIG. 18B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 545. As a conductive material having a function of inhibiting diffusion of oxygen, for example, tantalum, tantalum nitride, ruthenium, ruthenium oxide, or the like is preferably used.

For the conductor 560a, the oxide semiconductor that can be used for the oxide 530 can be used. In that case, when the conductor 560b is deposited by a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used for the conductor 560b. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited by a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used for the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low permittivity is used for these insulators, parasitic capacitance between wirings can be reduced. A silicon oxide film, a silicon oxynitride film, or the like can be used as the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using materials similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

As the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and a SOI (Silicon on Insulator) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, aramid, epoxy, an inorganic vapor deposition film, paper, and the like. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With the use of any of these substrates, a flexible semiconductor device or a highly durable semiconductor device can be manufactured, high heat resistance can be provided, or a reduction in weight or thickness can be achieved.

A semiconductor device is provided over a flexible substrate, whereby even in the case where the secondary battery 300 is curved or bent, the semiconductor device can be provided along the external shape of the secondary battery. In the case where the secondary battery 300 is cylindrical, for example, the semiconductor device can be provided to be wound around a side surface of the secondary battery.

Modification Example 1 of Transistor

Figure 19A:
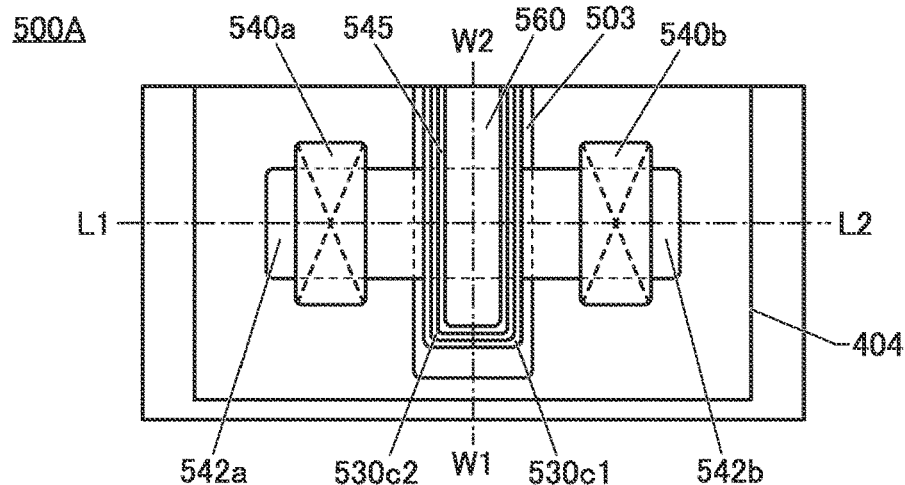
FIG. 19A to FIG. 19C are diagrams illustrating a structure example of a transistor.
Figure 19B:
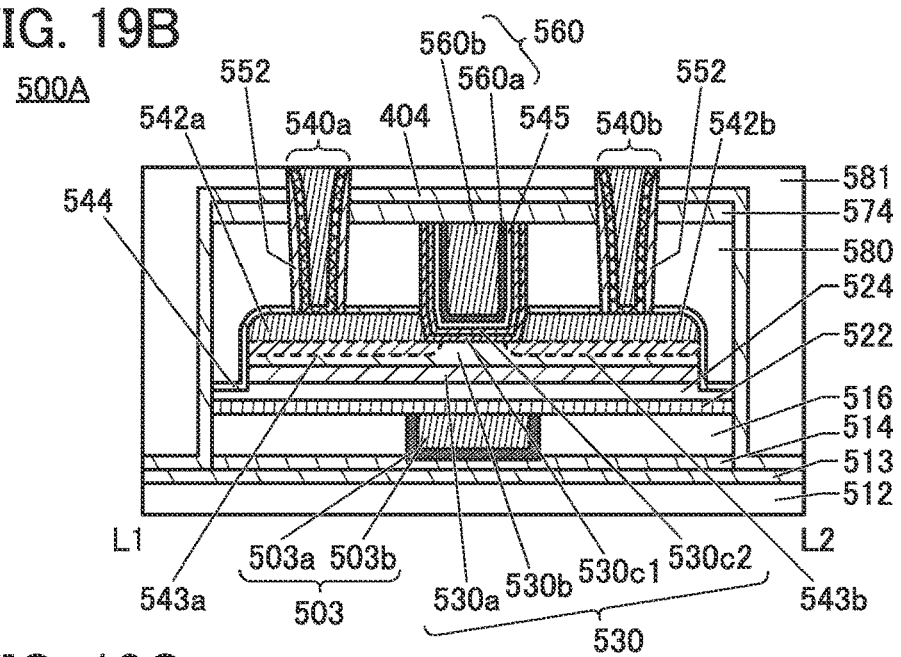
Figure 19C:
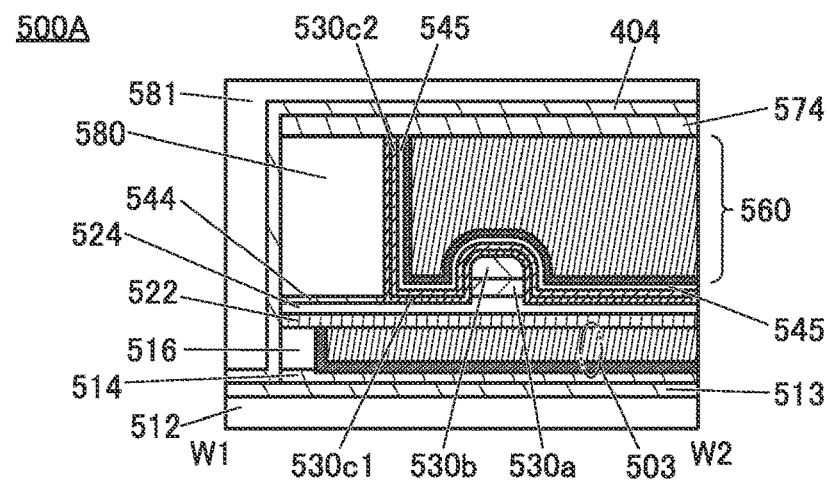

A transistor 500A illustrated in FIG. 19A and FIG. 19B is a modification example of the transistor 500 having the structure illustrated in FIG. 18A and FIG. 18B. FIG. 19A is a cross-sectional view of the transistor 500A in the channel length direction, and FIG. 19B is a cross-sectional view of the transistor 500A in the channel width direction. Note that the structure illustrated in FIG. 19A and FIG. 19B can also be employed for other transistors, such as the transistor 550, included in the semiconductor device of one embodiment of the present invention.

The transistor 500A having the structure illustrated in FIG. 19A and FIG. 19B is different from the transistor 500 having the structure illustrated in FIG. 18A and FIG. 18B in including an insulator 552, an insulator 513, and an insulator 404 and including the oxide 530c having a stack of an oxide 530c1 and an oxide 530c2. Furthermore, the transistor 500A having the structure illustrated in FIG. 19A and FIG. 19B is different from the transistor 500 having the structure illustrated in FIG. 18A and FIG. 18B in that the insulator 552 is provided in contact with a side surface of the conductor 540a and a side surface of the conductor 540b. Moreover, the transistor 500A having the structure illustrated in FIG. 19A and FIG. 19B is different from the transistor 500 having the structure illustrated in FIG. 18A and FIG. 18B in that the insulator 520 is not included.

In the transistor 500 having the structure illustrated in FIG. 19A and FIG. 19B, the insulator 513 is provided over the insulator 512. The insulator 404 is provided over the insulator 574 and the insulator 513.

In the transistor 500 having the structure illustrated in FIG. 19A and FIG. 19B, the insulator 514, the insulator 516, the insulator 522, the insulator 524, the insulator 544, the insulator 580, and the insulator 574 are patterned and covered with the insulator 404. That is, the insulator 404 is in contact with the top surface of the insulator 574, the side surface of the insulator 574, the side surface of the insulator 580, the side surface of the insulator 544, the side surface of the insulator 524, the side surface of the insulator 522, the side surface of the insulator 516, the side surface of the insulator 514, and the top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, as the insulator 513 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, as the insulator 552, an insulator such as silicon nitride, aluminum oxide, or silicon nitride oxide that is a material having a high hydrogen barrier property is preferably used. In particular, silicon nitride is suitably used for the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

The oxide 530c1 is in contact with the top surface of the insulator 524, the side surface of the oxide 530a, the top surface and the side surface of the oxide 530b, the side surfaces of the conductor 542a and the conductor 542b, the side surface of the insulator 544, and the side surface of the insulator 580 (see FIG. 19B). The oxide 530c2 is in contact with the insulator 545.

An In—Zn oxide can be used for the oxide 530c1, for example. For the oxide 530c2, it is possible to use a material similar to a material used for the oxide 530c when the oxide 530c has a single-layer structure. For the oxide 530c2, a metal oxide with In:Ga:Zn=1:3:4 [atomic ratio], Ga:Zn=2:1 [atomic ratio], or Ga:Zn=2:5 [atomic ratio] can be used, for example.

When the oxide 530c has a two-layer structure of the oxide 530c1 and the oxide 530c2, the on-state current of the transistor can be increased as compared with the case where the oxide 530c has a single-layer structure. Thus, a transistor can be a power MOS transistor, for example.

Modification Example 2 of Transistor

Figure 20A:
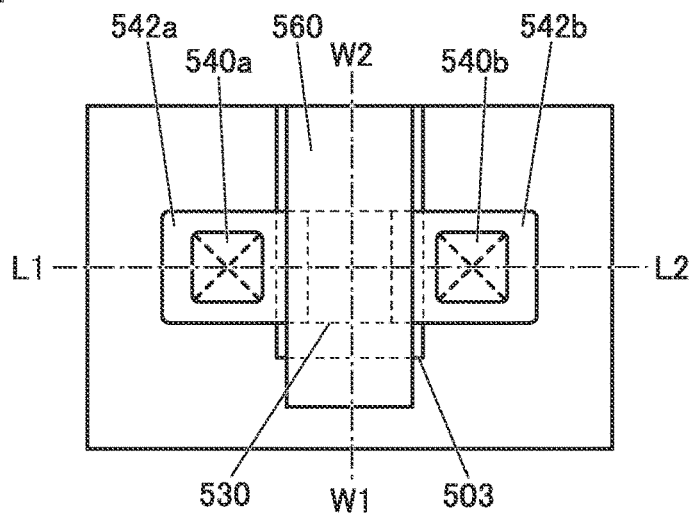
FIG. 20A to FIG. 20C are diagrams illustrating a structure example of a transistor.
Figure 20B:
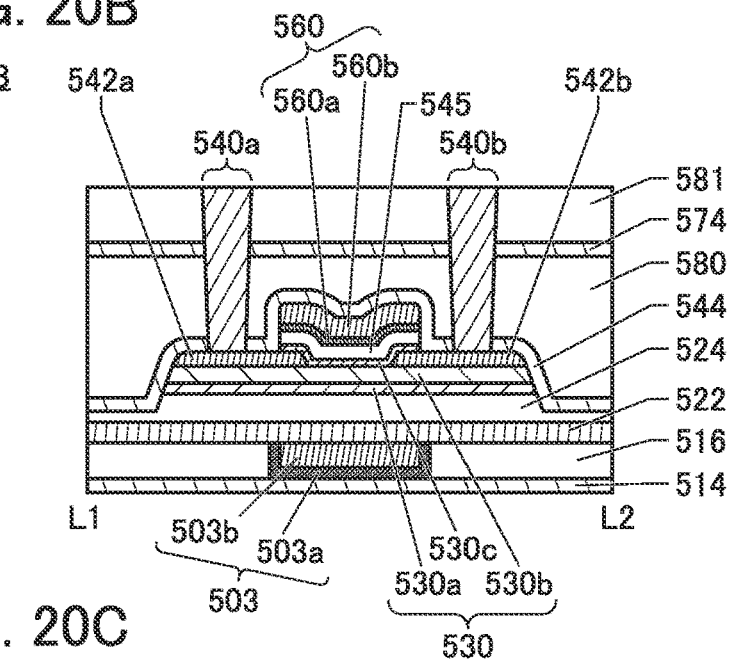
Figure 20C:
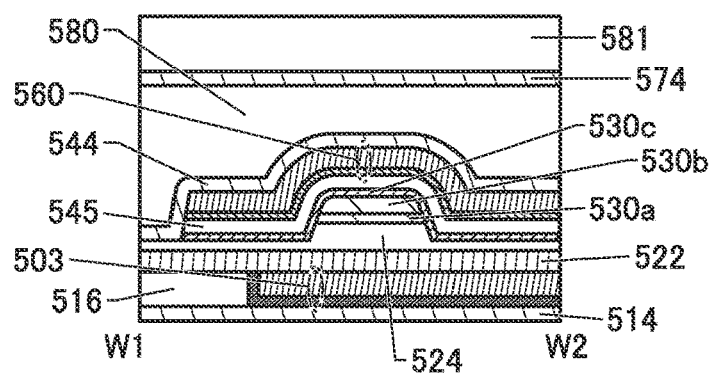

A structure example of a transistor 500B is described with reference to FIG. 20A, FIG. 20B, and FIG. 20C. FIG. 20A is a top view of the transistor 500B. FIG. 20B is a cross-sectional view of a portion along the dashed-dotted line L1-L2 in FIG. 20A. FIG. 20C is a cross-sectional view of a portion along the dashed-dotted line W1-W2 in FIG. 20A. Note that for clarity of the drawing, some components are not illustrated in the top view of FIG. 20A.

The transistor 500B is a modification example of the transistor 500 and can be replaced with the transistor 500. Therefore, differences from the transistor 500 are mainly described to avoid repeated description.

The conductor 560 functioning as a first gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 544 is preferably provided to cover the top surface and the side surface of the conductor 560, a side surface of the insulator 545, and a side surface of the oxide 530c. For the insulator 544, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide, silicon nitride oxide, silicon nitride, or the like.

The insulator 544 can inhibit oxidation of the conductor 560. Moreover, the insulator 544 can inhibit diffusion of impurities such as water and hydrogen contained in the insulator 580 into the transistor 500B.

The transistor 500B has the conductor 560 overlapping part of the conductor 542a and part of the conductor 542b, and thus tends to have larger parasitic capacitance than the transistor 500. Consequently, the transistor 500B tends to have a lower operating frequency than the transistor 500. However, the transistor 500B does not require steps of providing an opening in the insulator 580 and the like and embedding the conductor 560, the insulator 545, and the like in the opening; hence, the productivity of the transistor 500B is higher than that of the transistor 500.

This embodiment can be implemented in an appropriate combination with structures described in the other embodiments, examples, and the like.

Embodiment 5

In this embodiment, structure examples of a battery which can be used as the secondary battery 300 are described with reference to drawings. Although a lithium-ion secondary battery is described as an example in this embodiment, a battery that can be used as the secondary battery 300 is not limited to a lithium-ion secondary battery.

<Cylindrical Secondary Battery>

Figure 21A:
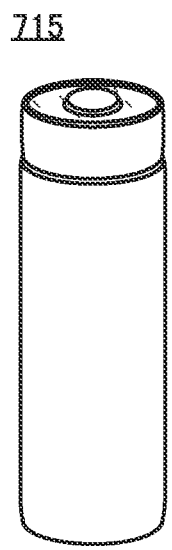
FIG. 21A to FIG. 21C are diagrams illustrating structure examples of a secondary battery.
Figure 21B:
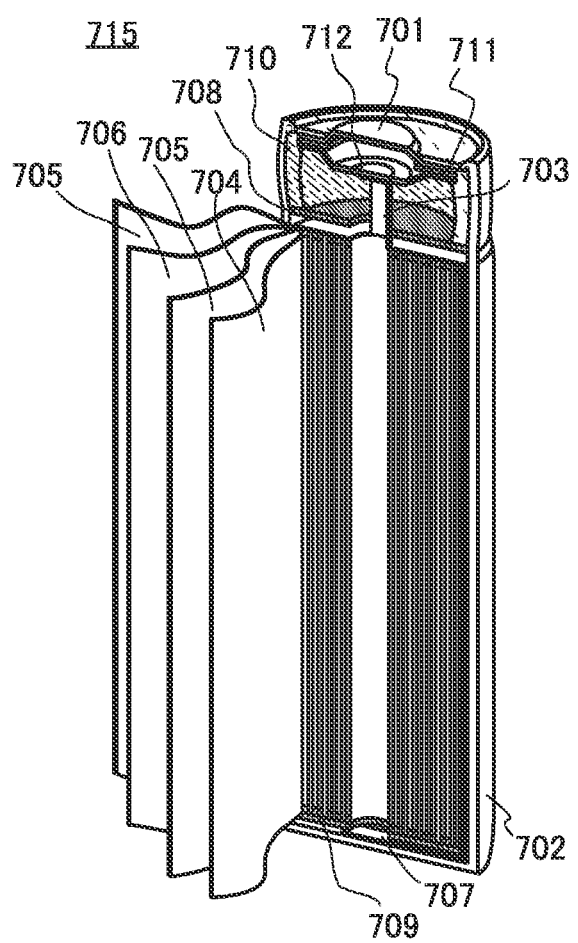

FIG. 21A is an external view of a cylindrical secondary battery 715. FIG. 21B is a schematic cross-sectional view of the cylindrical secondary battery 715. Inside a battery can 702 having a hollow cylindrical shape, a battery element in which a strip-like positive electrode 704 and a strip-like negative electrode 706 are wound with a separator 705 interposed therebetween is provided. Although not illustrated, the battery element is wound around a center pin. One end of the battery can 702 is close and the other end thereof is open. For the battery can 702, a metal having corrosion resistance to an electrolyte solution, such as nickel, aluminum, or titanium, an alloy of such a metal, or an alloy of such a metal and another metal (e.g., stainless steel or the like) can be used. The battery can 702 is preferably covered with nickel, aluminum, or the like to prevent corrosion due to an electrolyte solution. Inside the battery can 702, the battery element in which the positive electrode, the negative electrode, and the separator are wound is interposed between a pair of insulating plate 708 and insulating plate 709 which face each other. Furthermore, a non-aqueous electrolyte solution (not illustrated) is injected inside the battery can 702 in which the battery element is provided. The secondary battery is composed of a positive electrode containing an active material such as lithium cobalt oxide ($LiCoO_2$) or lithium iron phosphate ($LiFePO_4$), a negative electrode composed of a carbon material such as graphite capable of occluding and releasing lithium ions, a nonaqueous electrolyte solution in which an electrolyte composed of a lithium salt such as $LiBF_4$ or $LiPF_6$ is dissolved in an organic solvent such as ethylene carbonate or diethyl carbonate, and the like.

Since the positive electrode and the negative electrode of the cylindrical secondary battery are wound, active materials are preferably formed on both sides of current collectors. A positive electrode terminal (positive electrode current collecting lead) 703 is connected to the positive electrode 704, and a negative electrode terminal (negative electrode current collecting lead) 707 is connected to the negative electrode 706. A metal material such as aluminum can be used for both the positive electrode terminal 703 and the negative electrode terminal 707. The positive electrode terminal 703 and the negative electrode terminal 707 are resistance-welded to a safety valve mechanism 712 and the bottom of the battery can 702, respectively. The safety valve mechanism 712 is electrically connected to a positive electrode cap 701 through a PTC element (Positive Temperature Coefficient) 711. The safety valve mechanism 712 cuts off electrical connection between the positive electrode cap 701 and the positive electrode 704 when an increase in the internal pressure of the battery exceeds a predetermined threshold value. Furthermore, the PTC element 711 is a heat sensitive resistor whose resistance increases when temperature rises, and controls the amount of current by increase in resistance to prevent unusual heat generation. Barium titanate ($BaTiO_3$)-based semiconductor ceramic or the like can be used for the PTC element.

A lithium-ion secondary battery using an electrolyte solution includes a positive electrode, a negative electrode, a separator, an electrolyte solution, and an exterior body. Note that in a lithium-ion secondary battery, the anode and the cathode are interchanged in charging and discharging, and the oxidation reaction and the reduction reaction are interchanged; thus, an electrode with a high reaction potential is called the positive electrode and an electrode with a low reaction potential is called the negative electrode. For this reason, in this specification, the positive electrode is referred to as a "positive electrode" or a "plus electrode" and the negative electrode is referred to as a "negative electrode" or a "minus electrode" in all the cases where charging is performed, discharging is performed, a reverse bias is supplied, and a charging current is supplied. The use of terms such as anode (positive electrode) and cathode (negative electrode) related to oxidation reaction and reduction reaction might cause confusion because the anode and the cathode are reversed in charging and in discharging. Thus, the terms anode and cathode are not used in this specification. If the term the "anode" or the "cathode" is used, it should be clearly mentioned that the anode or the cathode is which of the one at the time of charging or the one at the time of discharging and corresponds to which of a positive electrode (plus electrode) or a negative electrode (minus electrode).

In this embodiment, an example of a lithium-ion secondary battery is shown; however, it is not limited to a lithium-ion secondary battery and a material including an element A, an element X, and oxygen can be used as a positive electrode material for the secondary battery. The element A is preferably one or more selected from the Group 1 elements and the Group 2 elements. As a Group 1 element, for example, an alkali metal such as lithium, sodium, or potassium can be used. As a Group 2 element, for example, calcium, beryllium, magnesium, or the like can be used. As the element X, for example, one or more selected from metal elements, silicon, and phosphorus can be used. The element X is preferably one or more selected from cobalt, nickel, manganese, iron, and vanadium. Typical examples include lithium-cobalt composite oxide ($LiCoO_2$) and lithium iron phosphate ($LiFePO_4$).

The negative electrode includes a negative electrode active material layer and a negative electrode current collector. In addition, the negative electrode active material layer may contain a conductive additive and a binder.

For the negative electrode active material, an element that enables charging and discharging reactions by an alloying reaction and a dealloying reaction with lithium can be used. For example, a material containing at least one of silicon, tin, gallium, aluminum, germanium, lead, antimony, bismuth, silver, zinc, cadmium, indium, and the like can be used. Such elements have higher capacity than carbon, and silicon in particular has a high theoretical capacity of 4700 mAh/g.

In addition, the secondary battery preferably includes a separator. As the separator, for example, a fiber containing cellulose such as paper; nonwoven fabric; a glass fiber; ceramics; a synthetic fiber using nylon (polyamide), vinylon (polyvinyl alcohol-based fiber), polyester, acrylic, polyolefin, or polyurethane; or the like can be used.

Figure 21C:
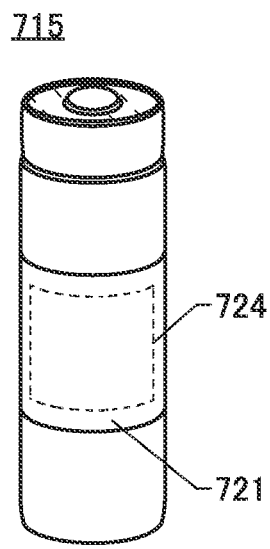

FIG. 21C illustrates a state in which a power receiving device 724 formed over or fixed onto a flexible substrate 721 is provided along the side surface of the secondary battery 715. As the power receiving device 724, the power receiving device 450 described in the above embodiment can be used, for example. When the power receiving device 724 is provided over the flexible substrate 721, the power receiving device 724 can be provided along the curved surface of the cylindrical secondary battery 715. Accordingly, the space occupied by the power receiving device 724 can be reduced. Thus, a reduction in size of an electronic device or the like including the secondary battery 715 and the power receiving device 724 can be achieved.

[Flat Secondary Battery]

Next, an internal structure example of a flat secondary battery 913 is described.

Figure 22A:
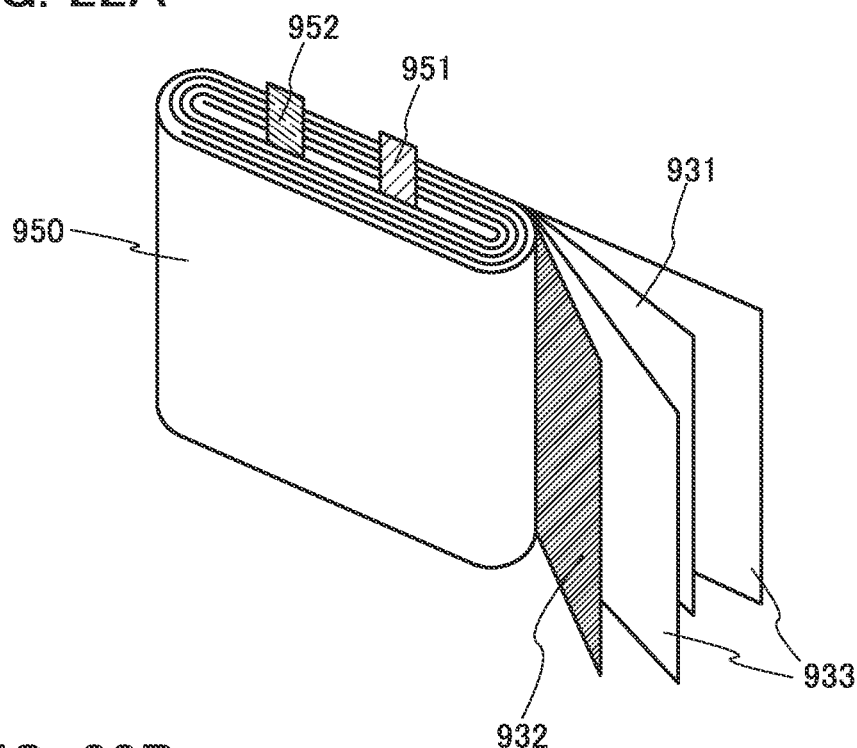
FIG. 22A and FIG. 22B are diagrams illustrating structure examples of a wound body and a secondary battery.

FIG. 22A illustrates a structure of a wound body 950 provided in the secondary battery 913. The wound body 950 includes a negative electrode 931, a positive electrode 932, and separators 933. The wound body 950 is a wound body where the negative electrode 931 is stacked to overlap with the positive electrode 932 with the separator 933 sandwiched therebetween and the sheet of the stack is wound. Note that a plurality of stacks of the negative electrode 931, the positive electrode 932, and the separator 933 may be superimposed.

The negative electrode 931 is electrically connected to one of a terminal 951 and a terminal 952, and the positive electrode 932 is electrically connected to the other of the terminal 951 and the terminal 952.

Figure 22B:
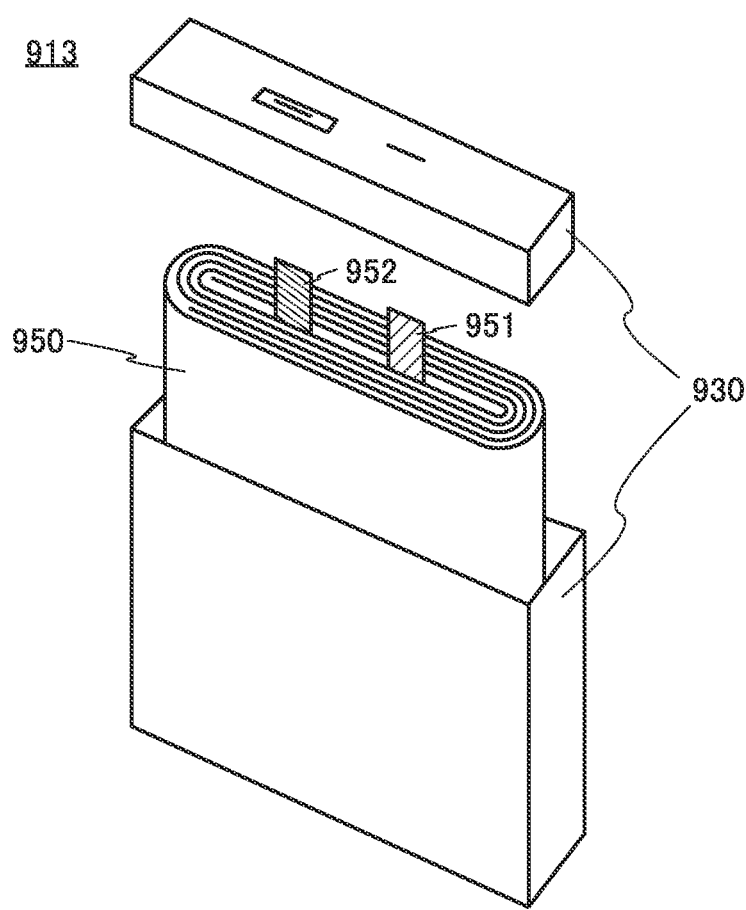

In FIG. 22B, the secondary battery 913 includes the wound body 950 provided with the terminal 951 and the terminal 952 inside a housing 930 (also referred to as an "exterior body"). The wound body 950 is immersed in an electrolyte solution inside the housing 930. The terminal 952 is in contact with the housing 930. The use of an insulator or the like prevents contact between the terminal 951 and the housing 930. Note that in FIG. 22B, the housing 930 divided into pieces is illustrated; however, in the actual structure, the wound body 950 is covered with the housing 930 and the terminal 951 and the terminal 952 extend to the outside of the housing 930. For the housing 930, a metal material (e.g., aluminum or the like) or a resin material can be used.

For the housing 930, an insulating material such as a metal material or an organic resin can be used. The housing 930 is sometimes formed using a film, in which case the film is sometimes provided with a charging control circuit formed over a flexible substrate.

[Battery Pack]

Figure 23A:
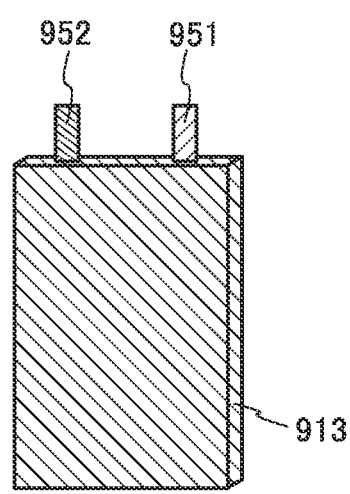
FIG. 23A to FIG. 23C are diagrams illustrating a structure example of a battery pack.

Next, a battery pack 901 including the flat secondary battery 913 is described. FIG. 23A is an external view of the secondary battery 913. The secondary battery 913 includes the terminal 951 and the terminal 952. The terminal 951 is electrically connected to the positive electrode inside the secondary battery 913, and the terminal 952 is electrically connected to the negative electrode inside the secondary battery 913.

Figure 23B:
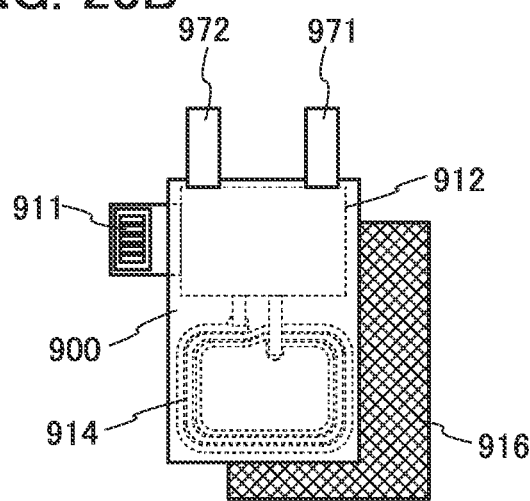

FIG. 23B is an external view of a power receiving device 900 and a layer 916. The power receiving device 900 includes a circuit 912 and an antenna 914, and is provided over a flexible substrate. The antenna 914 is electrically connected to the circuit 912. A terminal 971 and a terminal 972 are electrically connected to the circuit 912. The circuit 912 is electrically connected to a terminal 911.

The secondary battery 913, the power receiving device 900, the terminal 951, the terminal 952, and the terminal 911 function together as a battery pack.

The power receiving device 900 corresponds to the power receiving device 450 described in the above embodiment, for example. The circuit 912 includes the power receiving circuit 451, the charging control circuit 452, the charging and discharging control circuit 453, and the like. The antenna 914 corresponds to the power receiving antenna 403 described in the above embodiment.

The shape of the antenna is not limited to a coil shape and may be a linear shape or a plate shape, for example. An antenna such as a planar antenna, an aperture antenna, a traveling-wave antenna, an EH antenna, a magnetic-field antenna, or a dielectric antenna may be used.

The terminal 911 is connected to a device supplied with an electric power of the secondary battery, for example. For example, the terminal 911 is connected to a display device, a sensor, or the like.

The layer 916 illustrated in FIG. 23B has a function of blocking an electromagnetic field from the secondary battery 913, for example. For the layer 916, for example, a magnetic body can be used.

Figure 23C:
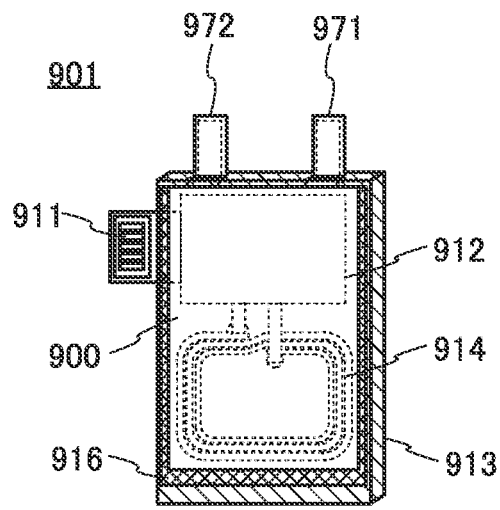

FIG. 23C illustrates a battery pack in which the power receiving device 900 is positioned over the secondary battery 913. The terminal 971 is electrically connected to the terminal 951, and the terminal 972 is electrically connected to the terminal 952. The layer 916 is positioned between the power receiving device 900 and the secondary battery 913.

The power receiving device 900 is preferably provided over a flexible substrate. The use of the flexible substrate enables the power receiving device 900 to be thin. In addition, as illustrated in FIG. 24D, which is described later, the power receiving device 900 can be wrapped around the secondary battery.

Figure 24A:
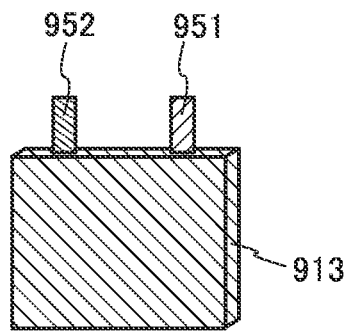
FIG. 24A to FIG. 24D are diagrams illustrating a structure example of a battery pack.
Figure 24B:
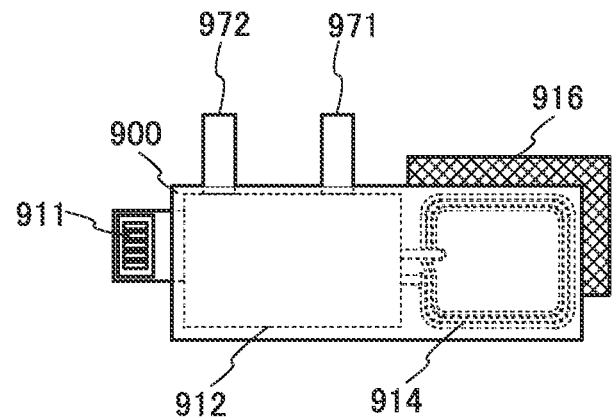

Next, as another structure example of the battery pack 901, a battery pack 901A is described with reference to FIG. 24A to FIG. 24D. FIG. 24A is an external view of the secondary battery 913. Like the power receiving device 900 illustrated in FIG. 23B, the power receiving device 900 illustrated in FIG. 24B includes the circuit 912 and the antenna 914. In addition, the layer 916 is also illustrated in FIG. 24B.

Figure 24C:
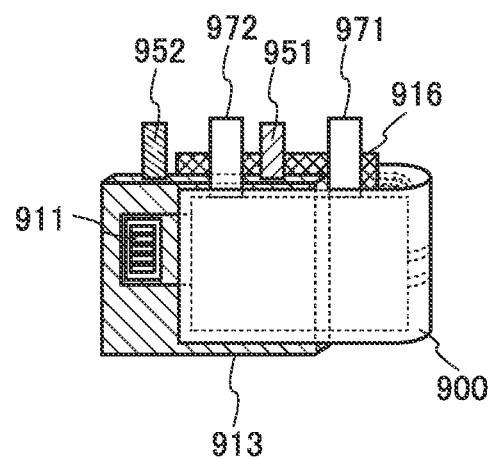
Figure 24D:
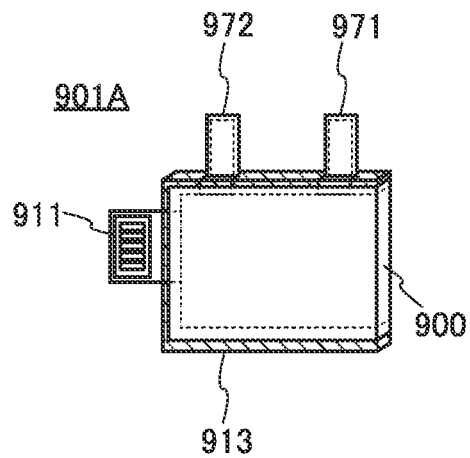

When the power receiving device 900 provided over a flexible substrate is bent in accordance with the shape of the secondary battery 913 and is provided around the secondary battery as illustrated in FIG. 24C, the power receiving device 900 can be wrapped around the secondary battery as illustrated in FIG. 24D.

Next, as another structure example of the battery pack 901, a battery pack 901B is described with reference to FIG. 25A to FIG. 25D. The secondary battery 913 illustrated in FIG. 25A has an L shape when seen from one side.

Figure 25A:
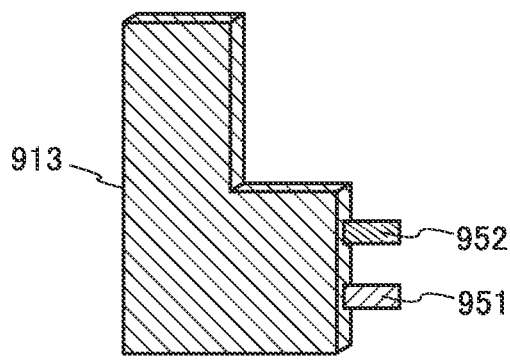
FIG. 25A to FIG. 25D are diagrams illustrating a structure example of a battery pack.
Figure 25B:
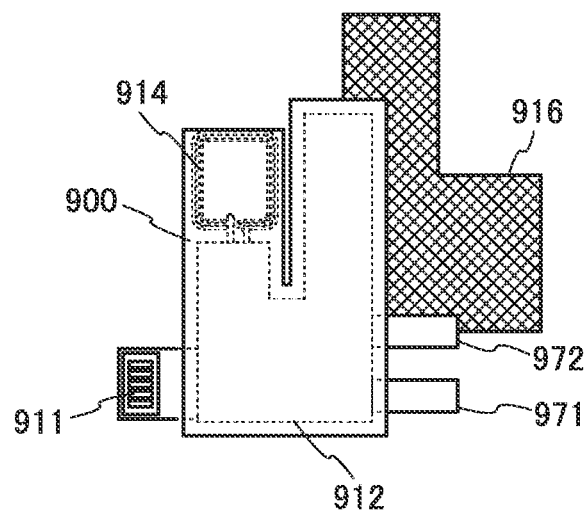

FIG. 25B illustrates an example in which the flexible substrate provided with the power receiving device 900 includes a notch portion. The notch portion is also referred to as a slit in some cases. The layer 916 illustrated in FIG. 25B has an L shape like the secondary battery 913 illustrated in FIG. 25A.

Figure 25C:
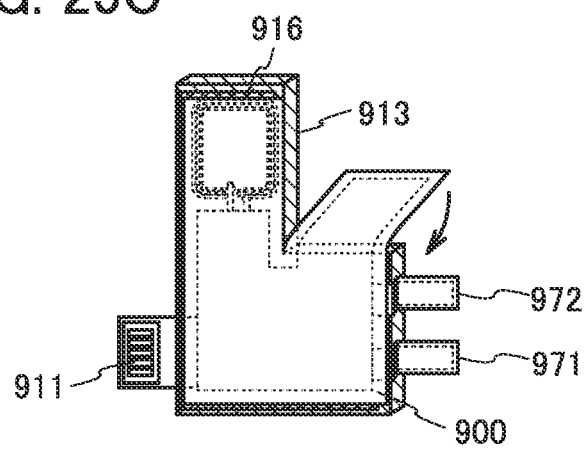
Figure 25D:
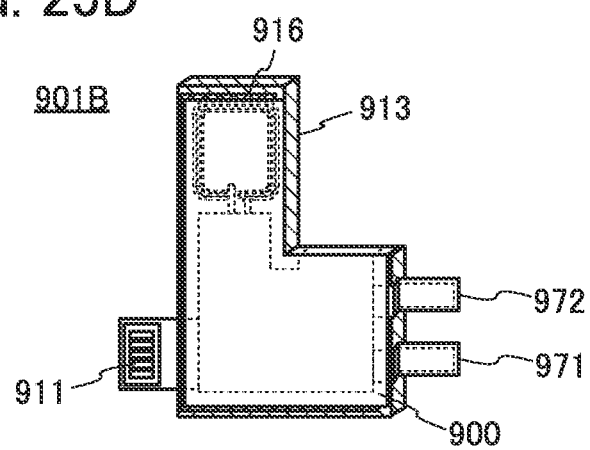

As illustrated in FIG. 25C and FIG. 25D, when the flexible substrate includes the notch portion, part of the power receiving device 900 (a region on the right side of the notch portion) can be wrapped around the back side of the L-shaped secondary battery 913. Note that FIG. 25C is a diagram illustrating a state in which the part of the power receiving device 900 is being wrapped around the L-shaped secondary battery 913, and FIG. 25D is a diagram illustrating a state after wrapping.

When the power receiving device 900 is provided over the flexible substrate, the power receiving device 900 can be provided in accordance with the shape of the secondary battery 913. Thus, the space occupied by the power receiving device 900 can be reduced. Accordingly, the size of the battery pack can be reduced. In addition, the weight of the battery pack can be reduced. The size of an electronic device or the like including the battery pack of one embodiment of the present invention can be reduced. The weight of an electronic device or the like including the battery pack of one embodiment of the present invention can be reduced.

This embodiment can be implemented in an appropriate combination with structures described in the other embodiments, examples, and the like.

Embodiment 6

In this embodiment, a positive electrode active material of one embodiment of the present invention is described.

In this specification and the like, segregation refers to a phenomenon in which in a solid made of a plurality of elements (e.g., A, B, and C), a certain element (e.g., B) is spatially non-uniformly distributed.

In this specification and the like, a surface portion of a particle of an active material or the like refers to a region from a surface to a depth of approximately 10 nm. A plane generated by a crack may also be referred to as a surface. In addition, a region positioned deeper than the surface portion is referred to as an inner portion.

In this specification and the like, a layered rock-salt crystal structure of a composite oxide containing lithium and a transition metal refers to a crystal structure in which a rock-salt ion arrangement where cations and anions are alternately arranged is included and the transition metal and lithium are regularly arranged to form a two-dimensional plane, so that lithium can be two-dimensionally diffused. Note that a defect such as a cation or anion vacancy may exist. Moreover, in the layered rock-salt crystal structure, strictly, a lattice of a rock-salt crystal is distorted in some cases.

In addition, in this specification and the like, a rock-salt crystal structure refers to a structure in which cations and anions are alternately arranged. Note that a cation or anion vacancy may exist.

In addition, in this specification and the like, a pseudo-spinel crystal structure of a composite oxide containing lithium and a transition metal refers to a crystal structure that belongs to a space group R-3m and that is not the spinel crystal structure but a structure in which an ion of cobalt, magnesium, or the like is coordinated to six oxygen atoms and the cation arrangement has symmetry similar to that of the spinel crystal structure. Note that in the pseudo-spinel crystal structure, a light element such as lithium is coordinated to four oxygen atoms in some cases. Also in that case, the ion arrangement has symmetry similar to that of the spinel crystal structure.

The pseudo-spinel crystal structure can also be regarded as a crystal structure that contains Li between layers at random but is similar to a $CdCl_2$ type crystal structure. The crystal structure similar to the $CdCl_2$ type crystal structure is close to a crystal structure of lithium nickel oxide when charged up to a charge depth of 0.94 ($Li_{0.06}NiO_2$); however, pure lithium cobalt oxide or a layered rock-salt positive electrode active material containing a large amount of cobalt is known not to have this crystal structure generally.

Anions of a layered rock-salt crystal and anions of a rock-salt crystal have cubic closest packed structures (face-centered cubic lattice structures). Anions of a pseudo-spinel crystal are also presumed to have cubic closest packed structures. When the pseudo-spinel crystal is in contact with the layered rock-salt crystal and the rock-salt crystal, there is a crystal plane at which orientations of cubic closest packed structures composed of anions are aligned. Note that a space group of the layered rock-salt crystal and the pseudo-spinel crystal is R-3m, which is different from a space group Fm-3m of a rock-salt crystal (a space group of a general rock-salt crystal) and a space group Fd-3m of a rock-salt crystal (a space group of a rock-salt crystal having the simplest symmetry); thus, the Miller index of the crystal plane satisfying the above conditions in the layered rock-salt crystal and the pseudo-spinel crystal is different from that in the rock-salt crystal. In this specification, a state where the orientations of the cubic closest packed structures composed of anions in the layered rock-salt crystal, the pseudo-spinel crystal, and the rock-salt crystal are aligned is referred to as a state where crystal orientations are substantially aligned in some cases.

A secondary battery includes a positive electrode and a negative electrode, for example. A positive electrode active material is a material included in the positive electrode. The positive electrode active material is a substance that performs a reaction contributing to the charge and discharge capacity, for example. Note that the positive electrode active material may partly contain a substance that does not contribute to the charge and discharge capacity.

In this specification and the like, the positive electrode active material of one embodiment of the present invention is expressed as a positive electrode material, a secondary battery positive electrode material, or the like in some cases. In this specification and the like, the positive electrode active material of one embodiment of the present invention preferably contains a compound. In this specification and the like, the positive electrode active material of one embodiment of the present invention preferably contains a composition. In this specification and the like, the positive electrode active material of one embodiment of the present invention preferably contains a composite.

<Positive Electrode Active Material>

With the use of the positive electrode active material of one embodiment of the present invention, the capacity of a secondary battery can be increased and discharge capacity reduction due to charging and discharging cycles can be inhibited.

[Structure of Positive Electrode Active Material]

The positive electrode active material preferably contains a metal (hereinafter, an element A) serving as a carrier ion. As the element A, an alkali metal such as lithium, sodium, or potassium or a Group 2 element such as calcium, beryllium, or magnesium can be used, for example.

In the positive electrode active material, carrier ions are released from the positive electrode active material in charging. A larger amount of the released element A means a larger amount of ions contributing to the capacity of a secondary battery, increasing the capacity. However, a large amount of the released element A easily causes collapse of the crystal structure of a compound contained in the positive electrode active material. The collapse of the crystal structure of the positive electrode active material sometimes causes a decrease in the discharge capacity due to charging and discharging cycles. When the positive electrode active material of one embodiment of the present invention contains an element X, the collapse of the crystal structure when carrier ions are released in charging the secondary battery can be inhibited in some cases. For example, some of the element X atoms substitute at positions of the element A atoms. An element such as magnesium, calcium, zirconium, lanthanum, or barium can be used as the element X. For another example, an element such as copper, potassium, sodium, or zinc can be used as the element X. Two or more of the elements described above may be combined and used as the element X.

Furthermore, the positive electrode active material of one embodiment of the present invention preferably contains halogen in addition to the element X. Halogen such as fluorine or chlorine is preferably contained. When the positive electrode active material of one embodiment of the present invention contains the halogen, substitution of the element X at the element A position is promoted in some cases.

The positive electrode active material of one embodiment of the present invention contains a metal (hereinafter, an element M) whose valence number changes due to charging and discharging of a secondary battery. The element M is a transition metal, for example. The positive electrode active material of one embodiment of the present invention contains one or more of cobalt, nickel, and manganese, particularly cobalt, as the element M, for example. The positive electrode active material may contain, at an element M position, an element that have no valence number change and can have the same valence number as the element M, such as aluminum, specifically, a trivalent representative element, for example. The element X may be substituted at the element M position, for example. In the case where the positive electrode active material of one embodiment of the present invention is an oxide, the element X may be substituted at an oxygen position.

A lithium composite oxide having a layered rock-salt crystal structure is preferably used as the positive electrode active material of one embodiment of the present invention, for example. More specifically, lithium cobalt oxide, lithium nickel oxide, a lithium composite oxide containing nickel, manganese, and cobalt, a lithium composite oxide containing nickel, cobalt, and aluminum, or the like can be used as the lithium composite oxide having a layered rock-salt crystal structure, for example. Moreover, each of these positive electrode active materials is preferably represented by the space group R-3m.

In a positive electrode active material having a layered rock-salt crystal structure, the crystal structure is collapsed in some cases when the depth of charge becomes deep. Here, the collapse of the crystal structure means deviation in layers, for example. In the case where the collapse of the crystal structure is irreversible, the capacity of the secondary battery might be reduced owing to repeated charging and discharging.

When the positive electrode active material of one embodiment of the present invention contains the element X, for example, the deviation in layers is suppressed even when the depth of charge becomes deep. By suppressing the deviation, a volume change in charging and discharging can be reduced. Accordingly, the positive electrode active material of one embodiment of the present invention can have excellent cycle performance. In addition, the positive electrode active material of one embodiment of the present invention can have a stable crystal structure in a high-voltage charged state. Thus, in the positive electrode active material of one embodiment of the present invention, a short circuit is sometimes less likely to occur when the high-voltage charged state is maintained. This is preferable because the safety is further improved.

The positive electrode active material of one embodiment of the present invention has a small crystal-structure change and a small volume difference per the same number of transition metal atoms between a sufficiently discharged state and a high-voltage charged state.

The positive electrode active material of one embodiment of the present invention is expressed by a chemical formula $AM_yO_z$ (y>0, z>0) in some cases. For example, lithium cobalt oxide is expressed as $LiCoO_2$ in some cases. For another example, lithium nickel oxide is expressed as $LiNiO_2$ in some cases.

In the case where the depth of charge is greater than or equal to 0.8, in some cases, the positive electrode active material of one embodiment of the present invention, which contains the element X, belongs to the space group R-3m, and has not the spinel crystal structure but a structure in which an ion of the element M (e.g., cobalt), the element X (e.g., magnesium), or the like is coordinated to six oxygen atoms and the cation arrangement has symmetry similar to that of the spinel crystal structure. This structure is referred to as the pseudo-spinel crystal structure in this specification and the like. Note that in the pseudo-spinel crystal structure, a light element such as lithium is coordinated to four oxygen atoms. Also in that case, the ion arrangement has symmetry similar to that of the spinel crystal structure.

The structure of the positive electrode active material becomes unstable due to release of carrier ions with charging. It can be said that the pseudo-spinel crystal structure is capable of maintaining high stability even after release of the carrier ions.

In the case where the depth of charge is deep in the present invention, the positive electrode active material having the pseudo-spinel crystal structure is used for the secondary battery, whereby the structure of the positive electrode active material is stable, for example, at a voltage of approximately 4.6 V, preferably at a voltage of approximately 4.65 V to 4.7 V, with reference to the potential of lithium metal, and a reduction in the capacity due to charging and discharging can be suppressed. Note that in the case of using graphite as the negative electrode active material in the secondary battery, for example, the structure of the positive electrode active material is stable at a voltage of the secondary battery of higher than or equal to 4.3 V and lower than or equal to 4.5 V, preferably at a voltage of higher than or equal to 4.35 V and lower than or equal to 4.55 V, and a reduction in the capacity due to charging and discharging can be suppressed.

The pseudo-spinel crystal structure can also be regarded as a crystal structure that contains Li between layers at random but is similar to a $CdCl_2$ type crystal structure. The crystal structure similar to the $CdCl_2$ type crystal structure is close to a crystal structure of lithium nickel oxide when charged up to a charge depth of 0.94 ($Li_{0.06}NiO_2$); however, pure lithium cobalt oxide or a layered rock-salt positive electrode active material containing a large amount of cobalt is known not to have this crystal structure generally.

Anions of a layered rock-salt crystal and anions of a rock-salt crystal have cubic closest packed structures (face-centered cubic lattice structures). Anions of a pseudo-spinel crystal are also presumed to have cubic closest packed structures. When the pseudo-spinel crystal is in contact with the layered rock-salt crystal and the rock-salt crystal, there is a crystal plane at which orientations of cubic closest packed structures composed of anions are aligned. Note that a space group of the layered rock-salt crystal and the pseudo-spinel crystal is R-3m, which is different from a space group Fm-3m of a rock-salt crystal (a space group of a general rock-salt crystal) and a space group Fd-3m of a rock-salt crystal (a space group of a rock-salt crystal having the simplest symmetry); thus, the Miller index of the crystal plane satisfying the above conditions in the layered rock-salt crystal and the pseudo-spinel crystal is different from that in the rock-salt crystal. In this specification, a state where the orientations of the cubic closest packed structures composed of anions in the layered rock-salt crystal, the pseudo-spinel crystal, and the rock-salt crystal are aligned is referred to as a state where crystal orientations are substantially aligned in some cases.

Note that in the unit cell of the pseudo-spinel crystal structure, coordinates of cobalt and oxygen can be represented by Co (0, 0, 0.5) and O (0, 0, x) within the range of $0.20 \leq x \leq 0.25$.

In the positive electrode active material of one embodiment of the present invention, a difference between the volume per unit cell in a volume with a depth of charge of 0 and the volume per unit cell of the pseudo-spinel crystal structure with a depth of charge of 0.82 is preferably 2.5% or less, further preferably 2.2% or less.

The pseudo-spinel crystal structure has diffraction peaks at $2\theta$ of $19.30 \pm 0.20°$ (greater than or equal to 19.10° and less than or equal to 19.50° and $2\theta$ of $45.55 \pm 0.10°$ (greater than or equal to 45.45° and less than or equal to 45.65°). More specifically, sharp diffraction peaks appear at $2\theta$ of $19.30 \pm 0.10°$ (greater than or equal to 19.20° and less than or equal to 19.40°) and $2\theta$ of $45.55 \pm 0.05°$ (greater than or equal to 45.50° and less than or equal to 45.60°).

Note that although the positive electrode active material of one embodiment of the present invention has the pseudo-spinel crystal structure when being charged with high voltage, not all the particles necessarily have the pseudo-spinel crystal structure. The particles may have another crystal structure, or some of the particles may be amorphous. Note that when the XRD patterns are analyzed by the Rietveld analysis, the pseudo-spinel crystal structure preferably accounts for more than or equal to 50 wt %, further preferably more than or equal to 60 wt %, still further preferably more than or equal to 66 wt %. The positive electrode active material in which the pseudo-spinel crystal structure accounts for more than or equal to 50 wt %, further preferably more than or equal to 60 wt %, still further preferably more than or equal to 66 wt % can have sufficiently good cycle performance.

The number of atoms of the element X is preferably larger than 0.001 times and less than or equal to 0.1 times the number of atoms of the element M, further preferably larger than 0.01 and less than 0.04, still further preferably approximately 0.02. The concentration of the element X described here may be a value obtained by element analysis on all the particles of the positive electrode active material using ICP-MS or the like, or may be a value based on the ratio of raw materials mixed in the process of forming the positive electrode active material, for example.

In the case where cobalt and nickel are contained as the element M, the proportion of nickel atoms (Ni) in the sum of cobalt atoms and nickel atoms (Co+Ni) (Ni/(Co+Ni)) is preferably less than 0.1, further preferably less than or equal to 0.075.

The positive electrode active material of one embodiment of the present invention is not limited to the materials described above.

As the positive electrode active material, a composite oxide with a spinel crystal structure can be used, for example. Alternatively, a polyanionic material can be used as the positive electrode active material, for example. Examples of the polyanionic material include a material with an olivine crystal structure and a material with a NASICON structure. Alternatively, a material containing sulfur can be used as the positive electrode active material, for example.

As the material with a spinel crystal structure, for example, a composite oxide represented by $LiM_2O_4$ can be used. It is preferable to contain Mn as the element M. For example, $LiMn_2O_4$ can be used. It is preferable to contain Ni in addition to Mn as the element M because the discharging voltage and the energy density of the secondary battery are improved in some cases. It is preferable to add a small amount of lithium nickel oxide ($LiNiO_2$ or $LiNi_{1-x}M_xO_2$ (M=Co, Al, or the like)) to a lithium-containing material with a spinel crystal structure which contains manganese, such as $LiMn_2O_4$, because the characteristics of the secondary battery can be improved.

As the polyanionic material, for example, a composite oxide containing oxygen, an element X, a metal A, and a metal M can be used. The metal M is one or more of Fe, Mn, Co, Ni, Ti, V, and Nb, the metal A is one or more of Li, Na, and Mg, and the element X is one or more of S, P, Mo, W, As, and Si.

As the material with an olivine crystal structure, for example, a composite material (general formula $LiMPO_4$ (M is one or more of Fe(II), Mn(II), Co(II), and Ni(II))) can be used. Typical examples of the general formula $LiMPO_4$ include lithium compounds such as $LiFePO_4$, $LiNiPO_4$, $LiCoPO_4$, $LiMnPO_4$, $LiFe_aNi_bPO_4$, $LiFe_aCo_bPO_4$, $LiFe_aMn_bPO_4$, $LiNi_aCo_bPO_4$, $LiNi_aMn_bPO_4$ ($a+b \leq 1$, $0<a<1$, and $0<b<1$), $LiFe_cNi_dCo_ePO_4$, $LiFe_cNi_dMn_ePO_4$, $LiNi_cCo_dMn_ePO_4$ ($c+d+e \leq 1$, $0<c<1$, $0<d<1$, and $0<e<1$), and $LiFe_fNi_gCo_hMn_iPO_4$ ($f+g+h+i \leq 1$, $0<f<1$, $0<g<1$, $0<h<1$, and $0<i<1$).

Alternatively, a composite material such as a general formula $Li_{(2-j)}MSiO_4$ (M is one or more of Fe(II), Mn(II), Co(II), and Ni(II); $0 \leq j \leq 2$) can be used. Typical examples of the general formula $Li_{(2-j)}MSiO_4$ which can be used as a material include lithium compounds such as $Li_{(2-j)}FeSiO_4$, $Li_{(2-j)}NiSiO_4$, $Li_{(2-j)}CoSiO_4$, $Li_{(2-j)}MnSiO_4$, $Li_{(2-j)}Fe_kNi_lSiO_4$, $Li_{(2-j)}Fe_kCo_lSiO_4$, $Li_{(2-j)}Fe_kMn_lSiO_4$, $Li_{(2-j)}Ni_kCo_lSiO_4$, $Li_{(2-j)}Ni_kMn_lSiO_4$ ($k+l \leq 1$, $0<k<1$, and $0<l<1$), $Li_{(2-j)}Fe_mNi_nCo_qSiO_4$, $Li_{(2-j)}Fe_mNi_nMn_qSiO_4$, $Li_{(2-j)}Ni_mCo_nMn_qSiO_4$ ($m+n+q \leq 1$, $0<m<1$, $0<n<1$, and $0<q<1$), and $Li_{(2-j)}Fe_rNi_sCo_tMn_uSiO_4$ ($r+s+t+u \leq 1$, $0<r<1$, $0<s<1$, $0<t<1$, and $0<u<1$).

Still alternatively, a NASICON compound represented by a general formula $A_xM_2(XO_4)_3$ (A=Li, Na, or Mg, M=Fe, Mn, Ti, V, or Nb, X=S, P, Mo, W, As, or Si) can be used. Examples of the NASICON compound include $Fe_2(MnO_4)_3$, $Fe_2(SO_4)_3$, and $Li_3Fe_2(PO_4)_3$. Further alternatively, a compound represented by a general formula $Li_2MPO_4F$, $Li_2MP_2O_7$, or $Li_5MO_4$ (M=Fe or Mn) can be used as the positive electrode active material.

Further alternatively, a perovskite fluoride such as $NaFeF_3$ and $FeF_3$, a metal chalcogenide (a sulfide, a selenide, or a telluride) such as $TiS_2$ and $MoS_2$, an oxide with an inverse spinel crystal structure such as $LiMVO_4$, a vanadium oxide ($V_2O_5$, $V_6O_{13}$, $LiV_3O_8$, or the like), a manganese oxide, an organic sulfur compound, or the like can be used as the positive electrode active material.

Alternatively, a borate-based material represented by a general formula $LiMBO_3$ (M is Fe(II), Mn(II), or Co(II)) can be used as the positive electrode active material.

As a material containing sodium, for example, an oxide containing sodium such as $NaFeO_2$, $Na_{2/3}[Fe_{1/2}Mn_{1/2}]O_2$, $Na_{2/3}[Ni_{1/3}Mn_{2/3}]O_2$, $Na_2Fe_2(SO_4)_3$, $Na_3V_2(PO_4)_3$, $Na_2FePO_4F$, $NaVPO_4F$, $NaMPO_4$ (M is Fe(II), Mn(II), Co(II), or Ni(II)), $Na_2FePO_4F$, or $Na_4Co_3(PO_4)_2P_2O_7$ can be used as the positive electrode active material.

As the positive electrode active material, a lithium-containing metal sulfide can be used. Examples of the lithium-containing metal sulfide are $Li_2TiS_3$ and $Li_3NbS_4$.

This embodiment can be implemented in an appropriate combination with structures described in the other embodiments, examples, and the like.

Embodiment 7

In this embodiment, examples of materials and structures that can be used for a secondary battery are described.

The secondary battery of one embodiment of the present invention includes a positive electrode, a negative electrode, and an electrolyte. The secondary battery of one embodiment of the present invention includes an electrolyte solution containing an electrolyte and a separator positioned between the positive electrode and the negative electrode, for example. Alternatively, the secondary battery of one embodiment of the present invention includes a solid electrolyte positioned between the positive electrode and the negative electrode, for example. The positive electrode, the negative electrode, and the electrolyte are preferably wrapped in an exterior body.

[Positive Electrode]

The positive electrode includes a positive electrode active material layer. The positive electrode active material layer includes at least a positive electrode active material, and may contain, in addition to the positive electrode active material, other materials such as a coating film of the active material surface, a conductive additive, and a binder. The positive electrode may include a current collector, and the positive electrode active material layer may be formed over the current collector.

Examples of the conductive additive include a carbon material, a metal material, and a conductive ceramic material. Alternatively, a fiber material may be used as the conductive additive. The content of the conductive additive to the total amount of the active material layer is preferably greater than or equal to 1 wt % and less than or equal to 10 wt %, further preferably greater than or equal to 1 wt % and less than or equal to 5 wt %.

Examples of the conductive additive include natural graphite, artificial graphite such as mesocarbon microbeads, and carbon fiber. For example, carbon fiber such as mesophase pitch-based carbon fiber or isotropic pitch-based carbon fiber can be used as the carbon fiber. Alternatively, carbon nanofiber, carbon nanotube, or the like can be used as the carbon fiber. Other examples of the conductive additive include carbon materials such as carbon black (e.g., acetylene black (AB)), graphite (black lead) particles, graphene, and fullerene. Alternatively, metal powder or metal fibers of copper, nickel, aluminum, silver, gold, or the like, a conductive ceramic material, or the like can be used.

Alternatively, a graphene compound may be used as the conductive additive. It is particularly preferable to use, for example, graphene, multilayer graphene, or RGO as the graphene compound. Note that RGO refers to a compound obtained by reducing graphene oxide (GO), for example.

As the binder, a material such as polystyrene, poly(methyl acrylate), poly(methyl methacrylate) (polymethyl methacrylate, PMMA), sodium polyacrylate, polyvinyl alcohol (PVA), polyethylene oxide (PEO), polypropylene oxide, polyimide, polyvinyl chloride, polytetrafluoroethylene, polyethylene, polypropylene, polyisobutylene, polyethylene terephthalate, nylon, polyvinylidene fluoride (PVDF), polyacrylonitrile (PAN), ethylene-propylene-diene polymer, polyvinyl acetate, or nitrocellulose is preferably used.

As the binder, a rubber material such as styrene-butadiene rubber (SBR), styrene-isoprene-styrene rubber, acrylonitrile-butadiene rubber, butadiene rubber, or ethylene-propylene-diene copolymer can be used. Alternatively, fluororubber can be used as the binder. As the binder, s water-soluble polymer is preferably used. As the water-soluble polymer, for example, a polysaccharide can be used. As the polysaccharide, a cellulose derivative such as carboxymethyl cellulose (CMC), methyl cellulose, ethyl cellulose, hydroxypropyl cellulose, diacetyl cellulose, or regenerated cellulose, starch, or the like can be used. It is further preferred that such a water-soluble polymer be used in combination with any of the above rubber materials.

A plurality of the above materials may be used in combination for the binder.

The current collector can be formed using a material that has high conductivity, such as a metal like stainless steel, gold, platinum, aluminum, or titanium, an alloy thereof. Alternatively, it is possible to use an aluminum alloy to which an element that improves heat resistance, such as silicon, titanium, neodymium, scandium, or molybdenum, is added. Still alternatively, the current collector may be formed using a metal element that forms silicide by reacting with silicon. Examples of the metal element that forms silicide by reacting with silicon include zirconium, titanium, hafnium, vanadium, niobium, tantalum, chromium, molybdenum, tungsten, cobalt, and nickel. The current collector can have a shape such as a foil-like shape, a plate-like shape (sheet-like shape), a net-like shape, a punching-metal shape, or an expanded-metal shape as appropriate. The current collector preferably has a thickness of greater than or equal to 5 μm and less than or equal to 30 μm.

[Negative Electrode]

The negative electrode includes a negative electrode active material layer. The negative electrode active material layer may include a conductive additive and a binder. The negative electrode may include a current collector, and the negative electrode active material layer may be formed over the current collector.

For the conductive additive and the binder that can be included in the negative electrode active material layer, materials similar to those of the conductive additive and the binder that can be included in the positive electrode active material layer can be used.

A material such as a metal, e.g., copper or titanium, or an alloy thereof can be used as the negative electrode current collector. Note that a material which is not alloyed with carrier ions of lithium or the like is preferably used for the negative electrode current collector.

<Negative Electrode Active Material>

As a negative electrode active material, for example, an alloy-based material or a carbon-based material can be used.

For the negative electrode active material, an element that enables charging and discharging reactions by an alloying reaction and a dealloying reaction with lithium can be used. For example, a material containing at least one of silicon, tin, gallium, aluminum, germanium, lead, antimony, bismuth, silver, zinc, cadmium, indium, and the like can be used. A compound containing any of the above elements may be used. For example, $SiO$, $Mg_2Si$, $Mg_2Ge$, $SnO$, $SnO_2$, $Mg_2Sn$, $SnS_2$, $V_2Sn_3$, $FeSn_2$, $CoSn_2$, $Ni_3Sn_2$, $Cu_6Sn_5$, Ag$_3$Sn, Ag$_3$Sb, Ni$_2$MnSb, CeSb$_3$, LaSn$_3$, La$_3$Co$_2$Sn$_7$, CoSb$_3$, InSb, and SbSn can be given.

In this specification and the like, SiO refers, for example, to silicon monoxide. Note that SiO can alternatively be expressed as SiO$_x$. Here, x preferably has an approximate value of 1. For example, x is preferably 0.2 or more and 1.5 or less, further preferably 0.3 or more and 1.2 or less.

As the carbon-based material, graphite, graphitizing carbon (soft carbon), non-graphitizing carbon (hard carbon), carbon nanotube, graphene, carbon black, or the like may be used.

Examples of graphite include artificial graphite and natural graphite. Examples of artificial graphite include mesocarbon microbeads (MCMB), coke-based artificial graphite, and pitch-based artificial graphite. Examples of natural graphite include flake graphite and spherical natural graphite.

Alternatively, as the negative electrode active material, an oxide such as titanium dioxide (TiO$_2$), lithium titanium oxide (Li$_4$Ti$_5$O$_{12}$), a lithium-graphite intercalation compound (Li$x$C$_6$), niobium pentoxide (Nb$_2$O$_5$), tungsten oxide (WO$_2$), or molybdenum oxide (MoO$_2$) can be used.

Alternatively, a material that causes a conversion reaction can be used as the negative electrode active material. For example, a transition metal oxide that does not form an alloy with lithium, such as cobalt oxide (CoO), nickel oxide (NiO), and iron oxide (FeO), may be used as the negative electrode active material. Other examples of the material that causes a conversion reaction include oxides such as Fe$_2$O$_3$, CuO, Cu$_2$O, RuO$_2$, and Cr$_2$O$_3$, sulfides such as CoS$_{0.89}$, NiS, and CuS, nitrides such as Zn$_3$N$_2$, Cu$_3$N, and Ge$_3$N$_4$, phosphides such as NiP$_2$, FeP$_2$, and CoP$_3$, and fluorides such as FeF$_3$ and BiF$_3$.

[Electrolyte Solution]

The electrolyte solution contains a solvent and an electrolyte. As the solvent of the electrolyte solution, an aprotic organic solvent is preferably used. For example, one of ethylene carbonate (EC), propylene carbonate (PC), butylene carbonate, chloroethylene carbonate, vinylene carbonate, γ-butyrolactone, γ-valerolactone, dimethyl carbonate (DMC), diethyl carbonate (DEC), ethyl methyl carbonate (EMC), methyl formate, methyl acetate, ethyl acetate, methyl propionate, ethyl propionate, propyl propionate, methyl butyrate, 1,3-dioxane, 1,4-dioxane, dimethoxyethane (DME), dimethyl sulfoxide, diethyl ether, methyl diglyme, acetonitrile, benzonitrile, tetrahydrofuran, sulfolane, and sultone can be used, or two or more of these solvents can be used in an appropriate combination in an appropriate ratio.

Alternatively, the use of one or more ionic liquids (room temperature molten salts) that are less likely to burn and volatize as the solvent of the electrolyte solution can prevent a secondary battery from exploding or catching fire even when the secondary battery internally shorts out or the internal temperature increases owing to overcharging or the like. An ionic liquid contains a cation and an anion, specifically, an organic cation and an anion. Examples of the organic cation used for the electrolyte solution include aliphatic onium cations such as a quaternary ammonium cation, a tertiary sulfonium cation, and a quaternary phosphonium cation, and aromatic cations such as an imidazolium cation and a pyridinium cation. Examples of the anion used for the electrolyte solution include a monovalent amide-based anion, a monovalent methide-based anion, a fluorosulfonate anion, a perfluoroalkylsulfonate anion, a tetrafluoroborate anion, a perfluoroalkylborate anion, a hexafluorophosphate anion, and a perfluoroalkylphosphate anion.

As an electrolyte dissolved in the above-described solvent, one of lithium salts such as LiPF$_6$, LiClO$_4$, LiAsF$_6$, LiBF$_4$, LiAlCl$_4$, LiSCN, LiBr, LiI, Li$_2$SO$_4$, Li$_2$B$_{10}$Cl$_{10}$, Li$_2$B$_{12}$Cl$_{12}$, LiCF$_3$SO$_3$, LiC$_4$F$_9$SO$_3$, LiC(CF$_3$SO$_2$)$_3$, LiC(C$_2$F$_5$SO$_2$)$_3$, LiN(CF$_3$SO$_2$)$_2$, LiN(C$_4$F$_9$SO$_2$)(CF$_3$SO$_2$), and LiN(C$_2$F$_5$SO$_2$)$_2$ can be used, or two or more of these lithium salts can be used in an appropriate combination in an appropriate ratio.

Furthermore, an additive agent such as vinylene carbonate, propane sultone (PS), tert-butylbenzene (TBB), fluoroethylene carbonate (FEC), lithium bis(oxalate)borate (Li-BOB), or a dinitrile compound such as succinonitrile or adiponitrile may be added to the electrolyte solution. The concentration of a material to be added in the whole solvent is, for example, higher than or equal to 0.1 wt % and lower than or equal to 5 wt %.

Alternatively, a polymer gel electrolyte obtained in such a manner that a polymer is swelled with an electrolyte solution may be used. When a polymer gel electrolyte is used, safety against liquid leakage and the like is improved. Furthermore, a secondary battery can be thinner and more lightweight. As a polymer that undergoes gelation, a silicone gel, an acrylic gel, an acrylonitrile gel, a polyethylene oxide-based gel, a polypropylene oxide-based gel, a fluorine-based polymer gel, or the like can be used. Examples of the polymer include a polymer having a polyalkylene oxide structure, such as polyethylene oxide (PEO); PVDF; polyacrylonitrile; and a copolymer containing any of them. For example, PVDF-HFP, which is a copolymer of PVDF and hexafluoropropylene (HFP) can be used. The formed polymer may be porous.

Instead of the electrolyte solution, a sulfide-based solid electrolyte, an oxide-based solid electrolyte, a halide-based solid electrolyte, or the like can be used. Alternatively, a solid electrolyte containing a high-molecular material such as a PEO (polyethylene oxide)-based high-molecular material can be used. When the solid electrolyte is used, a separator and a spacer are not necessary. Furthermore, the battery can be entirely solidified; therefore, there is no possibility of liquid leakage and thus the safety of the battery is dramatically increased.

Examples of the sulfide-based solid electrolyte include a thio-silicon-based material (e.g., Li$_{10}$GeP$_2$S$_{12}$ and Li$_{3.25}$Ge$_{0.25}$P$_{0.75}$S$_4$), sulfide glass (e.g., 70Li$_2$S·30P$_2$S$_5$, 30Li$_2$S·26B$_2$S$_3$·44LiI, 63Li$_2$S·38SiS$_2$·1Li$_3$PO$_4$, 57Li$_2$S·38SiS$_2$·5Li$_4$SiO$_4$, and 50Li$_2$S·50GeS$_2$), and sulfide-based crystallized glass (e.g., Li$_7$P$_3$S$_{11}$ and Li$_{3.25}$P$_{0.95}$S$_4$). The sulfide-based solid electrolyte has advantages such as high conductivity of some materials, low-temperature synthesis, and ease of maintaining a conduction path after charging and discharging because of its relative softness.

Examples of the oxide-based solid electrolyte include a material with a perovskite crystal structure (e.g., La$_{2/3-x}$Li$_{3x}$TiO$_3$), a material with a NASICON crystal structure (e.g., Li$_{1-x}$Al$_x$Ti$_{2-x}$(PO$_4$)$_3$), a material with a garnet crystal structure (e.g., Li$_7$La$_3$Zr$_2$O$_{12}$), a material with a LISICON crystal structure (e.g., Li$_{14}$ZnGe$_4$O$_{16}$), LLZO (Li$_7$La$_3$Zr$_2$O$_{12}$), oxide glass (e.g., Li$_3$PO$_4$—Li$_4$SiO$_4$ and 50Li$_4$SiO$_4$·50Li$_3$BO$_3$), and oxide-based crystallized glass (e.g., Li$_{1.07}$Al$_{0.69}$Ti$_{1.46}$(PO$_4$)$_3$ and Li$_{1.5}$Al$_{0.5}$Ge$_{1.5}$(PO$_4$)$_3$). The oxide-based solid electrolyte has an advantage of stability in the air.

Examples of the halide-based solid electrolyte include LiAlCl$_4$, Li$_3$InBr$_6$, LiF, LiCl, LiBr, and LiI. Moreover, a composite material in which pores of porous aluminum oxide or porous silica are filled with such a halide-based solid electrolyte can be used as the solid electrolyte.

Alternatively, different solid electrolytes may be mixed and used.

In particular, $Li_{1+x}Al_xTi_{2-x}(PO_4)_3$ (0<x<1) with a NASICON crystal structure (hereinafter LATP) is preferable because LATP contains aluminum and titanium, each of which is the element the positive electrode active material used for the secondary battery 300 of one embodiment of the present invention is allowed to contain, and thus a synergistic effect of improving the cycle performance is expected. Moreover, higher productivity due to the reduction in the number of steps is expected. Note that in this specification and the like, a NASICON crystal structure is a compound that is represented by $M_2(XO_4)_3$ (M: transition metal; X: S, P, As, Mo, W, or the like) and has a structure in which $MO_6$ octahedra and $XO_4$ tetrahedra that share common corners are arranged three-dimensionally.

[Separator]

The secondary battery preferably includes a separator. As the separator, for example, paper; nonwoven fabric; glass fiber; ceramics; or synthetic fiber containing nylon (polyamide), vinylon (polyvinyl alcohol-based fiber), polyester, acrylic, polyolefin, or polyurethane can be used. The separator is preferably formed to have an envelope-like shape to wrap one of the positive electrode and the negative electrode.

The separator may have a multilayer structure. For example, an organic material film of polypropylene, polyethylene, or the like can be coated with a ceramic-based material, a fluorine-based material, a polyamide-based material, a mixture thereof, or the like. Examples of the ceramic-based material include aluminum oxide particles and silicon oxide particles. Examples of the fluorine-based material include PVDF and polytetrafluoroethylene. Examples of the polyamide-based material include nylon and aramid (meta-based aramid and para-based aramid).

[Exterior Body]

For an exterior body included in the secondary battery, a metal material such as aluminum or a resin material can be used, for example. An exterior body in the form of a film can also be used. As the film, for example, a film having a three-layer structure in which a highly flexible metal thin film of aluminum, stainless steel, copper, nickel, or the like is provided over a film formed of a material such as polyethylene, polypropylene, polycarbonate, ionomer, or polyamide, and an insulating synthetic resin film of a polyamide-based resin, a polyester-based resin, or the like is provided as the outer surface of the exterior body over the metal thin film can be used.

Structure Example of Secondary Battery

A structure of a secondary battery using a solid electrolyte layer will be described below as a structure example of a secondary battery.

Figure 26A:
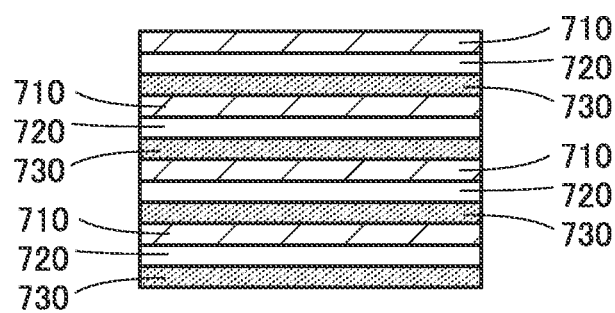
FIG. 26A and FIG. 26B are diagrams illustrating a structure example of a secondary battery.

In a secondary battery 700 illustrated in FIG. 26A, combinations each including a positive electrode 710, a solid electrolyte layer 720, and a negative electrode 730 are stacked. Stacking the positive electrodes 710, the solid electrolyte layers 720, and the negative electrodes 730 can increase the voltage of the secondary battery. FIG. 26A is a schematic view illustrating the case where four layers of the combination of the positive electrode 710, the solid electrolyte layer 720, and the negative electrode 730 are stacked.

Figure 26B:
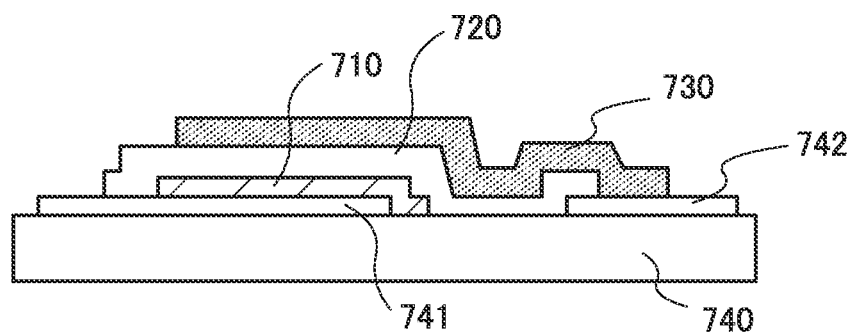

The secondary battery 700 of one embodiment of the present invention may be a thin-film all-solid-state battery. A thin-film all-solid-state battery can be manufactured by depositing a positive electrode, a solid electrolyte, a negative electrode, a wiring electrode, and the like by a vapor phase method (a vacuum deposition method, a pulsed laser deposition method, an aerosol deposition method, or a sputtering method). For example, as illustrated in FIG. 26B, after a wiring electrode 741 and a wiring electrode 742 are formed over a substrate 740, the positive electrode 710 is formed over the wiring electrode 741, the solid electrolyte layer 720 is formed over the positive electrode 710, and the negative electrode 730 is formed over the solid electrolyte layer 720 and the wiring electrode 742, whereby the secondary battery 700 can be manufactured. As the substrate 740, a ceramic substrate, a glass substrate, a plastic substrate, a metal substrate, or the like can be used.

As a solid electrolyte contained in the solid electrolyte layer 720, any of the above solid electrolytes can be used.

This embodiment can be implemented in an appropriate combination with structures described in the other embodiments, examples, and the like.

Embodiment 8

In this embodiment, electronic devices in which the semiconductor device of one embodiment of the present invention can be used will be described.

The semiconductor device of one embodiment of the present invention can be mounted on a variety of electronic devices. Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer and the like, digital signage, and a large game machine like a pachinko machine. Vehicles such as an automobile, a bicycle, a ship, and an airplane can also be categorized as electronic devices. The semiconductor device of one embodiment of the present invention can be used for a charging and discharging control device or the like of a battery incorporated in any of the electronic devices.

The electronic device may include an antenna. When a signal is received by the antenna, the electronic device can display a video, data, or the like on a display portion. When the electronic device includes the antenna and a secondary battery, the antenna may be used for contactless power transmission.

The electronic device may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic device can have a variety of functions. For example, the electronic device can have a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium.

Figure 27A:
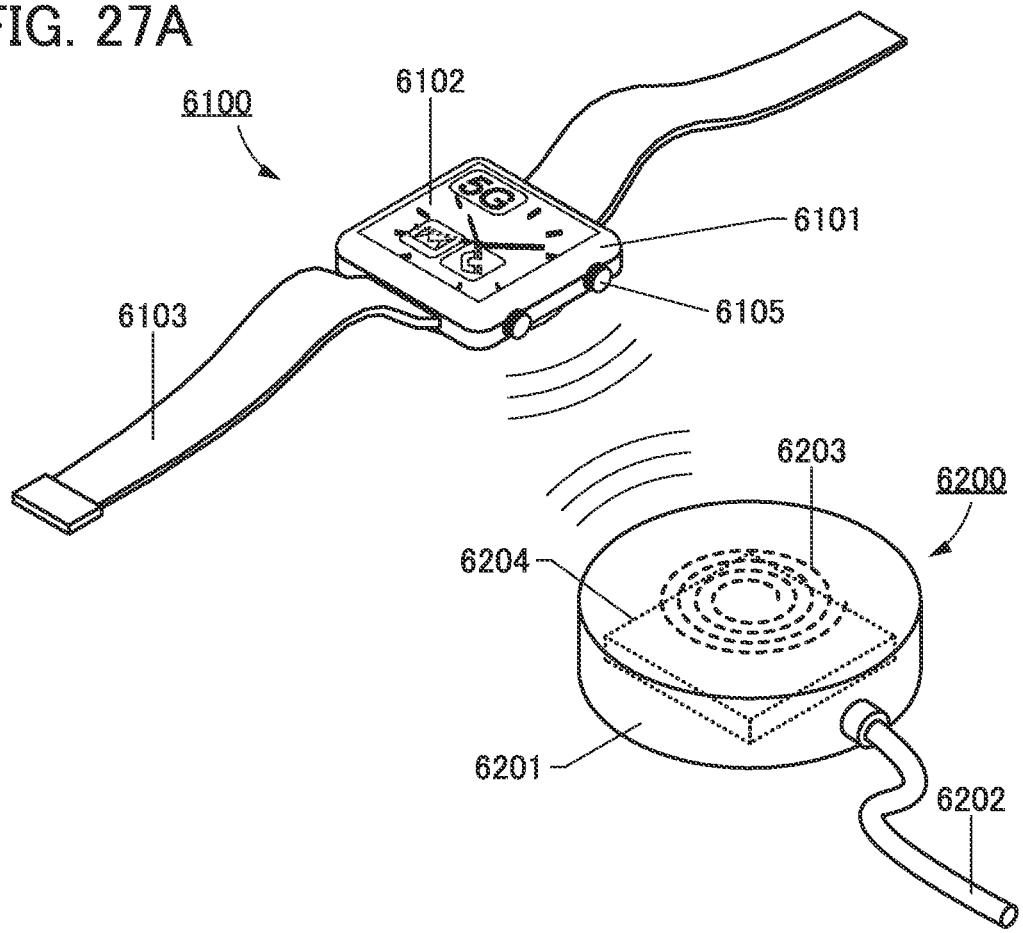
FIG. 27A and FIG. 27B are diagrams illustrating an example of an electronic device.

Examples of an electronic device including the semiconductor device of one embodiment of the present invention are described with reference to drawings FIG. 27A illustrates an example of a watch-type portable information terminal and an example of a power transmitting device. A portable information terminal 6100 includes a housing 6101, a display portion 6102, a band 6103, operation buttons 6105, and the like. A power transmitting device 6200 includes a housing 6201, a power cable 6202, a power transmitting antenna 6203, a driver circuit 6204, and the like. The driver circuit 6204 may include a power transmission control circuit, a matching circuit, an electric power radiation circuit, or the like. The portable information terminal 6100 includes a secondary battery and a power receiving device therein. The power receiving device has a function of receiving an electric power radiated from the power transmitting device 6200 and charging the secondary battery. The power receiving device may be the power receiving device described in the above embodiment, for example.

Figure 27B:
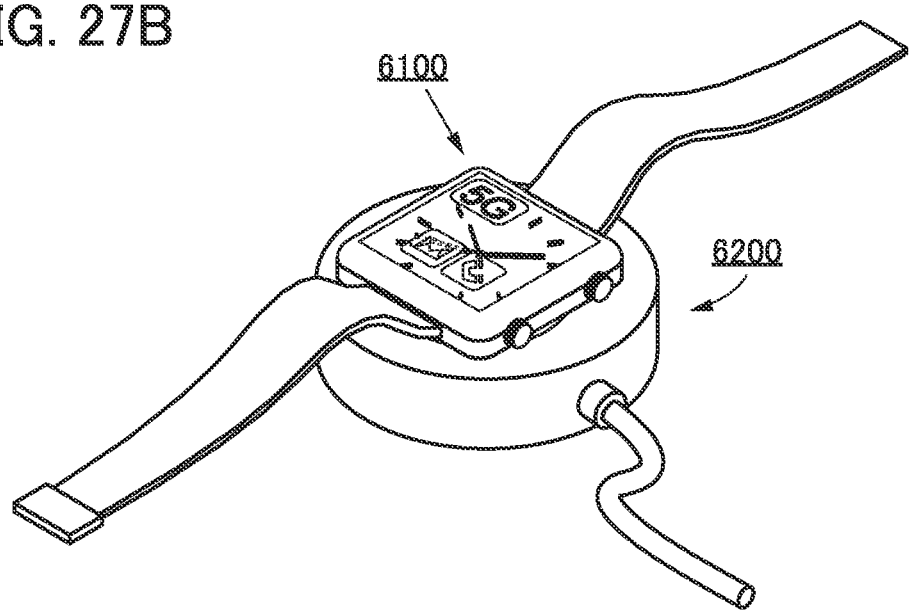

As illustrated in FIG. 27B, when the portable information terminal 6100 overlaps with the power transmitting device 6200, an electric power can be efficiently supplied to the portable information terminal 6100. The portable information terminal 6100 has a function of transmitting, to the power transmitting device 6200, a signal to stop radiation of an electric power when the secondary battery incorporated in the portable information terminal 6100 is fully charged.

The portable information terminal 6100 can include a variety of communication means such as a communication means conforming to the third-generation mobile communication system such as LTE, a communication means conforming to the fourth-generation mobile communication system (4G), and a communication means conforming to the fifth-generation mobile communication system (5G), in addition to a short-distance communication means such as Wi-Fi (registered trademark) or Bluetooth (registered trademark).

Figure 28A:
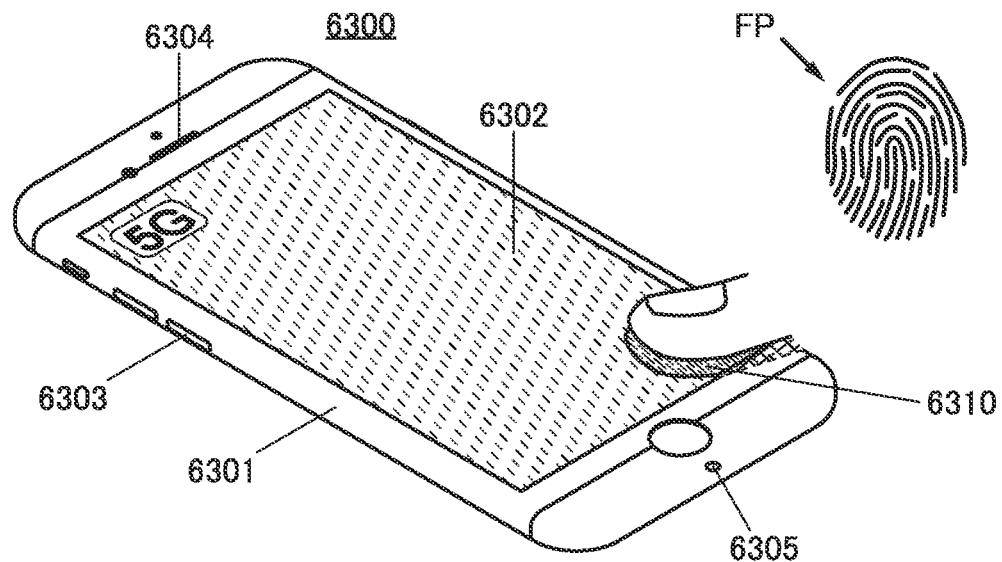
FIG. 28A and FIG. 28B are drawings illustrating an example of an electronic device.

FIG. 28A illustrates an example of a mobile phone. A mobile phone 6300 includes a display portion 6302 incorporated in a housing 6301, operation buttons 6303, a speaker 6304, a microphone 6305, and the like.

The mobile phone 6300 further includes a fingerprint sensor 6310 in a region overlapping with the display portion 6302. The fingerprint sensor 6310 may be an organic optical sensor. An example of a fingerprint FP is illustrated in FIG. 28A. Since fingerprints differ between individuals, the fingerprint sensor 6310 can perform personal authentication when acquiring fingerprint patterns. As a light source for acquiring fingerprint patterns with the fingerprint sensor 6310, light emitted from the display portion 6302 can be used.

Furthermore, a secondary battery and the power receiving device described in the above embodiment are included inside the mobile phone 6300. The power receiving device has a function of receiving an electric power radiated from the power transmitting device 6200 and charging the secondary battery.

Figure 28B:
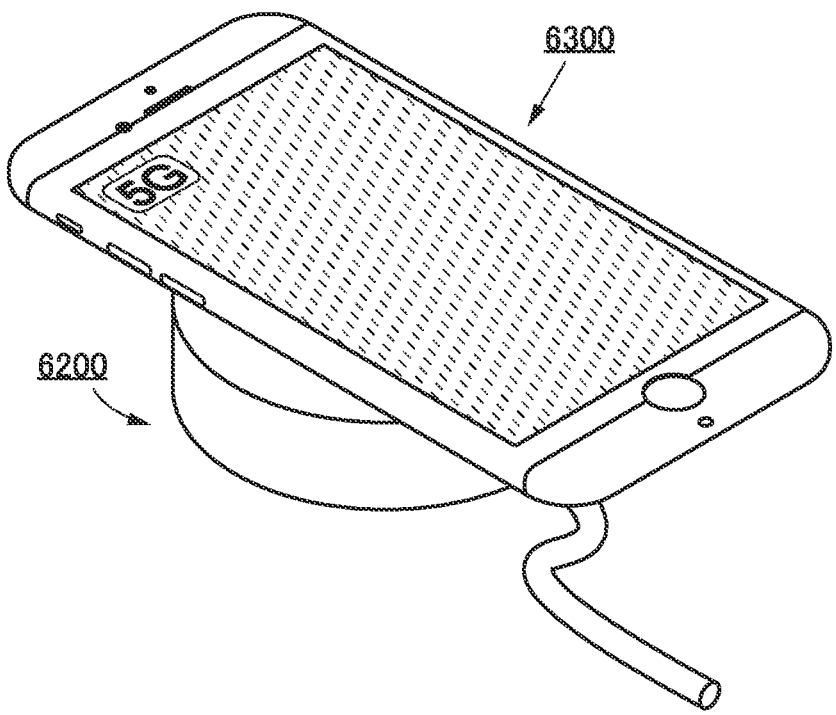

As illustrated in FIG. 28B, when the mobile phone 6300 overlaps with the power transmitting device 6200, an electric power can be efficiently supplied to the mobile phone 6300. The mobile phone 6300 has a function of transmitting, to the power transmitting device 6200, a signal to stop radiation of an electric power when the secondary battery incorporated in the mobile phone 6300 is fully charged.

The mobile phone 6300 can include a variety of communication means such as a communication means conforming to the third-generation mobile communication system such as LTE, a communication means conforming to the fourth-generation mobile communication system (4G), and a communication means conforming to the fifth-generation mobile communication system (5G), in addition to a short-distance communication means such as Wi-Fi (registered trademark) or Bluetooth (registered trademark).

A light-emitting element or the like can be used for the display portion 6102 illustrated in FIG. 27A and the display portion 6302 illustrated in FIG. 28A. Examples of the light-emitting element include self-luminous light-emitting elements such as an LED (Light Emitting Diode), an OLED (Organic LED), a QLED (Quantum-dot LED), and a semiconductor laser. As a display element used for the display portion 6102 and the display portion 6302, a liquid crystal element such as a transmissive liquid crystal element, a reflective liquid crystal element, or a transflective liquid crystal element can also be used. It is also possible to use a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like, for example.

Note that it is particularly suitable to use an organic EL element for the display portion 6102 and the display portion 6302 in one embodiment of the present invention. The use of the organic EL element enables the display portion 6102 and the display portion 6302 to be provided over flexible substrates. Using display portions with flexibility in the portable information terminal 6100 and the mobile phone 6300 makes it possible to provide the portable information terminal and the mobile phone whose weights and damages in the display portions are reduced.

Figure 29:
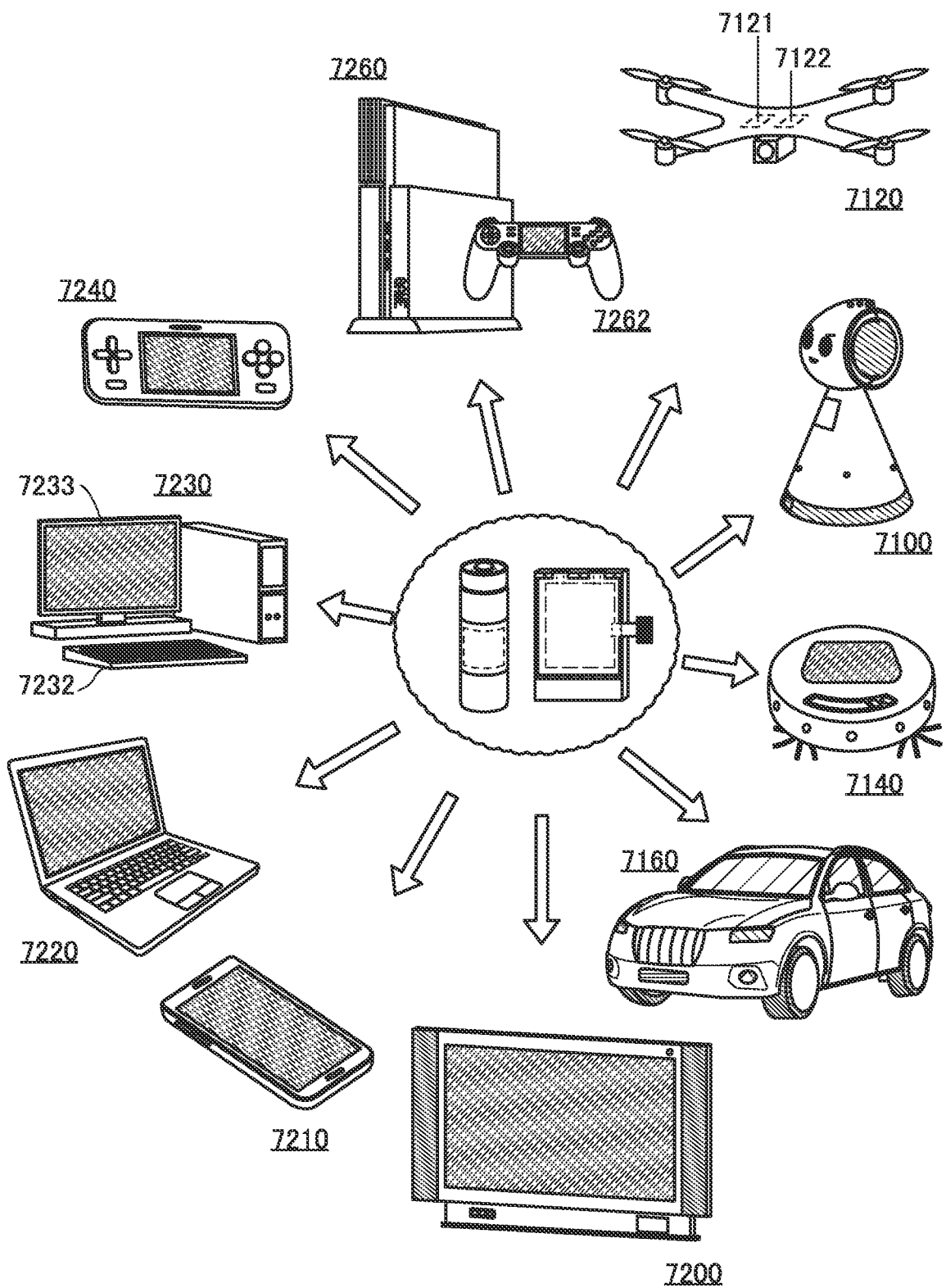
FIG. 29 is a diagram illustrating examples of electronic devices.

A robot 7100 illustrated in FIG. 29 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with the use of the microphone and the speaker.

The camera has a function of taking images of the surroundings of the robot 7100. The robot 7100 has a function of moving with the use of the moving mechanism. The robot 7100 can take images of the surroundings with the use of the camera and analyze the images to sense whether there is an obstacle in the way of the movement. The semiconductor device of one embodiment of the present invention is used for a secondary battery (battery) of the robot 7100, whereby overvoltage in charging operation can be detected. In addition, the reliability and the safety of the robot 7100 can be improved.

A flying object 7120 includes propellers, a camera, a battery, and the like and has a function of flying autonomously.

For example, image data taken by the camera is stored in an electronic component 7121. An electronic component 7122 can analyze the image data to sense whether there is an obstacle in the way of the movement. Moreover, the electronic component 7122 can estimate the remaining battery level from a change in the power storage capacity of the battery. The semiconductor device of one embodiment of the present invention is used for the battery of the flying object 7120, whereby overvoltage in charging operation can be detected. Thus, the reliability and the safety of the flying object 7120 can be improved.

A cleaning robot 7140 includes a display provided on the top surface, a plurality of cameras provided on the side surface, a brush, an operation button, various kinds of sensors, and the like. Although not illustrated, the cleaning robot 7140 is provided with a tire, an inlet, and the like. The cleaning robot 7140 can run autonomously, detect dust, and vacuum the dust through the inlet provided on the bottom surface.

For example, the cleaning robot 7140 can analyze images taken by the cameras to judge whether there is an obstacle such as a wall, furniture, or a step. In the case where an object that is likely to be caught in the brush, such as a wire, is detected by image analysis, the rotation of the brush can be stopped. The semiconductor device of one embodiment of the present invention is used for a battery of the cleaning robot 7140, whereby overvoltage in charging operation can be detected. Thus, the reliability and the safety of the cleaning robot 7140 can be improved.

An electric vehicle 7160 is shown as an example of a moving object. The electric vehicle 7160 includes an engine, tires, a brake, a steering gear, a camera, and the like. The semiconductor device of one embodiment of the present invention is used for a battery of the electric vehicle 7160, whereby overvoltage in charging operation can be detected. Thus, the reliability and the safety of the electric vehicle 7160 can be improved.

Note that although an electric vehicle is described above as an example of a moving object, the moving object is not limited to an electric vehicle. Examples of moving objects include a train, a monorail train, a ship, and a flying object (a helicopter, an unmanned aircraft (a drone), an airplane, and a rocket). The semiconductor device of one embodiment of the present invention is used for each of the batteries of these moving objects, whereby overvoltage in charging operation can be detected. Thus, the reliability and the safety of these moving objects can be improved.

A battery including the semiconductor device of one embodiment of the present invention can be incorporated in a TV device 7200 (a television receiver), a smartphone 7210, a PC 7220 (a personal computer), a PC 7230, a game machine 7240, a game machine 7260, and the like.

The smartphone 7210 is an example of a portable information terminal. The smartphone 7210 includes a microphone, a camera, a speaker, various kinds of sensors, and a display portion.

The PC 7220 and the PC 7230 are examples of a laptop PC and a desktop PC. To the PC 7230, a keyboard 7232 and a monitor device 7233 can be connected with or without a wire. The game machine 7240 is an example of a portable game machine. The game machine 7260 is an example of a stationary game machine. To the game machine 7260, a controller 7262 is connected with or without a wire.

The electronic device includes the semiconductor device of one embodiment of the present invention, whereby power consumption can be reduced.

This embodiment can be implemented in an appropriate combination with structures described in the other embodiments, examples, and the like.

Example

A circuit operation of the voltage sensing circuit 100TA illustrated in FIG. 9 was examined with a circuit simulator. SmartSpice manufactured by Silvaco Inc. was used for the circuit simulator.

In the examination conditions, the channel length of each of the transistors M1 to M6 was 0.36 μm, the channel width thereof was 0.36 μm, and the threshold voltage thereof was 0.83 V. The capacitance value of each of the capacitor C1 and the capacitor C2 was 1 pF. The capacitance value of parasitic capacitance generated in each of the node ND1 to the node ND4 was 1 fF. It was assumed that a voltage of 0 V, a voltage of 1.5 V, and a voltage of 1 V were supplied to the terminal 111, the terminal 114, and the terminal 115, respectively.

It was assumed that the comparator 101 output 0 V when the voltage of the non-inverting input was lower than or equal to the voltage of the inverting input, and output 1 V when the voltage of the non-inverting input was higher than the voltage of the inverting input.

Voltage changes in the terminal G1 to the terminal G6, the node ND1 to the node ND4, the terminal 112, and the terminal 113 when the voltage of the terminal 112 changed from 3.5 V to 4.5 V were calculated with the circuit simulator. FIG. 30A to FIG. 30D and FIG. 31A to FIG. 31C show the calculation results. FIG. 31D shows a potential change in the terminal 112 used for the calculation. In FIG. 30A to FIG. 30D and FIG. 31A to FIG. 31D, the vertical axis represents voltage and the horizontal axis represents time.

Figure 30A:
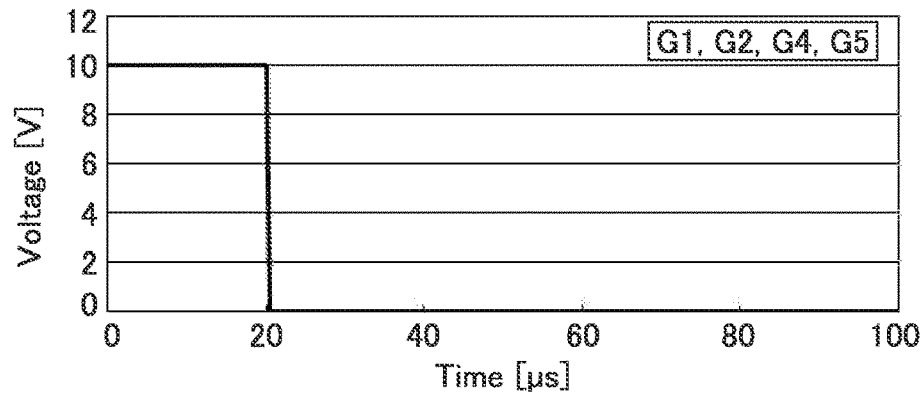
FIG. 30A to FIG. 30D are diagrams showing verification results of circuit operation.
Figure 30B:
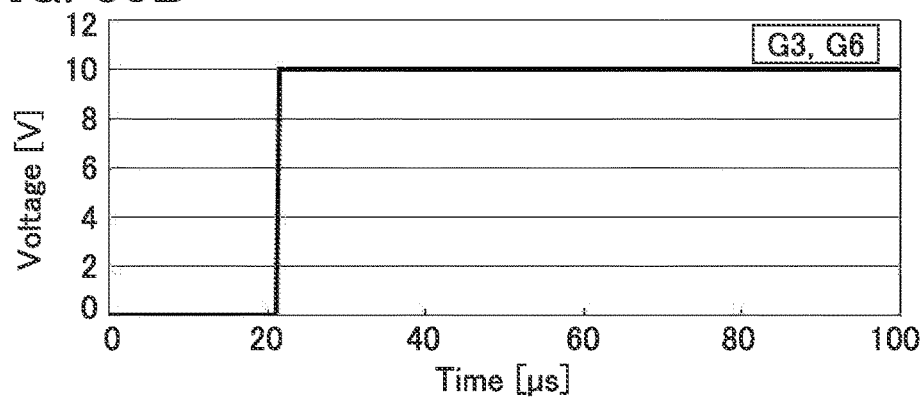
Figure 30C:
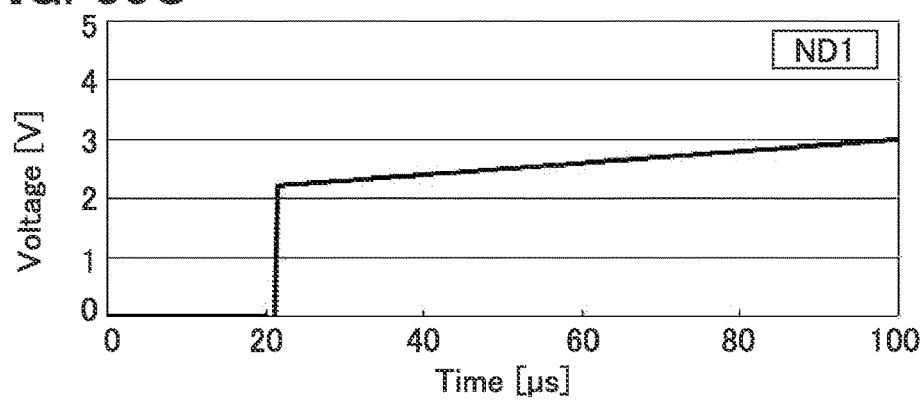
Figure 30D:
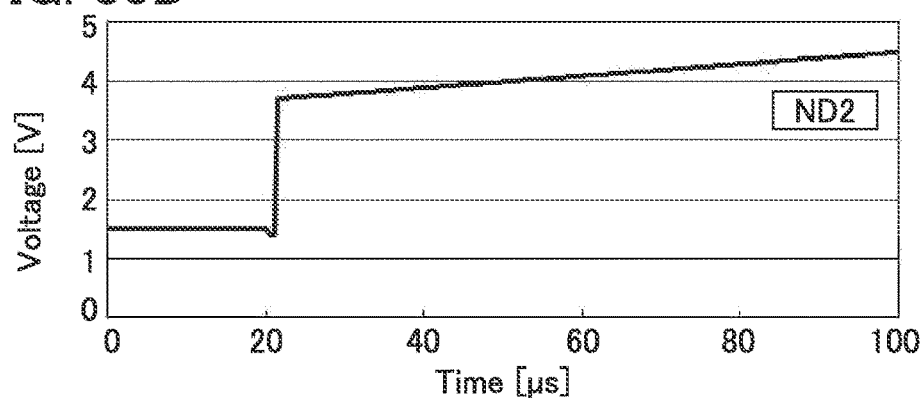
Figure 31A:
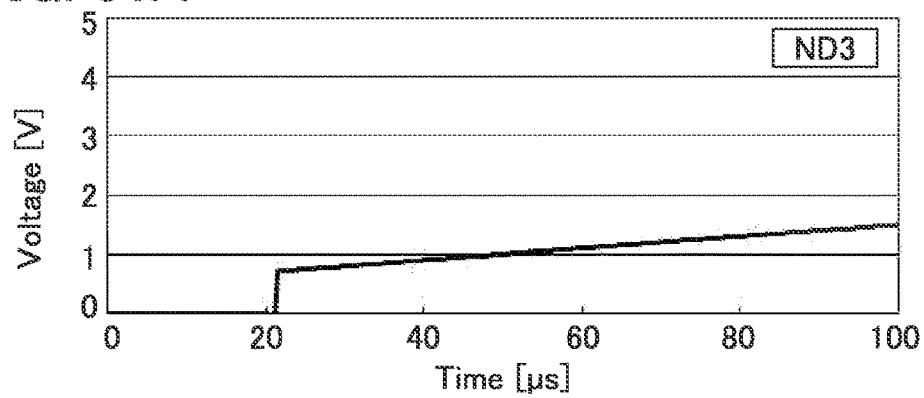
FIG. 31A to FIG. 31D are diagrams showing verification results of circuit operation.
Figure 31B:
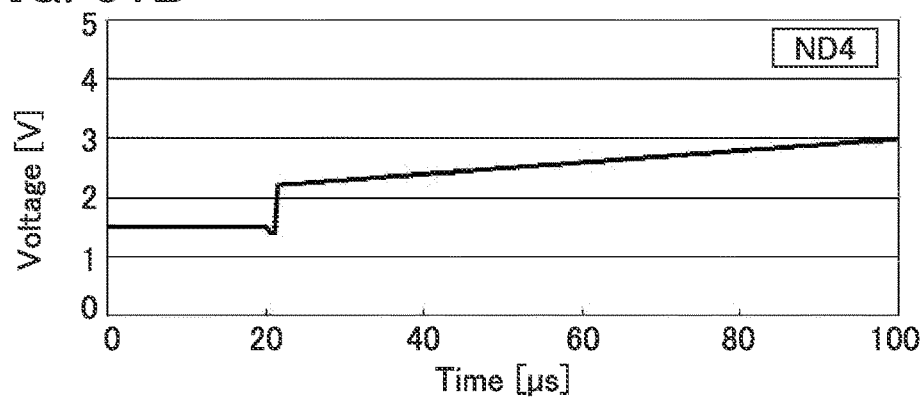
Figure 31C:
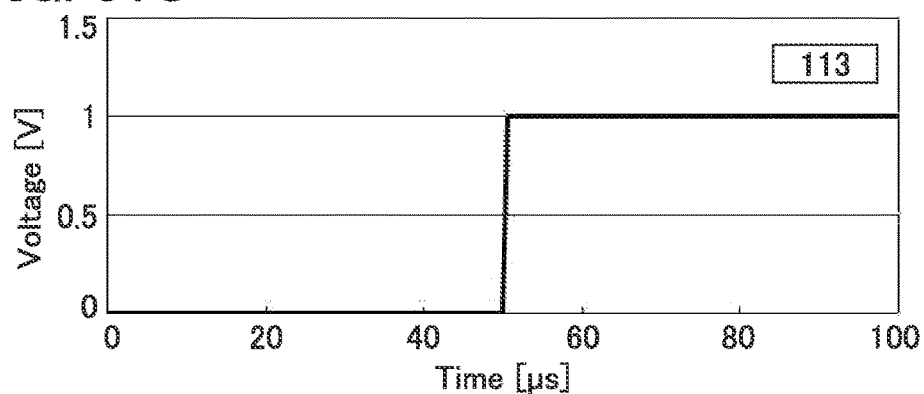
Figure 31D:
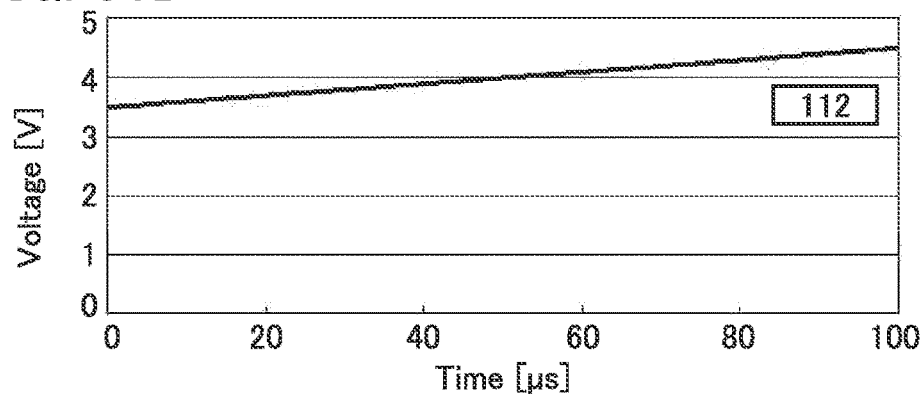

FIG. 30A shows the calculation results of the terminal G1, the terminal G2, the terminal G4, and the terminal G5. FIG. 30B shows the calculation results of the terminal G3 and the terminal G6. FIG. 30C shows the calculation result of the node ND1. FIG. 30D shows the calculation result of the node ND2. FIG. 31A shows the calculation result of the node ND3. FIG. 31B shows the calculation result of the node ND4. FIG. 31C shows the calculation result of the terminal 113.

In this example, 10 V was supplied to each of the terminal G1, the terminal G2, the terminal G4, and the terminal G5 and 0 V was supplied to each of the terminal G3 and the terminal G6 from 0 seconds to 20 microseconds. During this period, the transistor M1, the transistor M2, the transistor M4, and the transistor M5 were in an on state and the transistor M3 and the transistor M6 were in an off state. Thus, the node ND1 became 0 V, the node ND2 became 1.5 V, the node ND3 became 0 V, and the node ND4 became 1.5 V.

After 20 microseconds, 0 V was supplied to each of the terminal G1, the terminal G2, the terminal G4, and the terminal G5, and 10 V was supplied to each of the terminal G3 and the terminal G6. Accordingly, after 20 microseconds, the transistor M1, the transistor M2, the transistor M4, and the transistor M5 were in an off state, and the transistor M3 and the transistor M6 were in an off state. The voltages of the node ND1 to the node ND4 after 20 microseconds changed in accordance with the potential change in the terminal 112.

It was found from FIG. 31C and FIG. 31D that the voltage of the terminal 113 was 0 V when the voltage of the terminal 112 was lower than or equal to 4 V and changed to 1 V when the voltage of the terminal 112 exceeded 4 V. It was confirmed with the use of the circuit simulator that the voltage sensing circuit 100TA operates properly.

REFERENCE NUMERALS

100: voltage sensing circuit, 101: comparator, 111: terminal, 112: terminal, 113: terminal, 114: terminal, 115: terminal, 201: terminal, 202: terminal, 300: secondary battery.

The invention claimed is:

1. A battery pack comprising:
   a secondary battery; and
   a semiconductor device, the semiconductor device comprising:
      a first switch;
      a second switch;
      a third switch;
      a first capacitor; and
      a comparator,
   wherein one terminal of the first switch is electrically connected to a first terminal,
   wherein the other terminal of the first switch is electrically connected to a non-inverting input of the comparator,
   wherein one terminal of the second switch is electrically connected to a second terminal,
   wherein the other terminal of the second switch is electrically connected to one terminal of the third switch,
   wherein the other terminal of the third switch is electrically connected to a third terminal,
   wherein the first capacitor is provided between the other terminal of the first switch and the one terminal of the third switch,
   wherein an inverting input of the comparator is electrically connected to a fourth terminal,
   wherein an output of the comparator is electrically connected to a fifth terminal,
   wherein the semiconductor device is provided over a flexible substrate,
   wherein a negative electrode of the secondary battery is electrically connected to the first terminal, and
   wherein a positive electrode of the secondary battery is electrically connected to the third terminal.

2. An electronic device comprising:
   the battery pack according to claim 1; and
   a power receiving device.

3. A battery pack comprising:
   a secondary battery; and
   a semiconductor device, the semiconductor device comprising:
      a first transistor;
      a second transistor;
      a third transistor;
      a first capacitor; and
      a comparator,
   wherein one of a source and a drain of the first transistor is electrically connected to a first terminal,
   wherein the other of the source and the drain of the first transistor is electrically connected to a non-inverting input of the comparator,
   wherein one of a source and a drain of the second transistor is electrically connected to a second terminal,
   wherein the other of the source and the drain of the second transistor is electrically connected to one of a source and a drain of the third transistor,
   wherein the other of the source and the drain of the third transistor is electrically connected to a third terminal,
   wherein the first capacitor is provided between the other of the source and the drain of the first transistor and the one of the source and the drain of the third transistor,
   wherein an inverting input of the comparator is electrically connected to a fourth terminal,
   wherein an output of the comparator is electrically connected to a fifth terminal,
   wherein the semiconductor device is provided over a flexible substrate,
   wherein a negative electrode of the secondary battery is electrically connected to the first terminal, and
   wherein a positive electrode of the secondary battery is electrically connected to the third terminal.

4. An electronic device comprising:
   the battery pack according to claim 3; and
   a power receiving device.

5. The semiconductor device according to claim 3,
   wherein the first transistor comprises an oxide semiconductor in its semiconductor layer.

6. The semiconductor device according to claim 3,
   wherein at least one of the second transistor and the third transistor comprises an oxide semiconductor in its semiconductor layer.

7. A semiconductor device comprising:
   a first switch;
   a second switch;
   a third switch;
   a fourth switch;
   a fifth switch;
   a sixth switch;
   a first capacitor;
   a second capacitor; and
   a comparator,
   wherein one terminal of the first switch is electrically connected to a first terminal,
   wherein the other terminal of the first switch is electrically connected to one terminal of the sixth switch,
   wherein one terminal of the second switch is electrically connected to a second terminal,
   wherein the other terminal of the second switch is electrically connected to one terminal of the third switch,
   wherein the other terminal of the third switch is electrically connected to a third terminal,
   wherein one terminal of the fourth switch is electrically connected to the first terminal,
   wherein the other terminal of the fourth switch is electrically connected to a non-inverting input of the comparator,
   wherein one terminal of the fifth switch is electrically connected to the second terminal,
   wherein the other terminal of the fifth switch is electrically connected to the other terminal of the sixth switch,
   wherein the first capacitor is provided between the other terminal of the first switch and the one terminal of the third switch,
   wherein the second capacitor is provided between the other terminal of the fourth switch and the other terminal of the fifth switch,
   wherein an inverting input of the comparator is electrically connected to a fourth terminal, and
   wherein an output of the comparator is electrically connected to a fifth terminal.

8. A battery pack comprising:
   a secondary battery; and
   the semiconductor device according to claim 7;
   wherein the semiconductor device is provided over a flexible substrate,
   wherein a negative electrode of the secondary battery is electrically connected to the first terminal, and
   wherein a positive electrode of the secondary battery is electrically connected to the third terminal.

9. An electronic device comprising:
   the battery pack according to claim 8; and
   a power receiving device.

* * * * *